(12) United States Patent
Hotta

(10) Patent No.: US 7,015,081 B2
(45) Date of Patent: Mar. 21, 2006

(54) THIN FILM TRANSISTOR SUBSTRATE AND MANUFACTURING METHOD THEREOF

(75) Inventor: Kazushige Hotta, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/146,718

(22) Filed: Jun. 7, 2005

(65) Prior Publication Data

US 2005/0212047 A1    Sep. 29, 2005

Related U.S. Application Data

(62) Division of application No. 10/808,833, filed on Mar. 25, 2004, now Pat. No. 6,927,418.

(30) Foreign Application Priority Data

Mar. 28, 2003  (JP) .............................. 2003-092862

(51) Int. Cl.
  *H01L 21/00*   (2006.01)
(52) U.S. Cl. ...................... 438/151; 438/164; 438/166; 438/487; 438/795
(58) Field of Classification Search ................ 438/149, 438/151, 164, 166, 482, 486, 487, 795
  See application file for complete search history.

(56) References Cited

U.S. PATENT DOCUMENTS

| | | | | |
|---|---|---|---|---|
| 5,424,230 A | * | 6/1995 | Wakai | .......................... 438/166 |
| 5,585,647 A | * | 12/1996 | Nakajima et al. | .............. 257/72 |
| 5,677,549 A | | 10/1997 | Takayama et al. | ............. 257/66 |
| 5,811,328 A | | 9/1998 | Zhang et al. | ................ 438/166 |
| 6,168,980 B1 | * | 1/2001 | Yamazaki et al. | ........... 438/162 |
| 6,316,787 B1 | * | 11/2001 | Ohtani | .......................... 257/59 |
| 6,498,369 B1 | | 12/2002 | Yamazaki et al. | ........... 257/347 |
| 6,541,823 B1 | | 4/2003 | Yoshiyama et al. | .......... 257/351 |
| 6,797,550 B1 | * | 9/2004 | Kokubo et al. | .............. 438/164 |
| 6,900,464 B1 | * | 5/2005 | Doi et al. | ....................... 257/59 |
| 2003/0230749 A1 | * | 12/2003 | Isobe et al. | .................... 257/59 |
| 2004/0257486 A1 | | 12/2004 | Tai et al. | ....................... 349/42 |
| 2005/0170569 A1 | * | 8/2005 | Yazaki et al. | ................ 438/155 |

FOREIGN PATENT DOCUMENTS

| | | |
|---|---|---|
| JP | 6-125084 | 5/1994 |
| JP | 11-284188 | 10/1999 |

* cited by examiner

*Primary Examiner*—T. N. Quach
(74) *Attorney, Agent, or Firm*—Greer, Burns & Crain, Ltd.

(57) ABSTRACT

A thin film transistor substrate manufacturing method, including the steps of forming on a first region of a transparent insulating substrate a first semiconductor film with a first film thickness that is crystallized through excimer laser irradiation; forming on a second region of the transparent insulating substrate a second semiconductor film that is laterally crystallized through continuous wave laser irradiation, the second semiconductor film being arranged to have a film thickness that is greater than or equal to the first film thickness; forming a first thin film transistor on the first semiconductor film; and forming on the second semiconductor film a second thin film transistor that operates at a speed greater than a speed of the first thin film transistor.

6 Claims, 46 Drawing Sheets

10 TRANSPARENT INSULATING SUBSTRATE
11 BASE SIN FILM
12 BASE $SiO_2$ FILM
15 SOURCE / DRAIN
16 CHANNEL REGION
17a,17b ACTIVE LAYER (SEMICONDUCTOR FILM)
18 LDD
19 SOURCE/DRAIN ELECTRODE
22 GATE ELECTRODE
25 PIXEL ELECTRODE
41 GATE INSULATING FILM
71 INTERLAYER INSULATING FILM

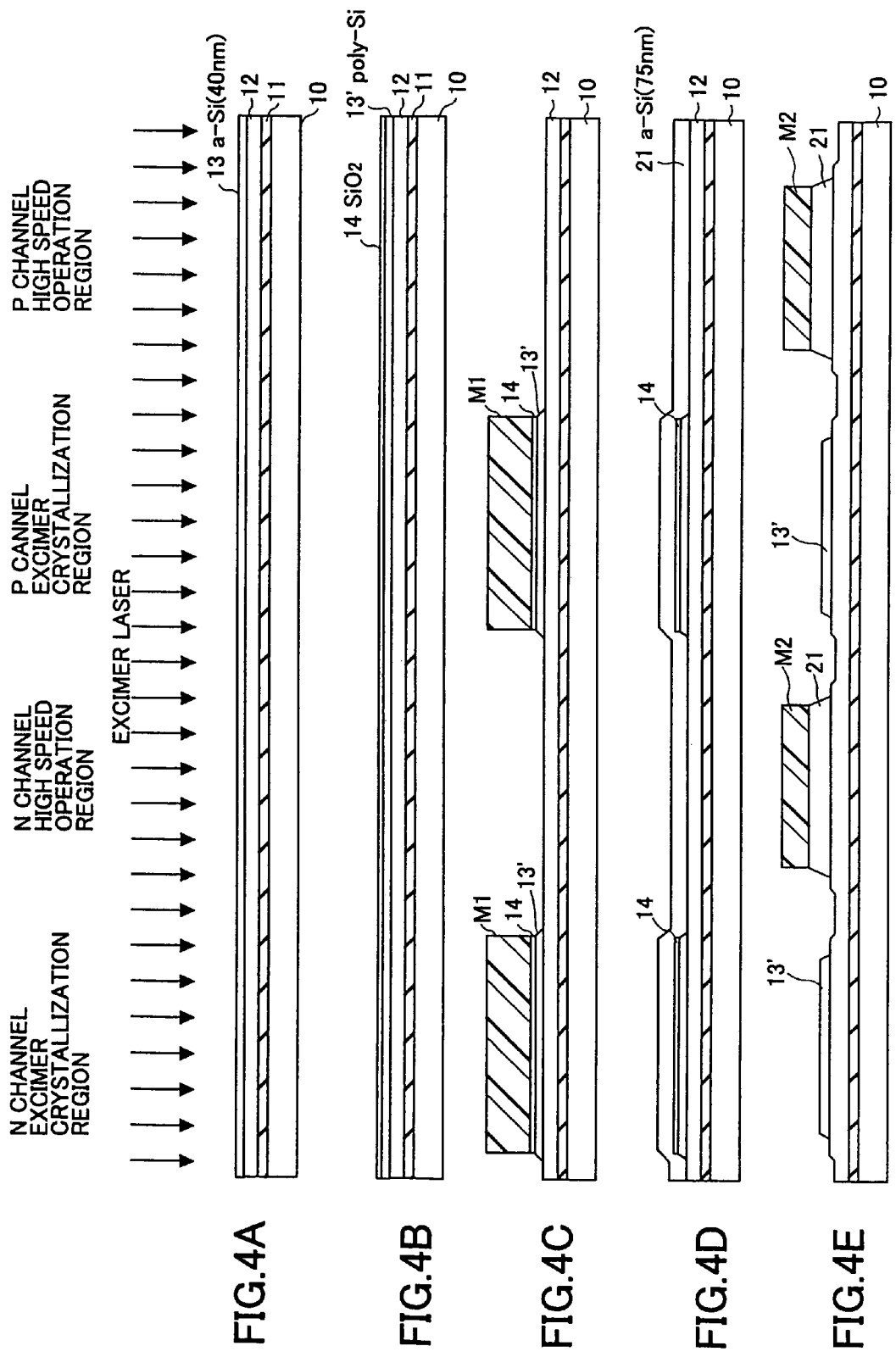

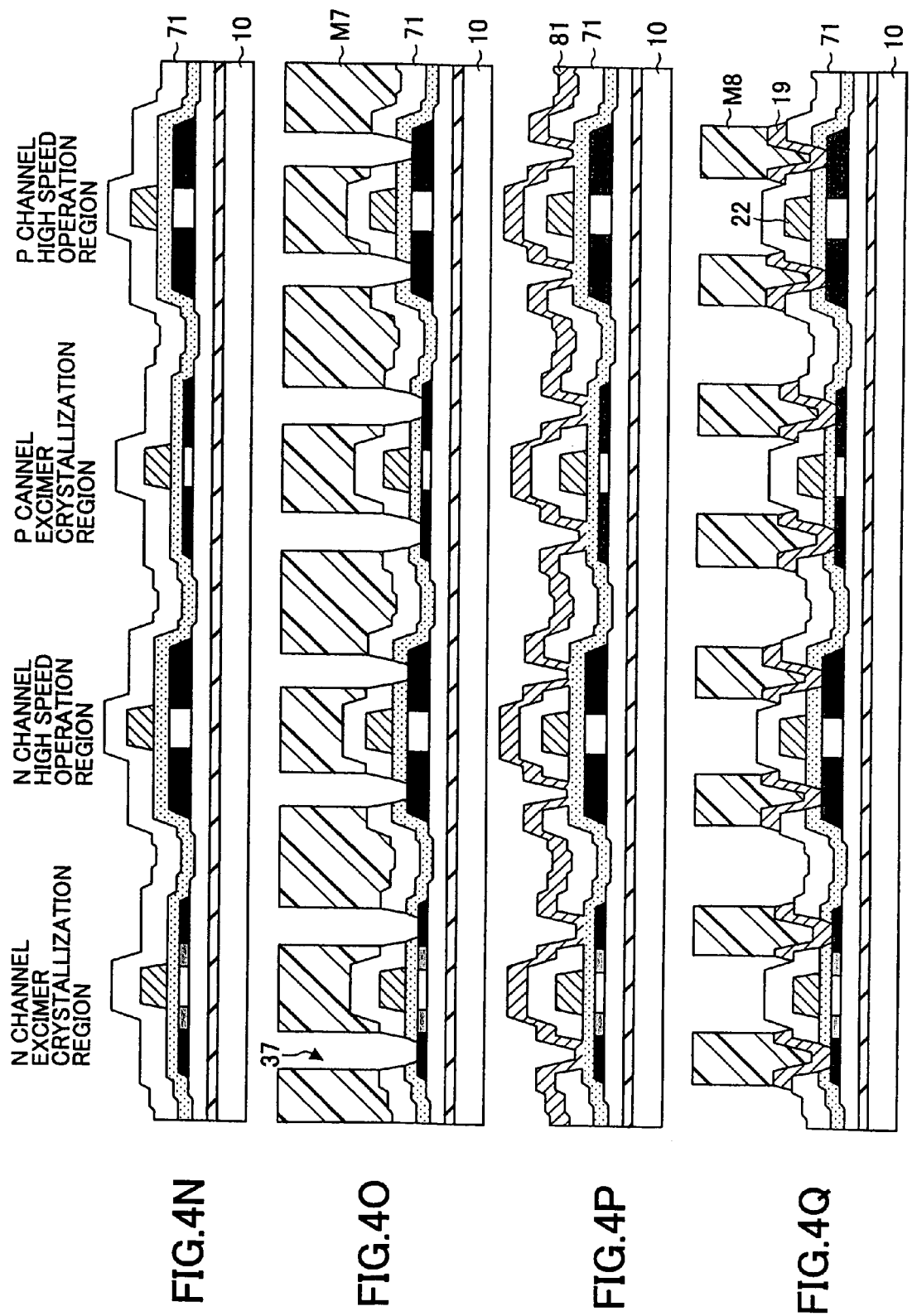

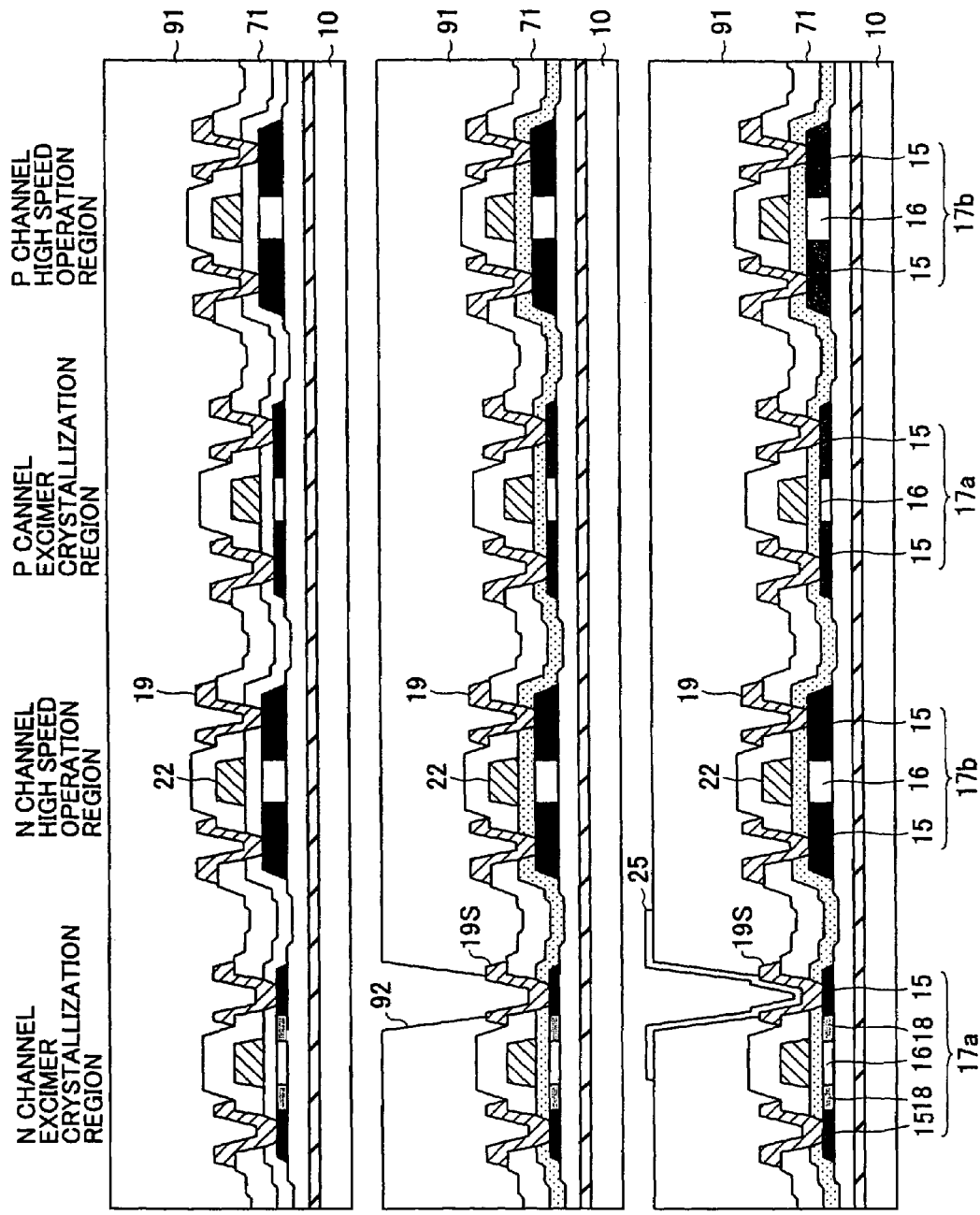

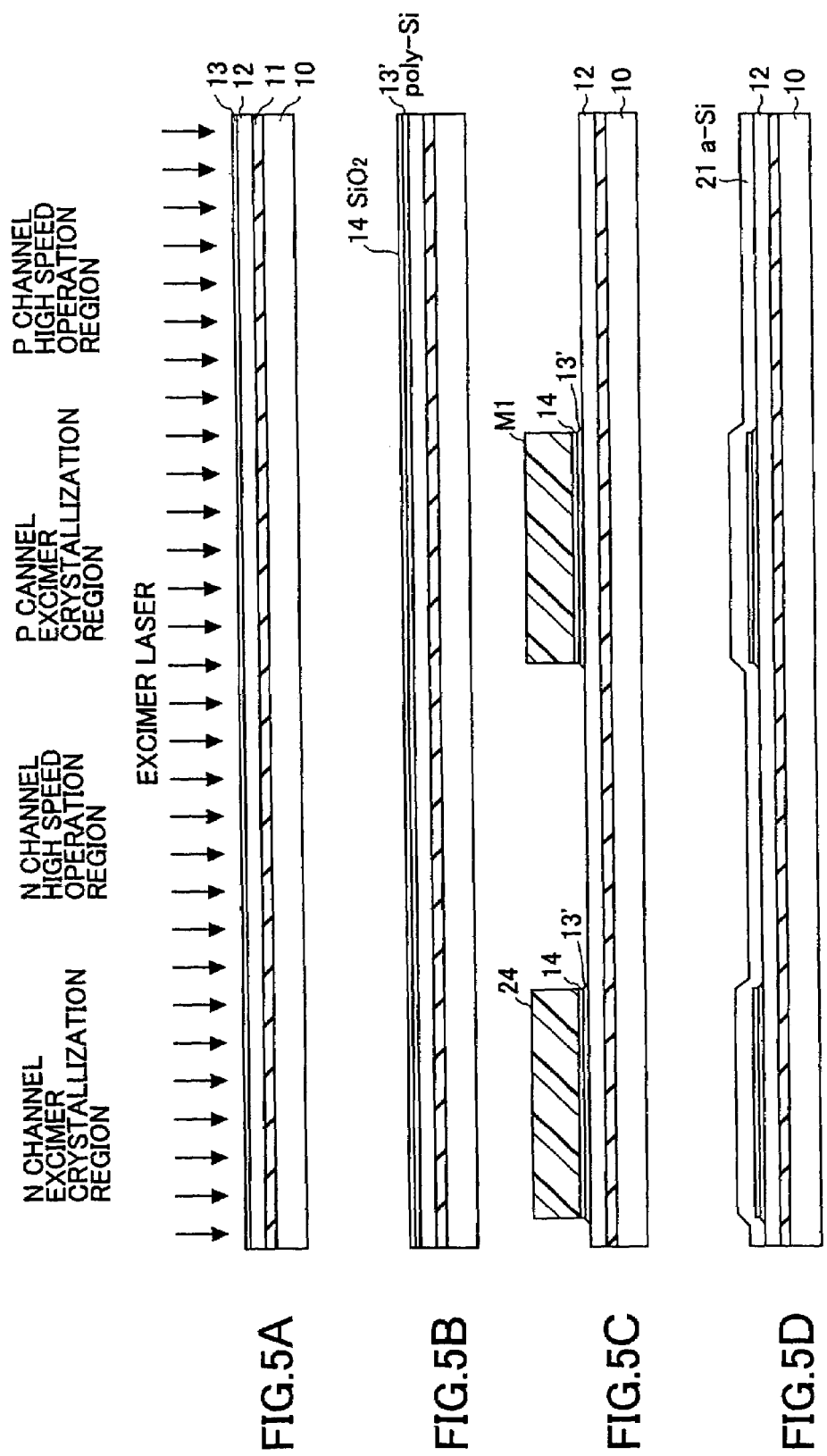

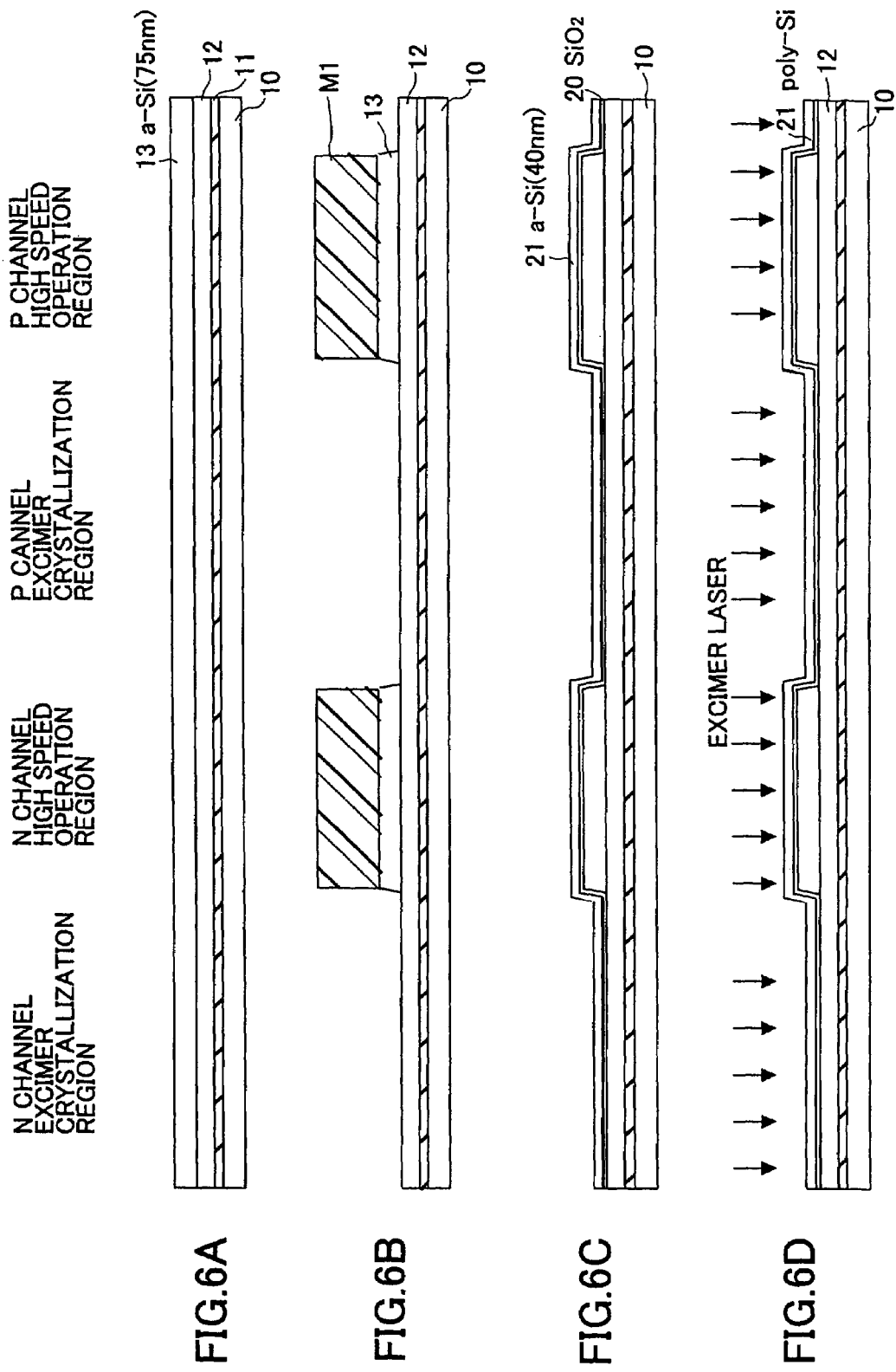

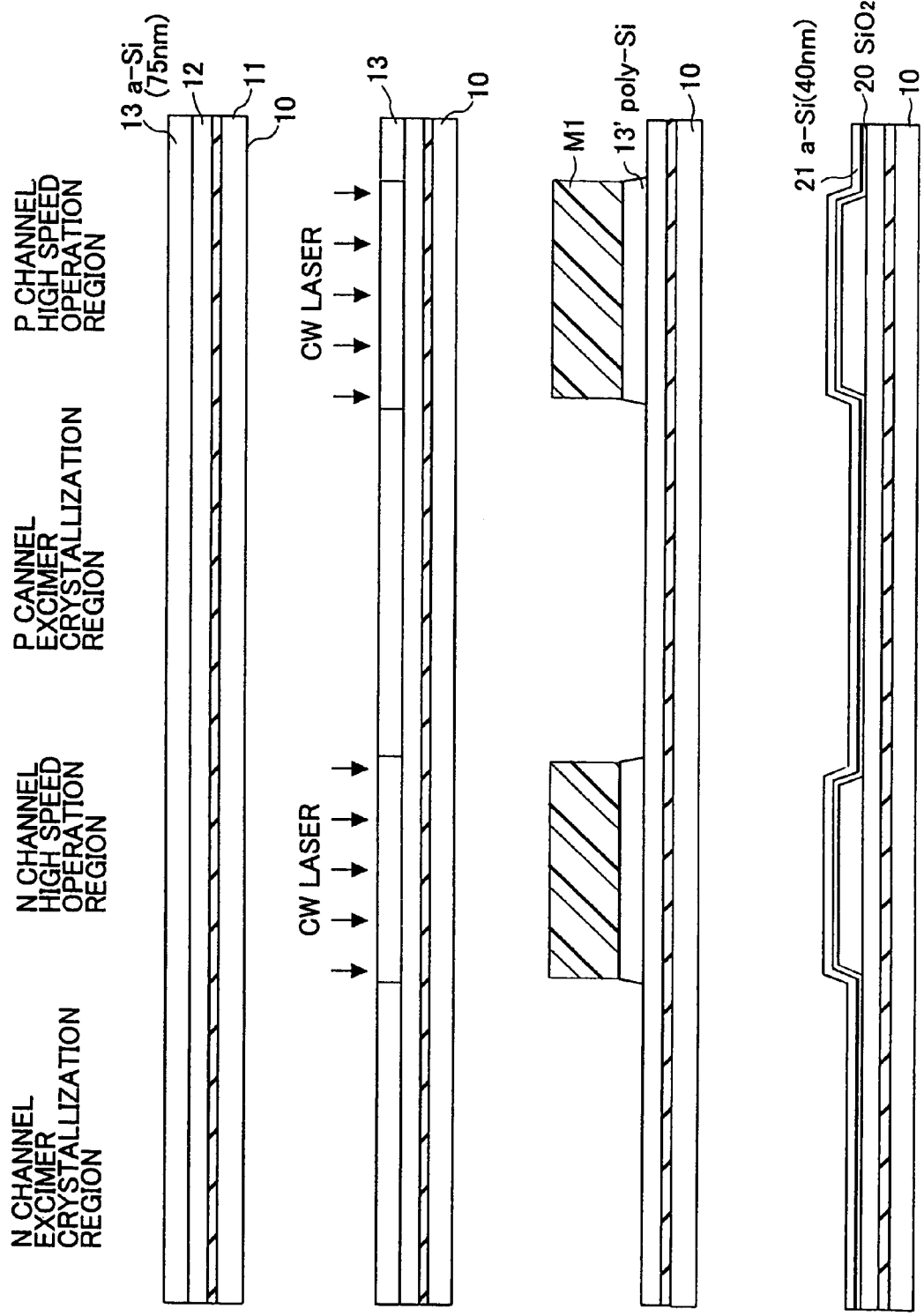

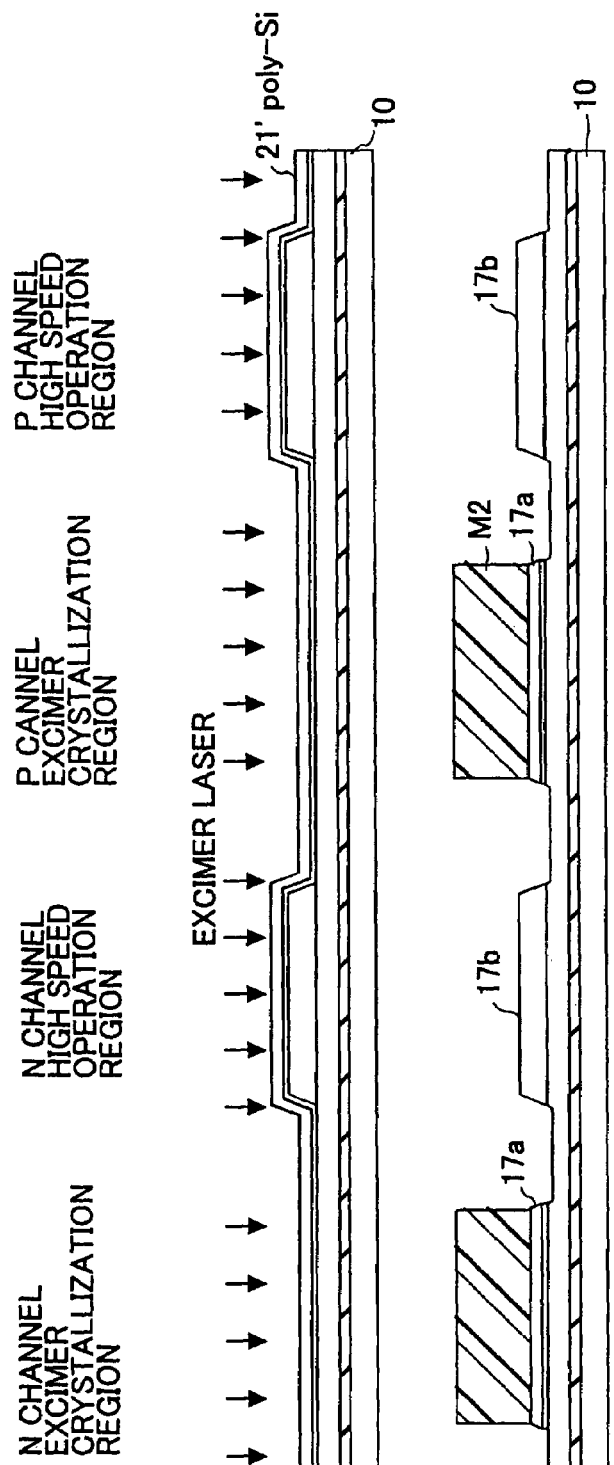

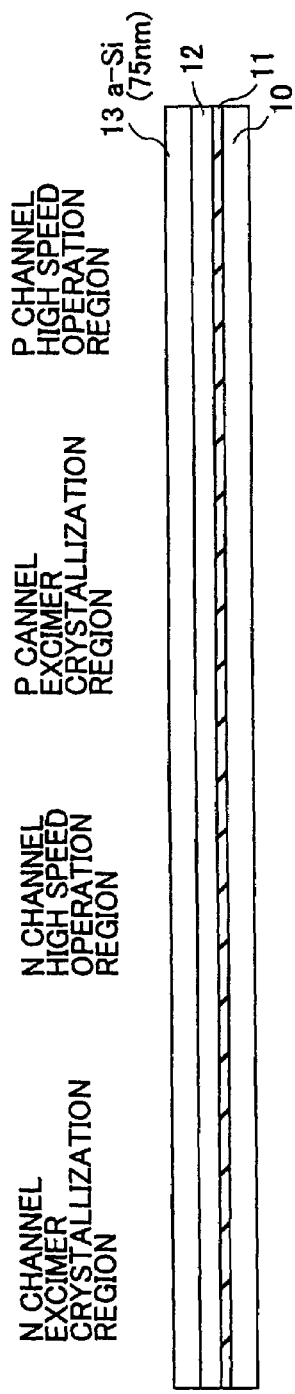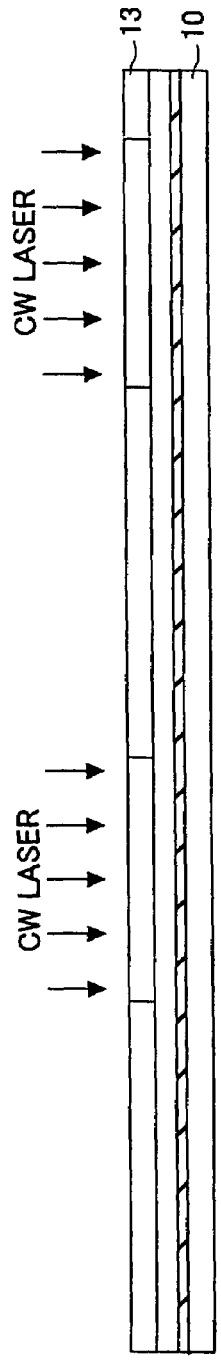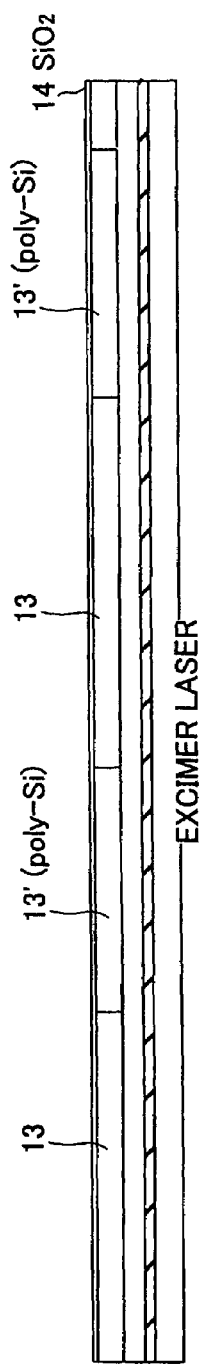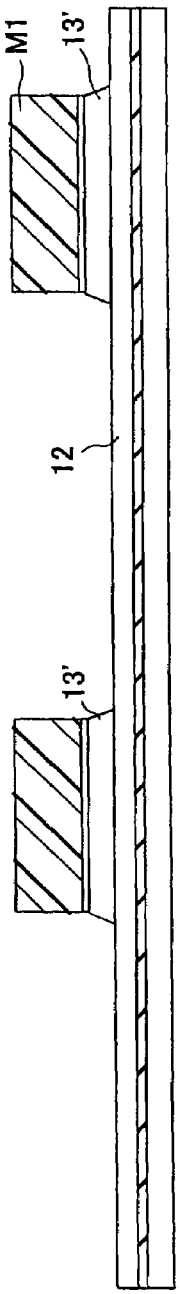

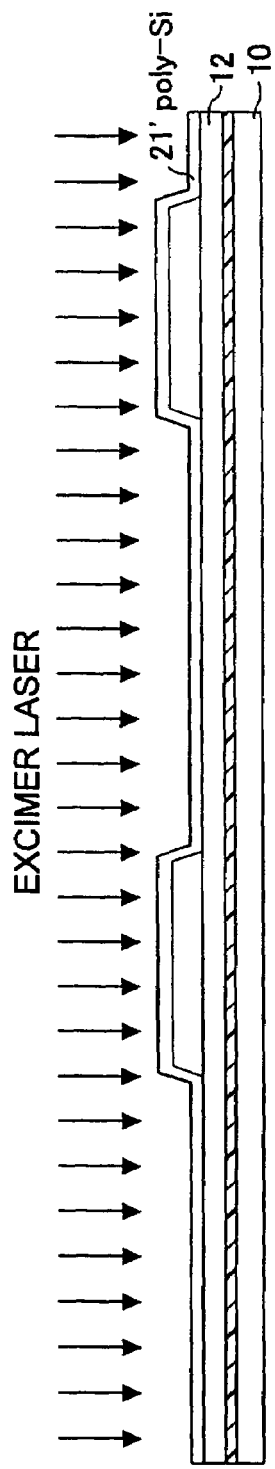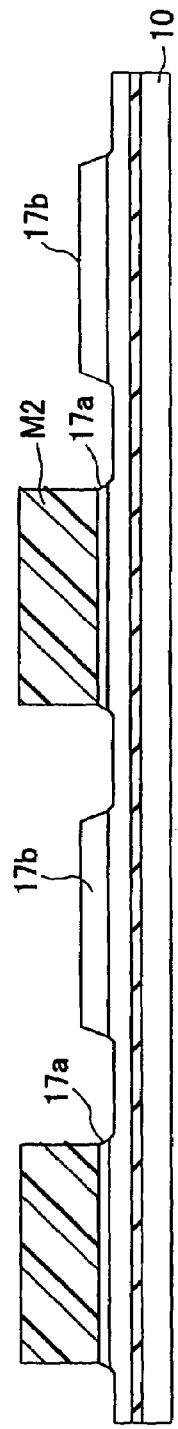

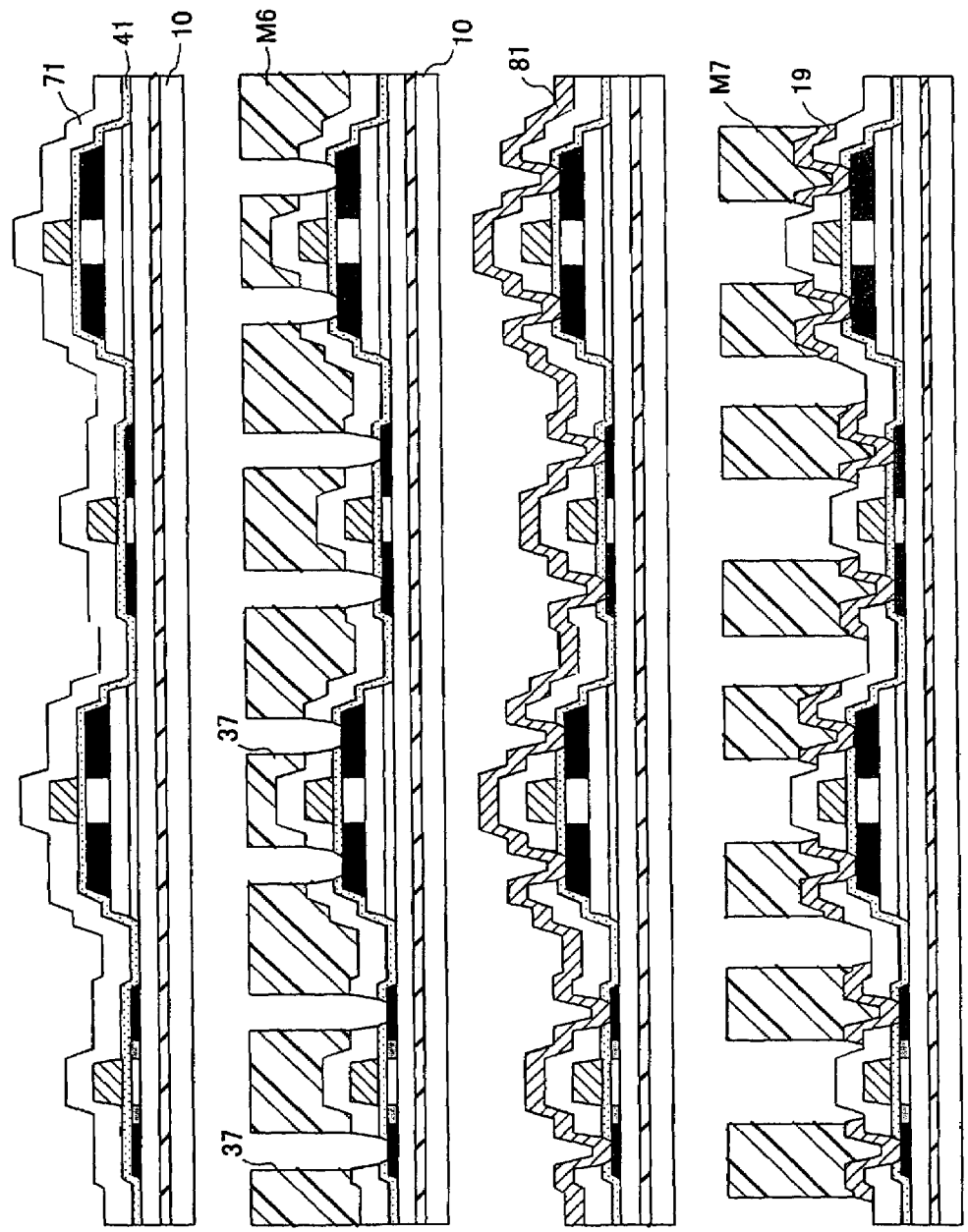

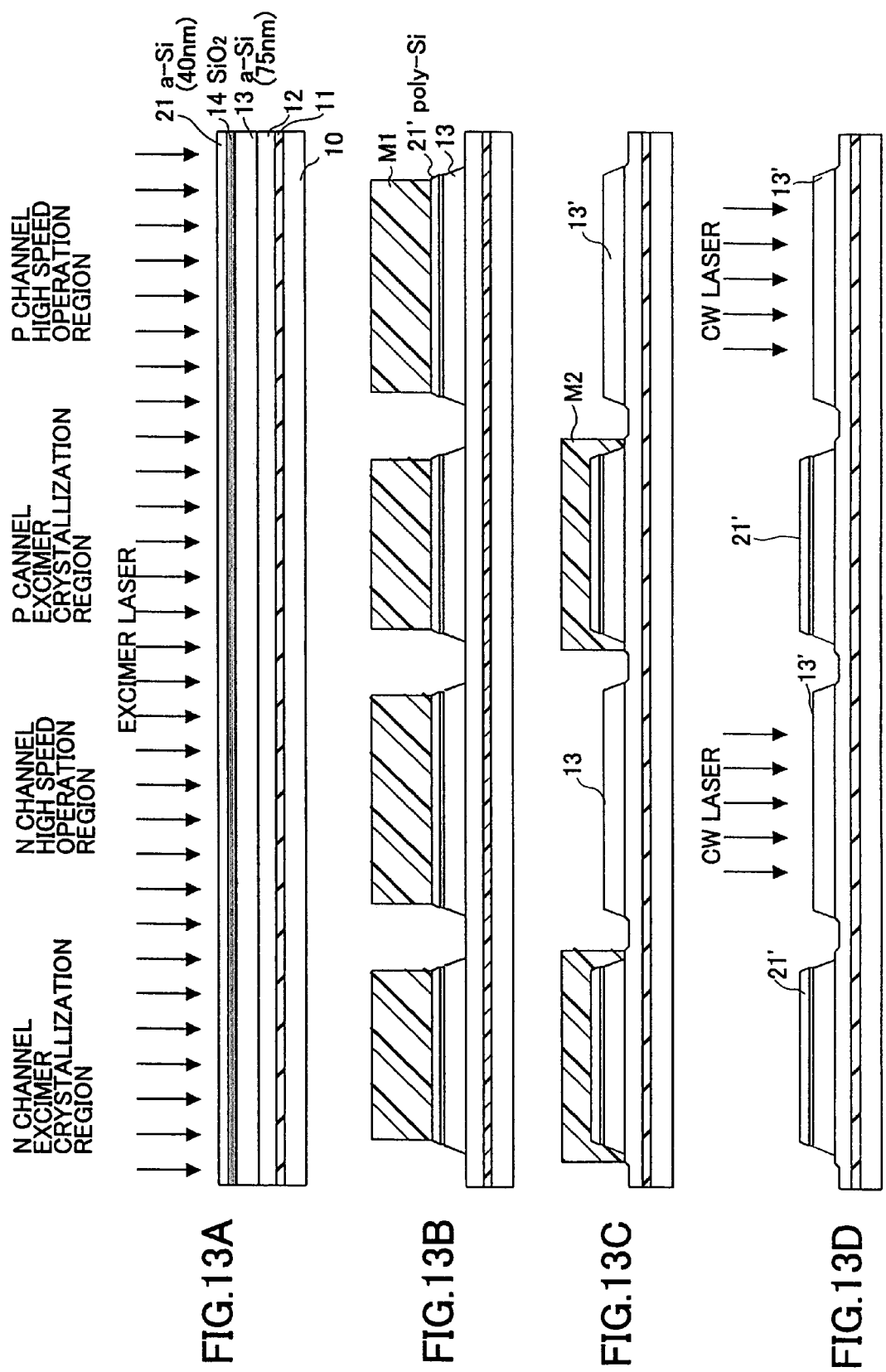

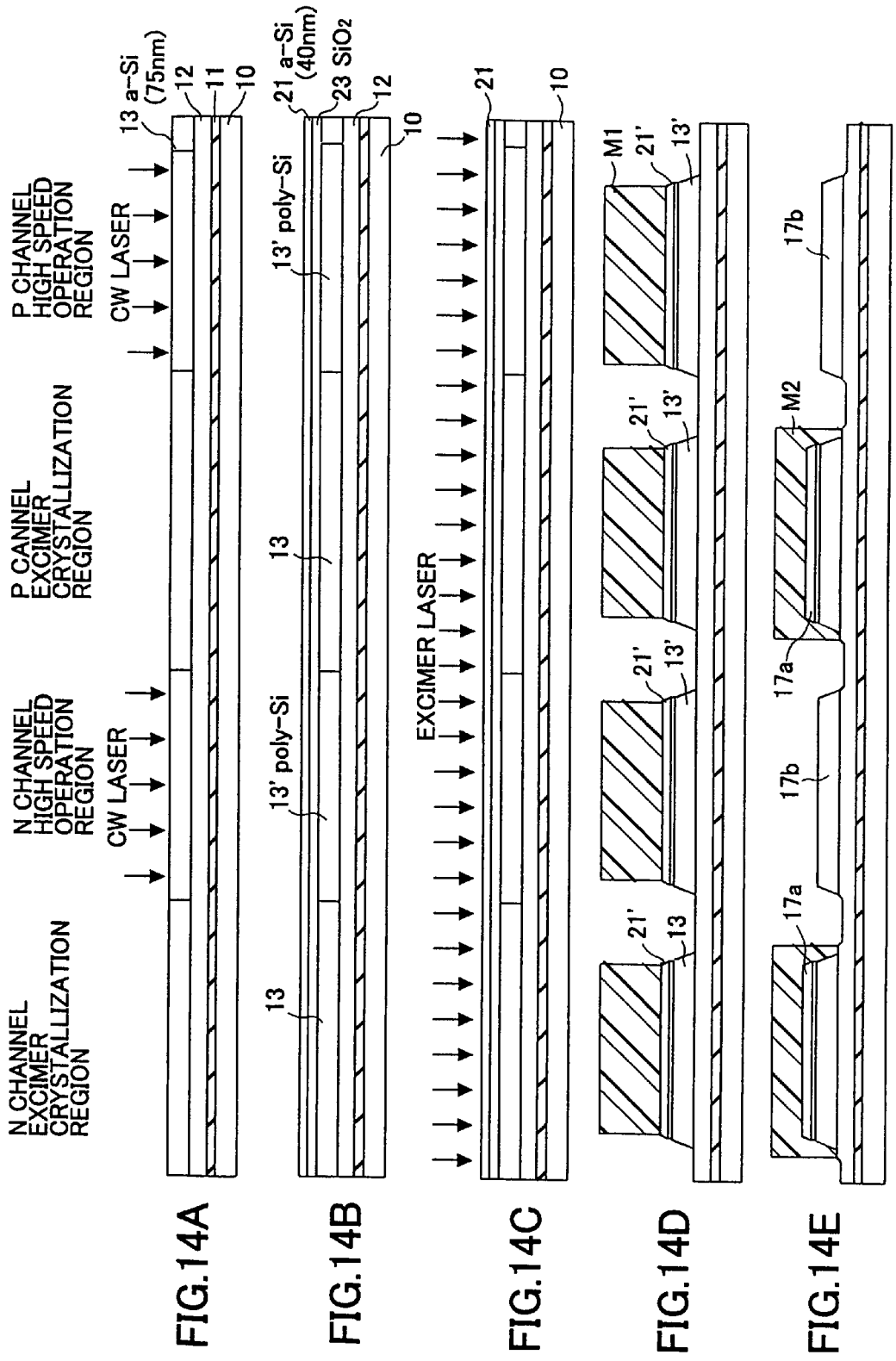

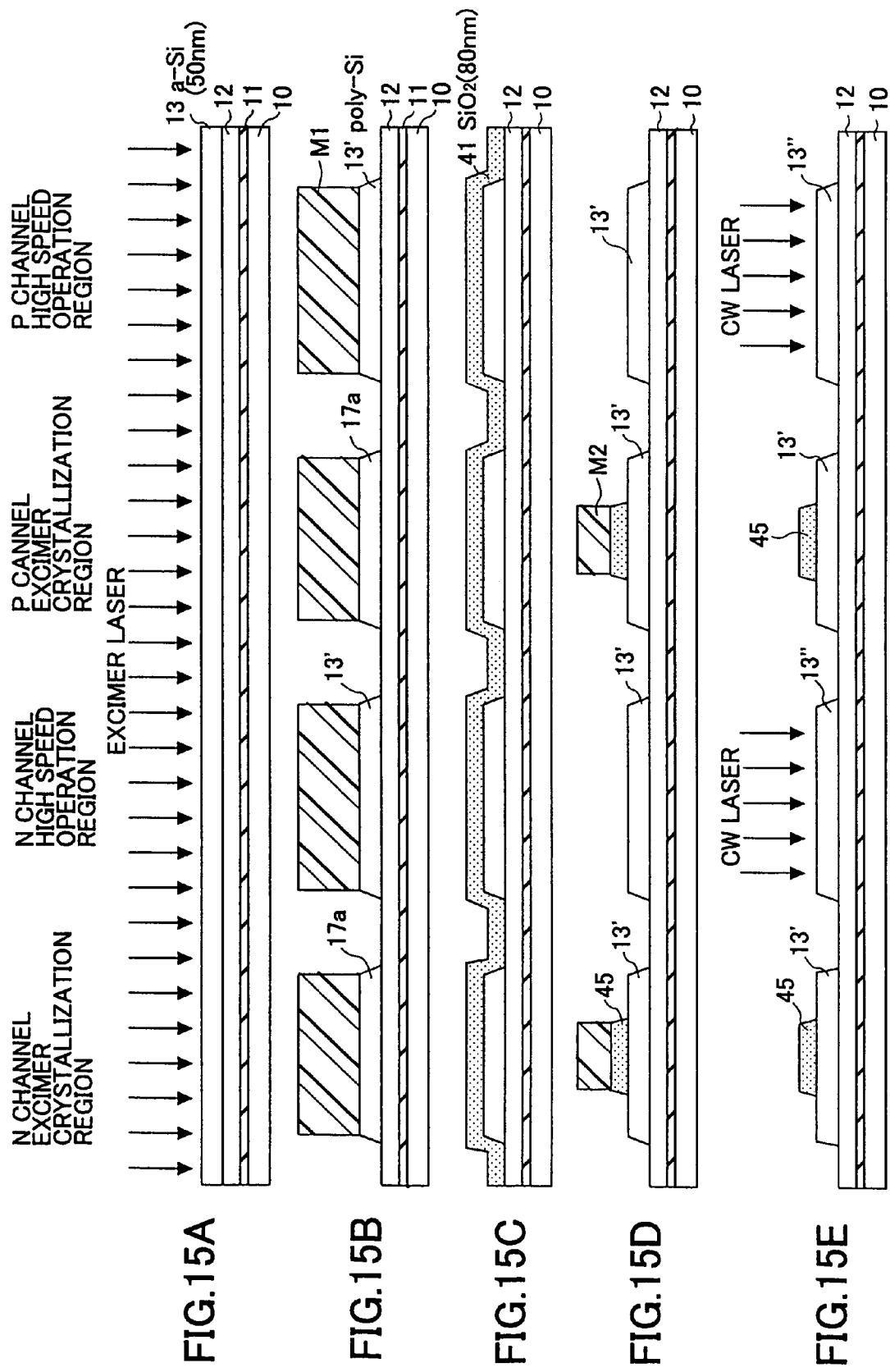

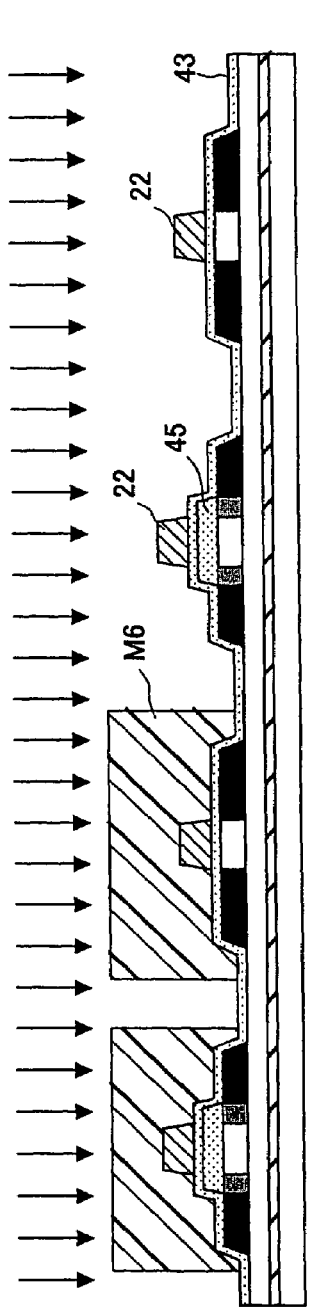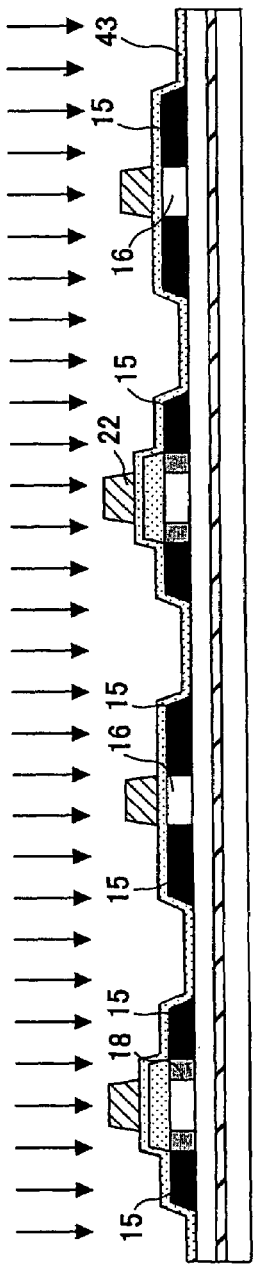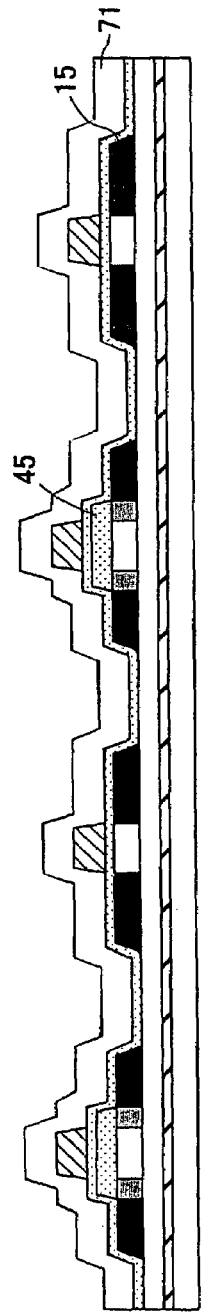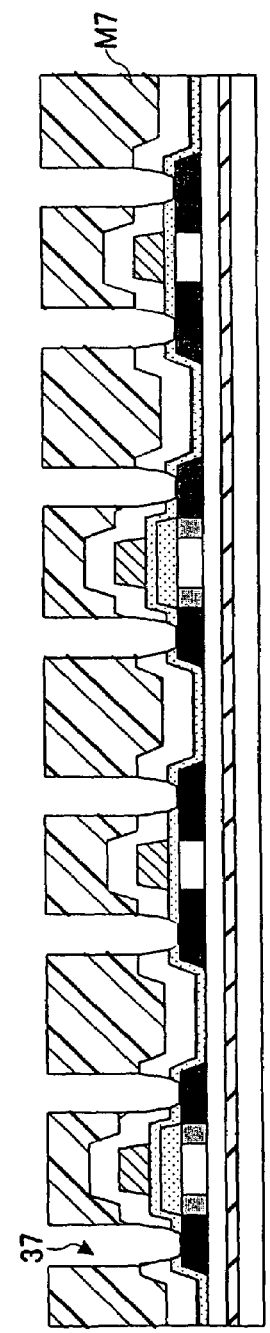

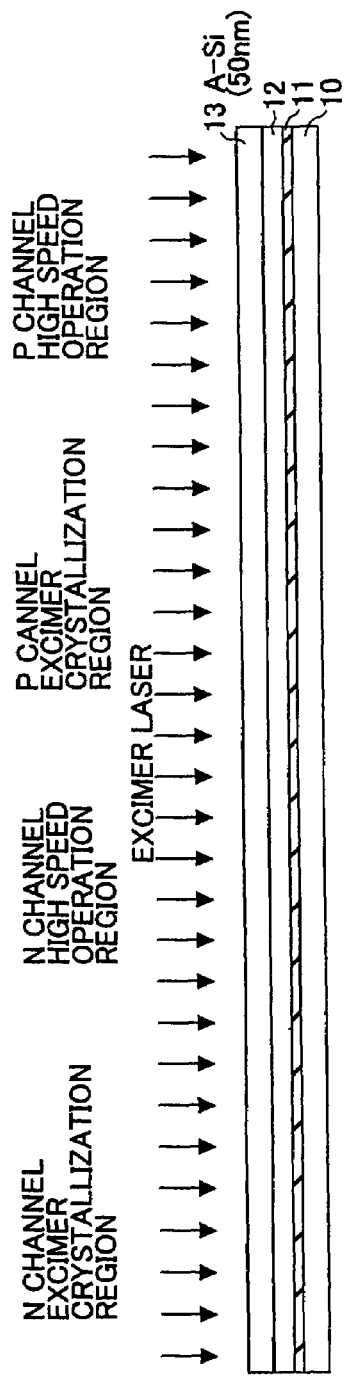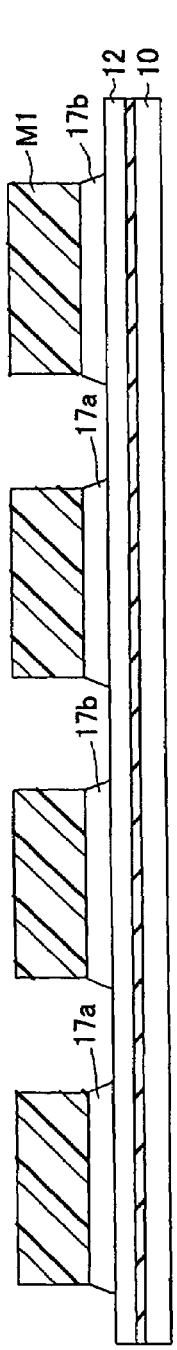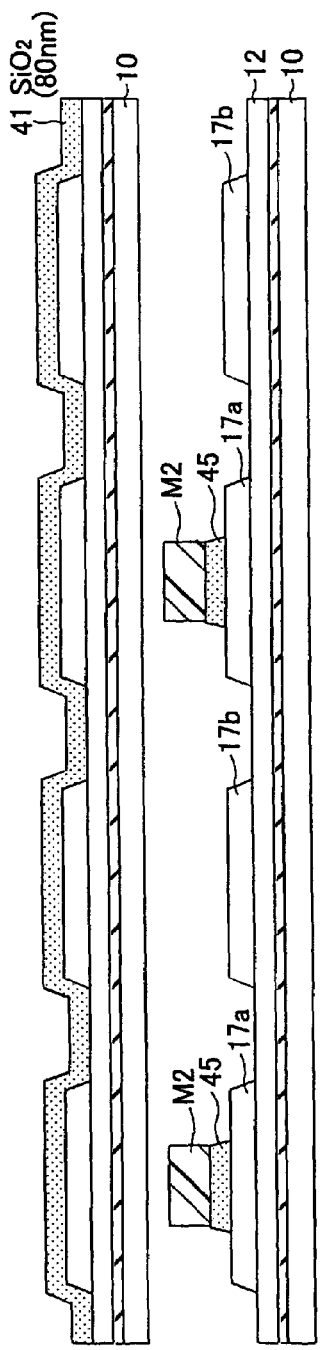

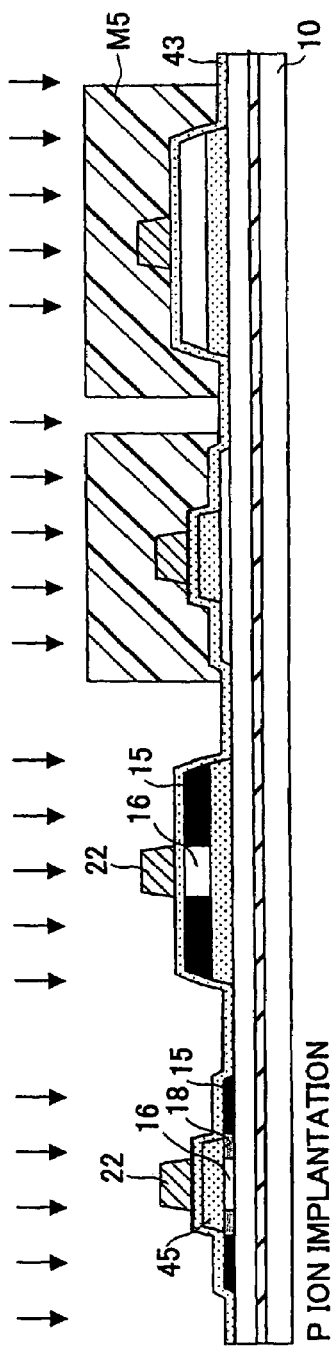
FIG.17J  P ION IMPLANTATION
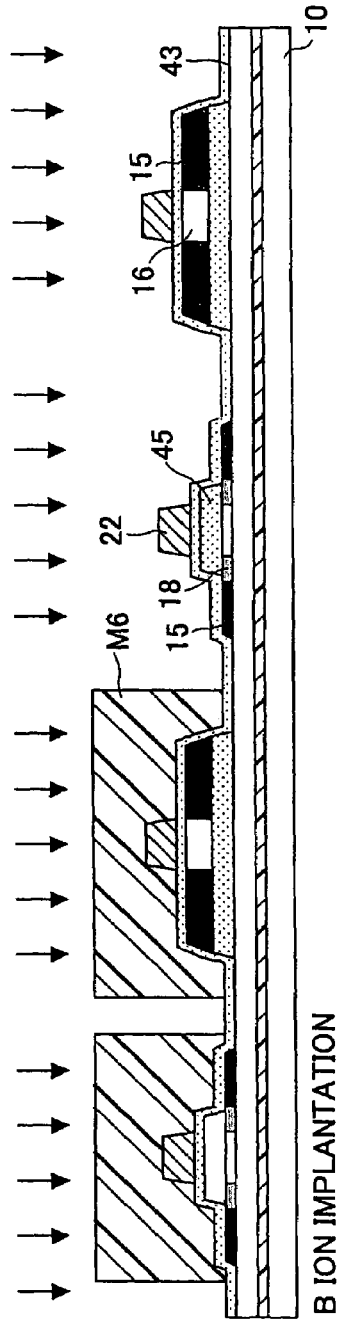
FIG.17K  B ION IMPLANTATION
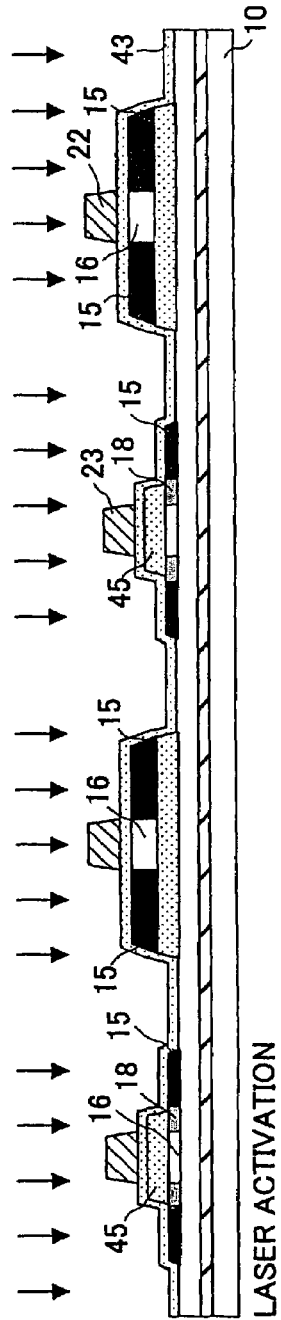
FIG.17L  LASER ACTIVATION

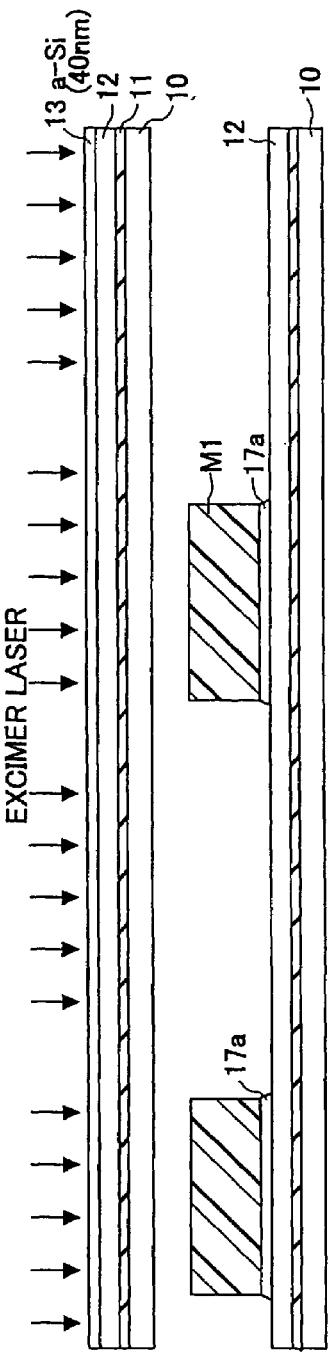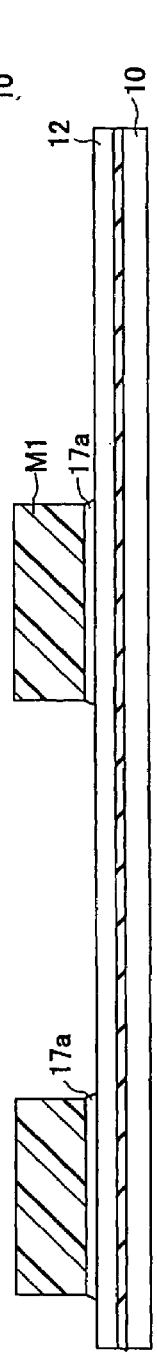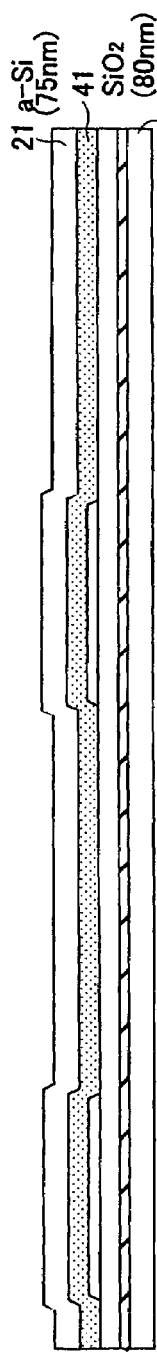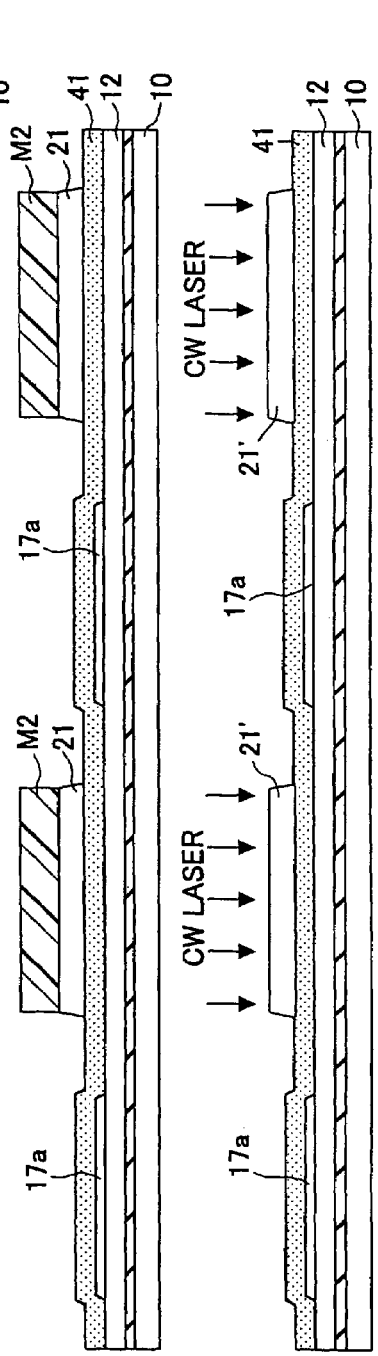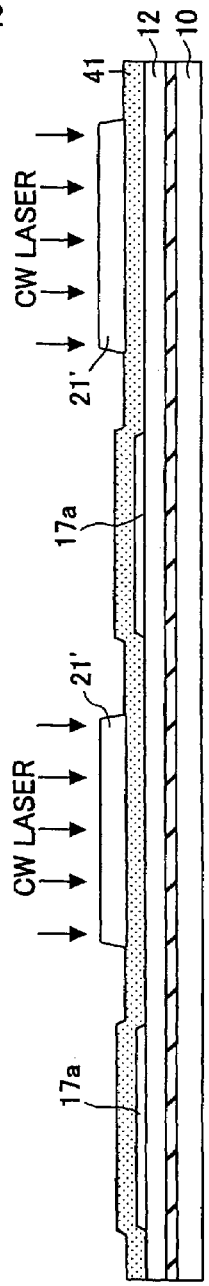
FIG.18A
FIG.18B
FIG.18C
FIG.18D
FIG.18E

LOW CONCENTRATION P ION IMPLANTATION

B ION IMPLANTATION

LASER ACTIVATION

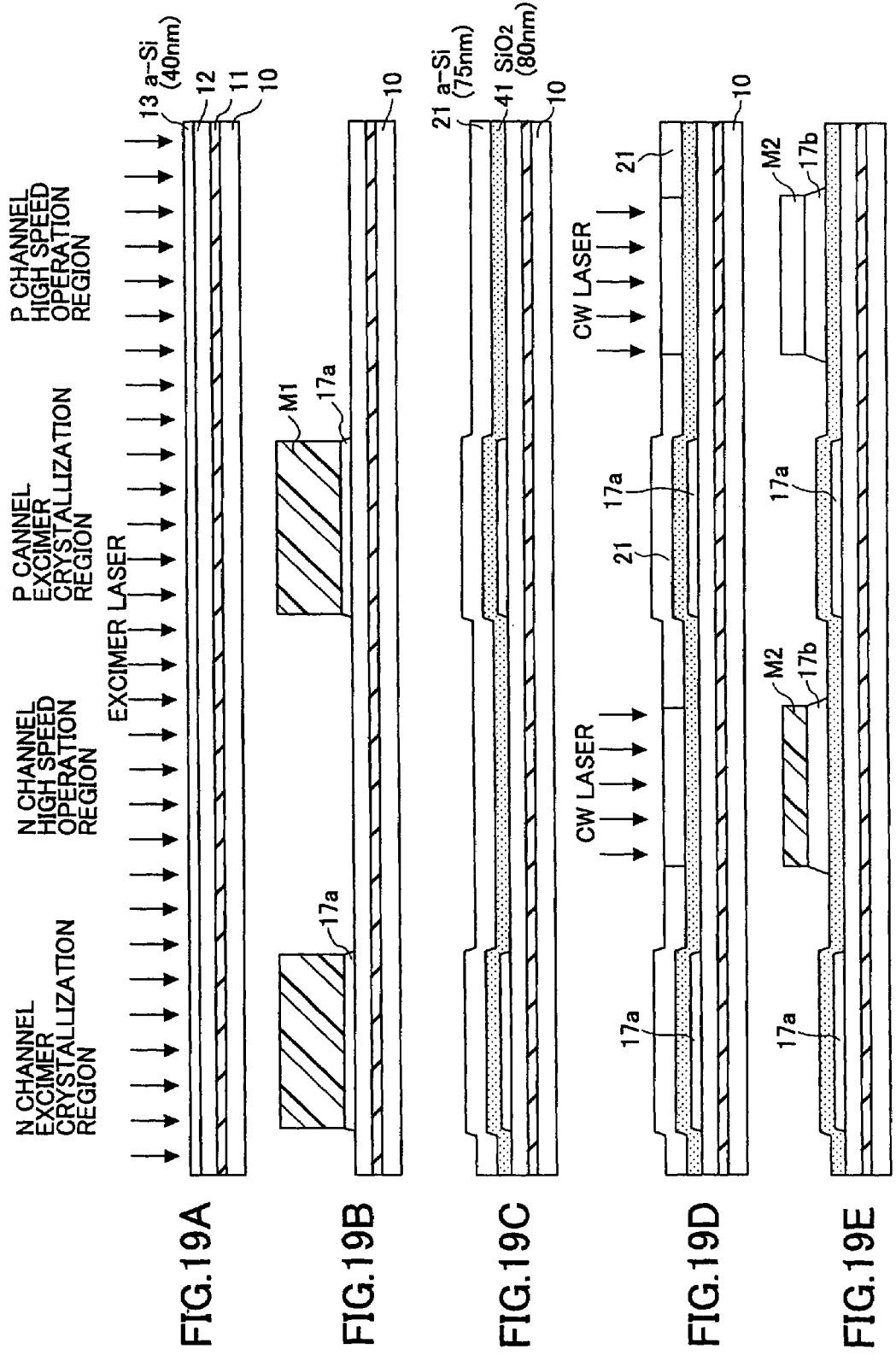

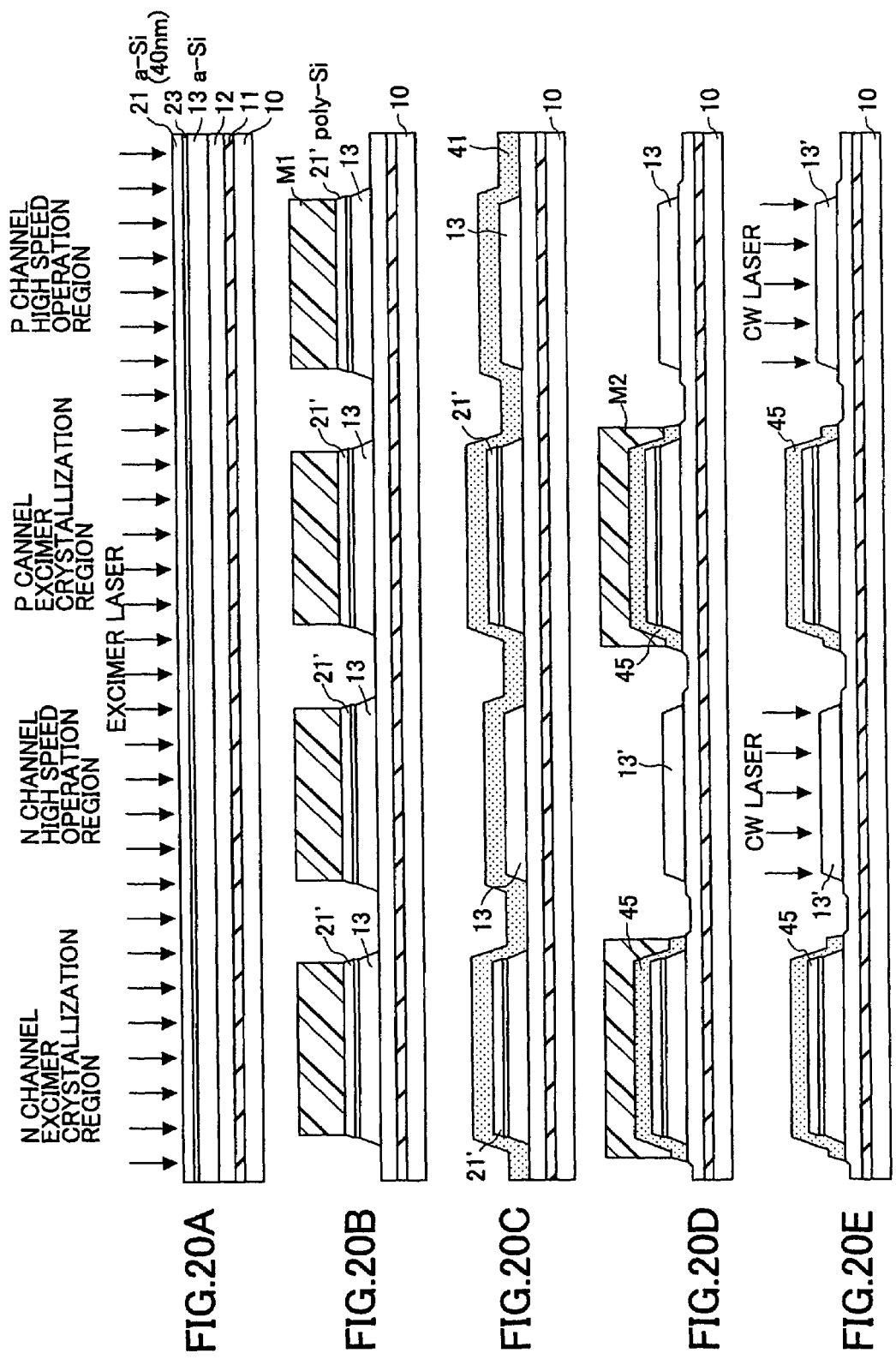

THIN FILM TRANSISTOR SUBSTRATE AND MANUFACTURING METHOD THEREOF

This is a divisional of application Ser. No. 10/808,833, filed Mar. 25, 2004 now U.S. Pat. No. 6,927,418.

BACKGROUND OF THE INVENTION

1. Field of the Invention

The present invention relates generally to a thin film transistor substrate and a manufacturing method thereof. Particularly, the present invention relates to a polycrystalline silicon thin film transistor substrate in which two types of thin film transistors with differing characteristics are implemented on one substrate.

2. Description of the Related Art

A liquid crystal display apparatus is relatively light weight and thin, and has a low power consumption rate, and is therefore widely used in such fields as mobile terminal apparatuses, video camera view finders, and laptop computers, for example. In recent years and continuing, in an attempt to reduce costs, a polycrystalline silicon thin film transistor (poly-Si TFT) substrate that implements thin film transistors for driving pixels of a display area and thin film transistors for peripheral circuits outside the display area is being used. Particularly, a low temperature polycrystalline silicon thin film transistor substrate implementing a glass substrate is low-priced and may be easily enlarged. Thereby, such substrates are used not only in liquid crystal display apparatuses but organic EL apparatuses as well.

FIG. 1 is a diagram showing a configuration of a polycrystalline silicon thin film transistor substrate according to the conventional art. The polycrystalline silicon thin film transistor substrate of FIG. 1 includes a glass substrate 180 on which a pixel region 183 is implemented in the form of a matrix, pixel transistors 182 that are formed on portions of the pixel region 183, and periphery circuits 181. In order to form the pixel transistors 182 and the thin film transistors of the periphery circuits 181, a polycrystalline silicon film needs to be formed on the glass substrate 180. In the case of using a quartz substrate, which is high-priced, polycrystalline silicon may be directly laminated on the substrate by means of a high temperature thermal process; however, in the case of using a glass substrate, which is lower in price, a low-temperature process is implemented.

Accordingly, in many cases, a low temperature polycrystalline silicon thin film transistor is manufactured by initially forming an amorphous silicon (a-Si) film, and then irradiating an excimer laser on this film to form a polycrystalline film. The average crystal grain diameter of the polycrystalline silicon film that is crystallized in this manner depends on the power of the excimer laser. Specifically, the grain diameter increases with the increase of the laser power. When the average grain diameter is increased, the mobility of the polycrystalline silicon thin film transistor also increases. However, after reaching a predetermined threshold value, micro-crystallization occurs, and as a result, an inconsistency occurs in the mobility of the polycrystalline silicon thin film transistor.

Also, with the same laser power, the average grain diameter of the polycrystalline silicon film crystallized from an amorphous state tends to decrease as the film thickness of the original amorphous silicon film increases. Taking this factor into consideration, for example, in Japanese Patent Laid-Open Publication No. 11-284188, a technique of arranging the active layers of the transistors of the peripheral circuits, which require high speed operation, to be thinner than the active layers of the pixel transistors is proposed so as to increase mobility of the polycrystalline silicon thin film transistor. With the excimer laser that is presently used, when a film thickness of the amorphous silicon (a-Si) is arranged to be 60 nm or less, an n channel TFT with a TFT mobility of approximately 100 cm$^2$/Vs may be realized.

In Japanese Patent Laid-Open Publication No. 6-125084, a polycrystalline silicon thin film transistor manufacturing method is disclosed, the method including forming a pixel transistor with a thin semiconductor layer, forming a peripheral transistor requiring high speed operation with a thick semiconductor layer, and crystallizing the semiconductor layers through a thermal annealing process.

Also, presently, a lateral crystallization method using CW (continuous wave) laser is attracting much attention as a crystallization method for realizing a TFT with higher mobility. In lateral crystallization, the crystal grain diameter increases along the scanning direction (lateral direction) of the laser. By forming the source/drain regions of the TFT along the crystallization direction extending laterally, an even higher mobility may be realized.

The crystallization method using CW laser has been contemplated in the conventional art, but the output laser power of the conventional CW laser is inconsistent and thereby uniform crystallization cannot be realized. However, recently, a technique of fixing the CW laser through laser diode excitation has been developed, and with this technique, the problem of inconsistency in the output laser power has been greatly reduced, thereby realizing a suitable Crystallization method through CW laser irradiation.

With the CW laser irradiation method, the laser beam is arranged to have an oval-shaped laser spot and its spot diameter is reduced to several dozen $\mu$m in the minor axis direction, and several hundred $\mu$m in the major axis direction. The CW laser is arranged to be scanned at a speed ranging from several dozen to several hundred cm/s. In this way, a crystal grain diameter that cannot be obtained by using the excimer laser may be obtained using the CW laser. In the CW laser irradiation method, the laser beam absorption rate increases as the film thickness of the amorphous silicon (a-Si) film increases. Thereby, a large grain diameter may be achieved in the crystallization with low power. For example, when the film thickness of the amorphous silicon (a-Si) film is 50 nm or more, an n channel TFT with a mobility of 300 cm/Vs or higher may be realized.

However, in the polycrystalline silicon thin film transistor (poly-Si TFT) manufactured through lateral crystallization using CW laser, the following problems become prominent.

(1) Since the film thickness of the amorphous silicon (a-Si), film is increased compared to the case of using an excimer laser, leak current is increased during the off time of the transistor.

(2) With a CW laser beam, which has an oval-shaped beam spot, as opposed to the excimer laser, which has a narrow slit-shaped beam configuration, more time is required in laterally crystallizing the entire surface of the substrate thereby decreasing productivity. In this aspect, a technique of using plural beams may be contemplated, but in such case, it is difficult to maintain consistency in the beam energy, and the yield may be decreased.

(3) Since a high TFT mobility is achieved, the pressure resistance between the source/drain is degraded. In turn, the gate insulating film may be made thinner to reduce operation pressure; however, in such case, the pressure resistance with respect to gate voltage may be degraded.

SUMMARY OF THE INVENTION

It is an object of the present invention to provide a thin film transistor substrate manufacturing method implementing poly-crystallization through CW laser irradiation that is capable of maintaining high productivity while reducing off time leak current and pressure resistance degradation.

It is another object of the present invention to provide a thin film transistor substrate that implements two types of thin film transistors, the different types of thin film transistors having active layers with differing crystal grain diameters, so that desired operations may be realized.

According to an aspect of the present invention, an excimer laser is used to crystallize an active layer of a thin film transistor (TFT) that is situated in a region where high speed operation is not desired, and a CW (continuous wave) laser is used to laterally crystallize an active layer of a thin film transistor that is situated in a region where high speed operation is desired. In this way, the CW laser irradiation time may be shortened to thereby maintain high productivity.

According to another aspect of the present invention, a film thickness of an active layer of a TFT at a non-high speed operation region on which CW laser irradiation is not performed (e.g., pixel region) is arranged to be no more than 60 nm, preferably within a range of 40 nm~60 nm, to reduce off time leak current.

According to another aspect of the present invention, an active layer of a high speed operation TFT is arranged to have an average crystal grain diameter of at least 1 μm by conducting CW laser irradiation, and thereby, the film thickness of the active layer is arranged to be at least 50 nm, preferably within a range of 75 nm~100 nm.

According to another aspect of the present invention, an LDD (lightly doped drain) structure is not implemented thereby a drive voltage is maintained at a low level so as to prevent pressure resistance degradation between the source and drain. On the other hand, an LDD structure is implemented in an n channel TFT of a low speed operation region (e.g., pixel transistor), and in this way, pressure resistance may be improved.

According to another aspect of the present invention, to improve reliability, a gate insulating film of a high speed operation TFT region is arranged to be thin, and the gate insulating films of other TFT regions are arranged to be thick so that pressure resistance may be further improved.

According one embodiment of the present invention, a thin film transistor substrate includes:

a transparent insulating substrate;

a first thin film transistor that is formed on the transparent insulating substrate; and a second thin film transistor that is formed on the transparent insulating substrate, the second thin film transistor having a characteristic that differs from a characteristic of the first thin film transistor;

wherein an active layer of the first thin film transistor has a thickness of at least 50 nm, and an average crystal grain diameter of at least 1 μm; and an active layer of the second thin film transistor has a thickness of no more than 60 nm, and an average crystal grain diameter of less than 1 μm.

According to another embodiment of the present invention, thin film transistors having differing characteristics may be implemented on a thin film transistor substrate and desired operations may be reliably conducted by the respective thin film transistors.

According to another embodiment of the present invention, a thin film transistor substrate includes:

a transparent insulating substrate;

a first thin film transistor that is formed on the transparent insulating substrate; and a second thin film transistor that is formed on the transparent insulating substrate, the second thin film transistor having a characteristic that differs from a characteristic of the first thin film transistor;

wherein an active layer of the first thin film transistor has an average crystal grain diameter of at least 1 μm, and an active layer of the second thin film transistor has an average crystal grain diameter of less than 1 μm; and a gate insulating film of the first thin film transistor is arranged to be thinner than a gate insulating film of the second thin film transistor.

According to another embodiment of the present invention, transistors having differing operation speeds according to their operations are implemented on a thin film transistor substrate, and pressure resistance of the thin film transistor substrate may be improved by implementing transistors having small average crystal grain diameters.

According to another embodiment of the present invention, an active layer of a first thin film transistor corresponds to polycrystalline silicon that is laterally crystallized through continuous wave laser irradiation.

According to another embodiment of the present invention, an active layer of a second thin film transistor corresponds to polycrystalline silicon that is crystallized through excimer laser irradiation.

According to another embodiment of the present invention, a method of manufacturing a thin film transistor substrate implementing transistors having differing characteristics includes the steps of:

forming on a first region of a transparent insulating substrate a first semiconductor film with a first film thickness that is crystallized through excimer laser irradiation;

forming on a second region of the transparent insulating substrate a second semiconductor film that is laterally crystallized through continuous wave laser irradiation, the second semiconductor film being arranged to have a film thickness that is greater than or equal to the first film thickness;

forming a first thin film transistor on the first semiconductor film; and forming on the second semiconductor film a second thin film transistor that operates at a higher speed compared to the first thin film transistor.

According to another embodiment of the present invention, a step of forming a second semiconductor film includes selectively irradiating a continuous wave laser on a predetermined portion of an amorphous silicon film.

According to another embodiment of the present invention, a thin film transistor manufacturing method includes a step of forming a gate insulating film on a first semiconductor film, and a step of forming on a second semiconductor film a second gate insulating film that is thinner than the first gate insulating film.

BRIEF DESCRIPTION OF THE DRAWINGS

FIGS. 5A~5F are diagrams illustrating thin film transistor substrate manufacturing processes according to a variation example of the first embodiment;

FIGS. 6A~6G are diagrams illustrating thin film transistor substrate manufacturing processes according to a second embodiment of the present invention;

FIGS. 8A~8F are diagrams illustrating thin film transistor substrate manufacturing processes according to a third embodiment of the present invention;

FIGS. 9A~9G are diagrams illustrating thin film transistor substrate manufacturing processes according to a variation example of the third embodiment;

FIGS. 13A~13K are diagrams illustrating thin film transistor substrate manufacturing processes according to a sixth embodiment of the present invention;

FIGS. 14A~14E are diagrams illustrating thin film transistor substrate manufacturing processes according to a seventh embodiment of the present invention;

FIGS. 15A~15M are diagrams illustrating thin film transistor substrate manufacturing processes according to an eighth embodiment of the present invention;

FIGS. 16A~16E are diagrams illustrating thin film transistor substrate manufacturing processes according to a variation example of the eighth embodiment;

FIGS. 19A~19E are diagrams illustrating thin film transistor substrate manufacturing processes according to a second variation example of the ninth embodiment;

DESCRIPTION OF THE PREFERRED EMBODIMENTS

In the following, preferred embodiments of the present invention are described with reference to the accompanying drawings.

Figure 1:
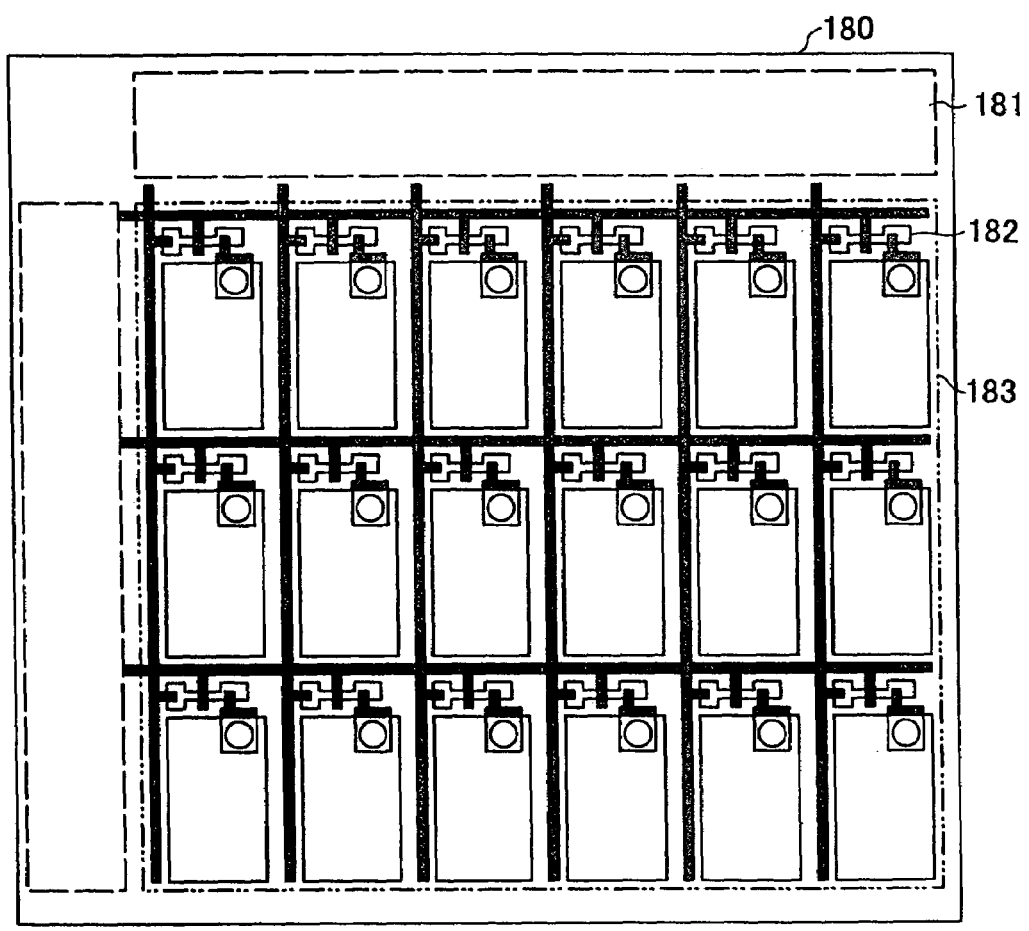
FIG. 1 is a plan view showing a configuration of a conventional thin film transistor substrate.
Figure 2:
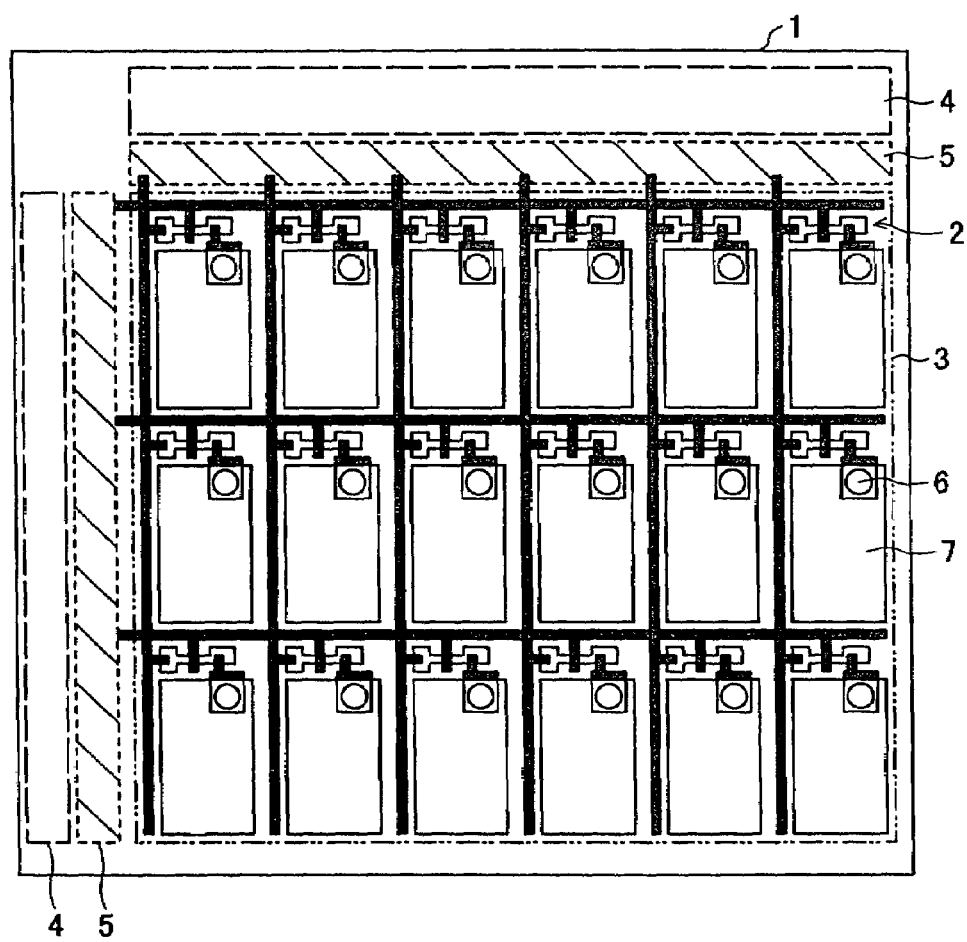
FIG. 2 is a plan view showing a configuration of a thin film transistor substrate according to an embodiment of the present invention.

FIG. 2 is a diagram illustrating a configuration of a thin film transistor substrate according to an embodiment of the present invention. The thin film transistor substrate of FIG. 2 includes a transparent insulating substrate 1 such as a glass substrate, a pixel region 3 that is formed into a matrix on the transparent insulating substrate 1, thin film transistors for driving pixels (referred to as 'pixel transistor' hereinafter) that are implemented on portions of the pixel region 3, first circuits 4 that have high speed operation features and are implemented outside the pixel region 3, and second circuits 5 without high speed operation features (non-high speed operation transistors) that are also implemented outside the pixel region 3. The source of each pixel transistor 2 in the pixel region 3 is connected to a pixel electrode (transparent electrode) 7 via a contact 6.

The first circuit 4 with the high speed operation feature may correspond to a circuit for processing input data, for example. The pixel transistor 2 is adapted to apply a voltage for a predetermined time period in order to change the alignment of liquid crystal, and preferably has high pressure resistance rather than a high speed operation feature.

Figure 3:
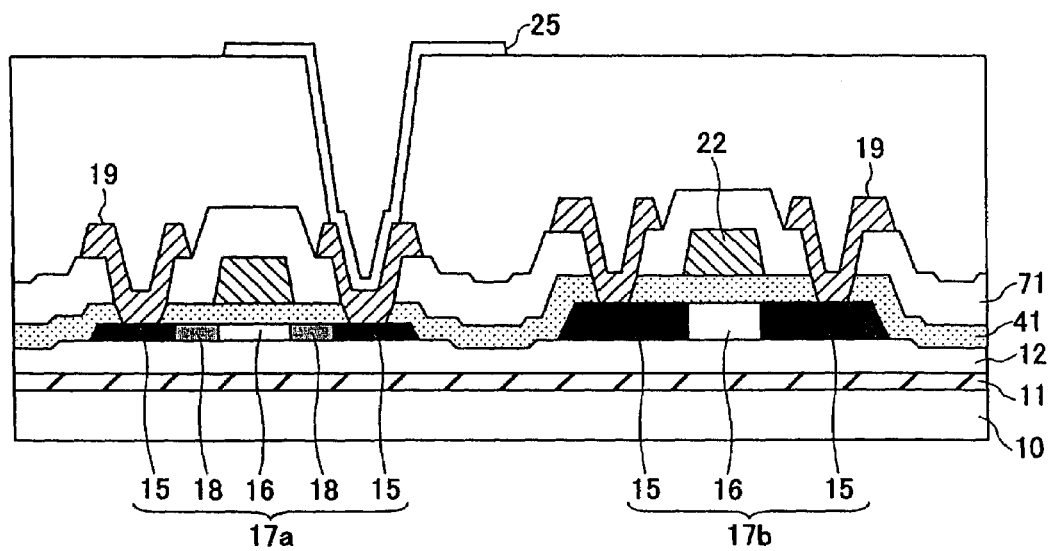
FIG. 3 is a cross-sectional diagram showing a structure of a thin film transistor substrate according to an embodiment of the present invention.

FIG. 3 is a cross-sectional view of the thin film transistor substrate of the present embodiment. In this example, the pixel transistor 2 is arranged to be an n channel non-high speed operation transistor, and an active layer 17a of the pixel transistor 2 implements an LDD configuration. Thereby, the active layer 17a of the pixel transistor 2 includes source/drain 15, LDD 18, and a channel region 16. On the other hand, an active layer 17b of an n channel high speed operation transistor does not implement the LDD configuration, and simply includes source/drain 15 and a channel region 16. On each of the active layers 17a and 17b, a gate electrode 22 is mounted via a gate insulating film 41. Also, on each of the source/drain 15 of the transistors, a source/drain electrode 19 is formed. In the case of the pixel transistor, a pixel electrode (transparent electrode) 25 is connected to the source/drain electrode 19.

Lateral crystallization through CW laser irradiation may be selectively performed on portions of the thin film transistor substrate that make up the high speed operation thin film transistor (TFT) regions to thereby form active layers of high speed operation transistors. On the other hand, the active layers of non-high speed operation thin film transistors may be formed by poly-crystallization through excimer laser irradiation, for example. By selectively performing the CW laser irradiation, laser irradiation time may be efficiently reduced. By using lateral crystallization, the carrier mobility in the crystallization direction may be augmented so that the operation speed of the transistor may be increased. Also, it is noted that the active layer (semiconductor film) formed in the high speed operation TFT region is arranged to be thick, and the active layer (semiconductor film) formed in the non-high speed operation TFT region such as the pixel TFT region is arranged to be thin. In this way, off time leak current in the pixel TFT region may be reduced. Further, by configuring the n channel TFT of the non-high speed operation region to have an LDD structure, pressure resistance of the transistor may be improved.

In the following, specific processes for manufacturing a thin film transistor substrate according to preferred embodiments of the present invention are described with reference to the accompanying drawings.

(Embodiment 1)

FIGS. 4A~4T illustrate processes for manufacturing a thin film transistor substrate according to a first embodiment of the present invention. In the present embodiment, a CMOS circuit is formed on a glass substrate 10. For the sake of convenience, in the following description, it is assumed that an n channel excimer crystallization region, an n channel high speed operation region, a p channel excimer crystallization region, and a p channel high speed operation region are formed on the thin film transistor substrate in this order from the left side of the drawings; however, the arrangement of the thin film transistor substrate according to the present invention is not limited to this layout. Also, in the present embodiment, the thin film transistor (TFT) that is formed in the n channel excimer crystallization region is assumed to be a pixel transistor.

According to the first embodiment, a first thin semiconductor (a-Si) film is formed on a glass substrate, and an excimer laser is irradiated on the surface of substrate to realize poly-crystallization of the first semiconductor film. Then, patterning of the first semiconductor (poly-Si) film is performed in a manner such that the first semiconductor film 13 remains on the non-high speed operation TFT regions. Then, a second thick semiconductor (a-Si) film is formed, and a CW laser is irradiated on the high speed operation TFT regions to realize lateral crystallization.

In FIG. 4A, a base SiN film 11, a base $SiO_2$ film 12, and a first semiconductor (a-Si) film 13 respectively having thicknesses of 50 nm, 200 nm, and 40 nm are formed on a glass substrate 10 using a CVD apparatus, and an excimer laser is irradiated on the surface of the glass substrate 10 to crystallize the first semiconductor film (a-Si) 13 that is in an amorphous state.

Then, in FIG. 4B, a protective $SiO_2$ film 14 is formed with a thickness of 20 nm using the CVD method, for example.

Then, in FIG. 4C, resists are patterned on TFT regions that do not require high speed operation so that the regions may be masked by masks M1, after which the protective SiO2 film 14 and the crystallized first semiconductor film (poly-Si) 13' are etched. The etching process may be performed by supplying fluorine gas using an RIE apparatus, for example.

Then, in FIG. 4D, the resist masks M1 are removed, and a second semiconductor (a-Si) film 21 is formed on the surface of the substrate using the CVD method. The film thickness of the second semiconductor film 21 is arranged to be 75 nm.

Then, in FIG. 4E, resist masks M2 are formed on the high speed operation transistor regions of the second semiconductor film 21, after which the second semiconductor film 21, and the protective $SiO_2$ film 14 formed on the first semiconductor film 13' of the non-high speed operation TFT region are etched and removed. For example, the second semiconductor (a-Si) film 21 may be etched by fluorine gas, and the protective $SiO_2$ film 14 may be etched by diluted hydrofluoric acid using the RIE method.

Figure 4F:
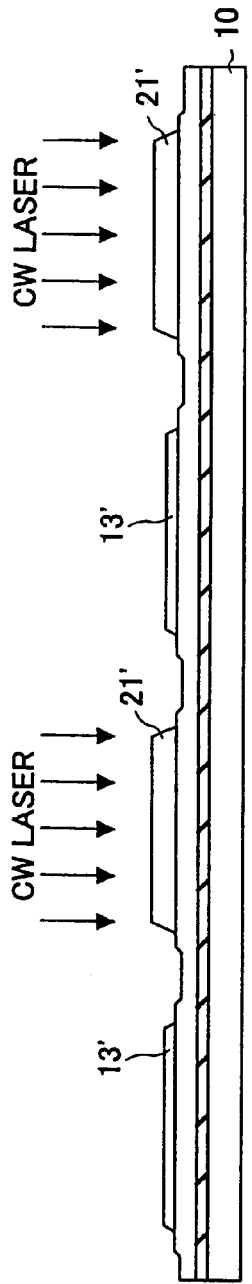
FIGS. 4A~4T are diagrams illustrating thin film transistor substrate manufacturing processes according to a first embodiment of the present invention.

In FIG. 4F, a CW laser is selectively irradiated on the high speed operation TFT regions, and the second semiconductor (a-Si) film 21 is laterally crystallized to form a polycrystalline silicon (poly-Si) film 21'.

Figure 4G:
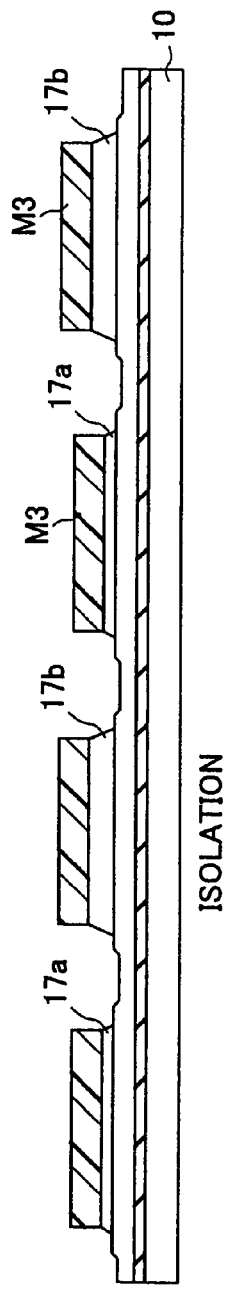

Then, in FIG. 4G, resist masks M3 are used in etching the polycrystalline silicon films 13' and 21' to realize isolation. In this way, thin semiconductor films 17a of the non-high speed operation TFT regions and thick semiconductor films 17b of the high speed operation TFT regions are formed.

Figure 4H:
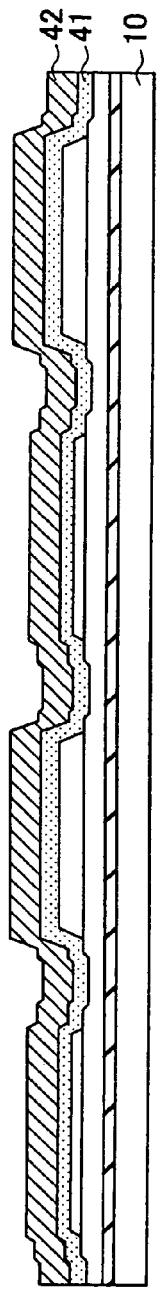

Then, in FIG. 4H, a gate insulating film 41 and a first conductive film 42 are formed. For example, a $SiO_2$ film with a thickness of 50 nm may be formed using the CVD method, and an Al-Nd film with a thickness of 300 nm may be formed through spattering. The first conductive film 42 may be provided in order to form gate electrodes.

Figure 4I:
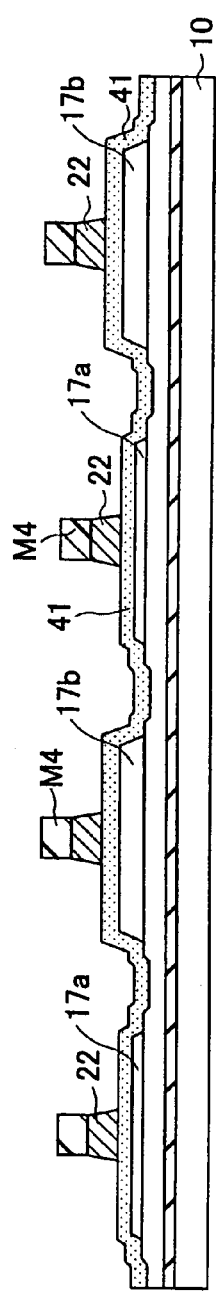

Then, in FIG. 4I, resists in the shape of gate electrodes are patterned on the first conductive film as masks M4, after which wet etching of the first conductive film 42 is performed to form gate electrodes 22 on the gate insulating ($SiO_2$) film 41.

Figure 4J:
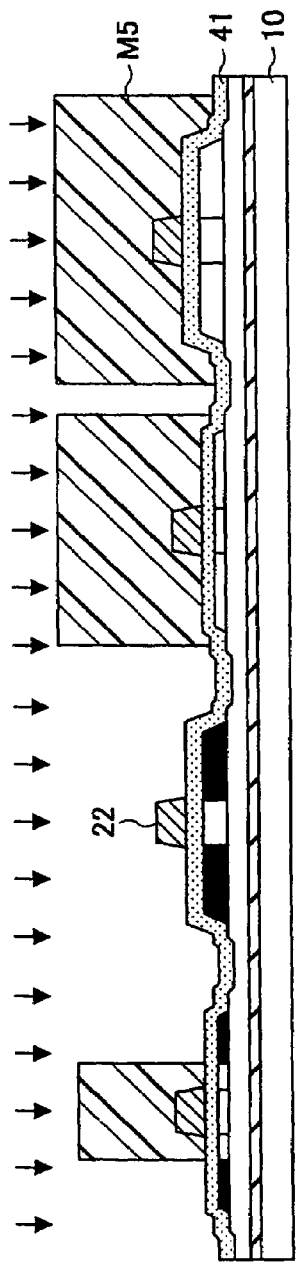

Then, in FIG. 4J, areas surrounding the gate electrode 22 of the n channel non-high speed operation TFT region (excimer crystallization region), and the p channel regions are covered by resist masks M5, and P (phosphorous) ions are implanted into the exposed semiconductor film at a high concentration. For example, the P ions may be implanted using an ion doping apparatus at an energy level of 40 KeV, and a dose amount of $1\times10^{15}$. The areas surrounding the gate electrode 22 of the n channel non-high speed operation TFT region (excimer crystallization region) corresponds to a region where an LDD is to be configured.

Figure 4K:
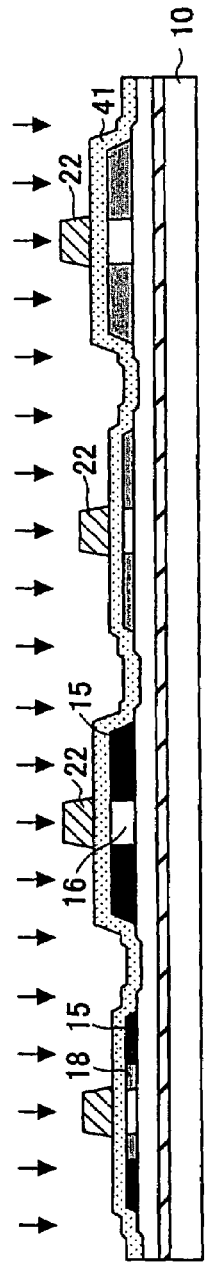

In FIG. 4K, the resist masks M5 are removed, and the gate electrodes 22 are used as masks upon implanting P ions on the surface of the substrate at a low concentration. For example, the P ions may be implanted using an ion doping apparatus at an energy level of 40 KeV, and a dose amount of $2\times10^{15}$. In this low concentration P ion implantation process, an LDD 18 is formed within the active layer of the n channel pixel transistor.

Figure 4L:
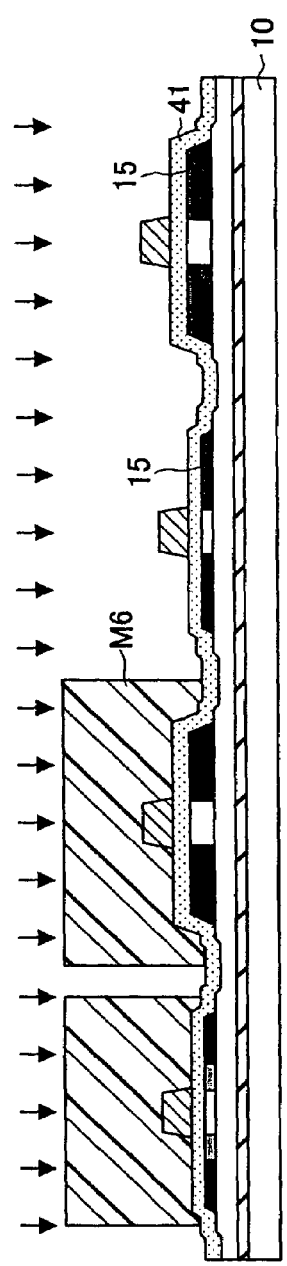

In FIG. 4L, the n channel regions are covered by resist masks M6, and boron ions are implanted into the semiconductor films of the p channel regions at a high concentration. For example, the B ions may be implanted using an ion doping apparatus at an energy level of 40 KeV, and a dose amount of $1\times10^5$.

Figure 4M:
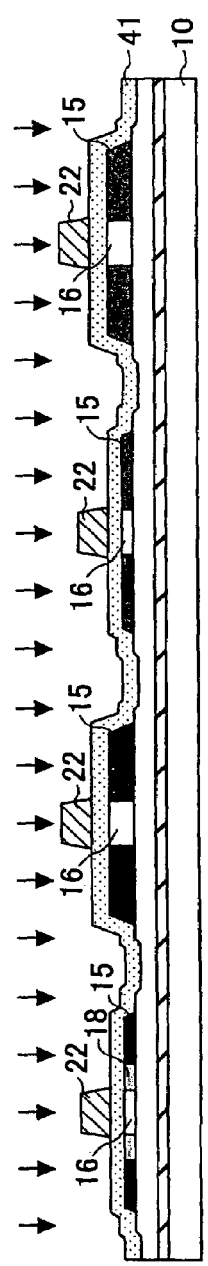

In FIG. 4M, the resist masks M6 are removed, and an excimer laser is irradiated on the surface of the substrate to realize laser activation. In this way, a source/drain 15 is formed on each of the active layers of the TFT regions.

In FIG. 4N, an interlayer insulating film 71 containing hydrogen is formed, and hydrogenation is performed through thermal processing. For example, a SiN film with a film thickness of 370 nm may be formed using the CVD method, and a thermal annealing process at 350° C. in a nitrogen atmosphere at atmospheric pressure may be performed for two hours. It is noted that the hydrogenation method is not limited to the above example, and an annealing process in a hydrogen atmosphere or a hydrogen plasma process may be performed as well. In such cases, the interlayer insulating film does not necessarily have to contain hydrogen.

In FIG. 4O, resist masks M7 are formed, and the interlayer insulating film 71 is etched using the RIE method to form contact holes 37.

In FIG. 4P, the resist masks M7 are removed, and a second conductive film 81 is formed. The second conductive film 81 may be formed by successively spattering Ti/Al/Ti films at film thicknesses of 50 nm, 200 nm, and 100 nm, respectively.

In FIG. 4Q, resist masks M8 are used in etching the second conductive film 81, and source/drain electrodes 19 are formed as a result. The etching may be realized by performing the RIE method using chlorine gas.

In FIG. 4R, a second interlayer insulating film 91 is formed. It is noted that an organic resin film having transparency and photosensitivity is used as the second insulating film 91.

In FIG. 4S, an opening 92 is formed at the source electrode 19S of the pixel transistor (n channel non-high speed operation transistor in this example).

In FIG. 4T, a third conductive film (not shown) is etched to form a pixel electrode 25, in this way, the manufacturing of the thin film transistor substrate is completed.

According to the above manufacturing method, a thin film transistor substrate having a circuit element that is capable of high speed operation may be manufactured in a productive manner by simply adding to the conventional manufacturing method, each of a film deposition process for forming the second semiconductor (a-Si) film 21 having a film thickness that is suitable for CW laser irradiation, and a photo process and an etching process for shaping the second semiconductor film 21 into a predetermined shape. It is noted that in performing dry etching of the second semiconductor (a-Si) film 21 shown in FIG. 4E, the film thickness of the protective $SiO_2$ film 14 and the etching conditions are preferably adjusted so that the crystallized first semiconductor (poly-Si) film 13' may not be damaged.

Figures 5E, 5F:
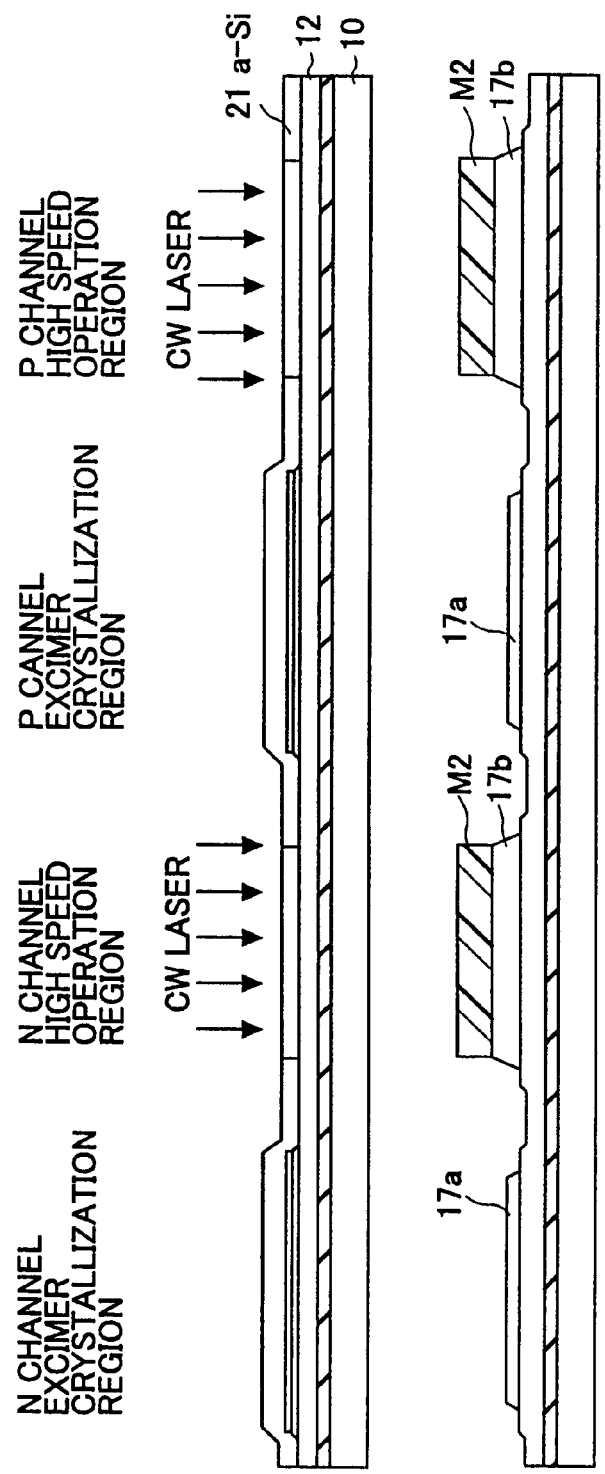

FIGS. 5A~5F illustrate a variation example of the manufacturing method of the first embodiment. It is noted that the processes illustrated by FIGS. 5A~5D are identical to those of FIGS. 4A~4D, that is, a base SiN film 11, a base $SiO_2$ film 12, and a first semiconductor (a-Si) film 13 respectively having thicknesses of 50 nm, 200 nm, and 40 nm are deposited on a glass substrate 10 using a CVD apparatus, and an excimer laser is irradiated on the surface thereof to crystallize the first semiconductor film (a-Si) 13 that is an amorphous state (FIG. 5A). Then, a protective $SiO_2$ film 14 is deposited (FIG. 5B), and resist masks M1 are formed on the excimer crystallization regions that do not require high speed operation, after which the protective SiO2 film 14 and the crystallized first semiconductor film (poly-Si) 13' are etched (FIG. 5C). Then, the resist masks M1 are removed, and a second semiconductor (a-Si) film 21 with a film thickness of 75 nm is deposited (FIG. 5D).

Then, in FIG. 5E, a CW laser is selectively irradiated on the high speed operation TFT regions of the second semiconductor (a-Si) film 21 so as to realize lateral crystallization of the second semiconductor (a-Si) film 21. Herein, the first semiconductor (poly-Si) film 13' may be used as a positioning mark.

Then, in FIG. 5F, resist masks M2 are used in etching and removing the second semiconductor film 21 and the protective $SiO_2$ film 14 formed on the first semiconductor film 13' to realize isolation. The ensuing processes for this manufacturing method are identical to the processes illustrated in FIG. 4I and onward, and thereby, drawings and descriptions thereof are omitted.

According to this variation example, the patterning process (photo process and etching process) of the second semiconductor (a-Si) film 21 is omitted, and the CW laser is irradiated on portions of a solid a-Si film corresponding to the second semiconductor film 21 to thereby realize lateral crystallization of the irradiated portions. In other words, each of a photo process and an etching process may be omitted from the manufacturing processes of the first embodiment. In this case, the laser beam of the CW laser is preferably adjusted with due consideration to lateral crystallization margins.

(Embodiment 2)

FIGS. 6A~6G illustrate processes for manufacturing a thin film transistor substrate according to a second embodiment of the present invention. According to the second embodiment, a first thick semiconductor (a-Si) layer is masked and patterned on the high speed operation TFT regions, and a second thin semiconductor (a-Si) film is formed over the surface of the substrate. Then, after crystallizing the second thin semiconductor (a-Si) film through excimer laser irradiation, the crystallized second thin semiconductor (poly-Si) film is removed from areas other than the non-high speed operation TFT regions (excimer crystallization regions), and a CW laser is irradiated on predetermined regions accommodating the exposed first thick semiconductor (a-Si) film to realize lateral crystallization. In the following, specific processes are described with reference to the drawings.

In FIG. 6A, a base SiN film 11, a base $SiO_2$ film 12, and a first semiconductor (a-Si) film 13 respectively having thicknesses of 50 nm, 200 nm, and 75 nm are formed on a glass substrate 10 using a CVD apparatus.

Then, in FIG. 6B, resists are patterned on TFT regions that require high speed operation so that the regions may be masked by masks M1, after which the first semiconductor film (a-Si) 13 is etched. The etching may be performed by applying fluorine gas using an RIE apparatus, for example.

Then, in FIG. 6C, a protective $SiO_2$ film 20 and a second semiconductor (a-Si) film 21 are successively formed. For example, using the CVD method, the $SiO_2$ film 20 film with a film thickness of 20 nm and the second semiconductor (a-Si) film 21 with a film thickness of 40 nm may be formed.

Then, in FIG. 6D, an excimer laser is irradiated so that the second semiconductor film 21 is crystallized.

Figure 6E:
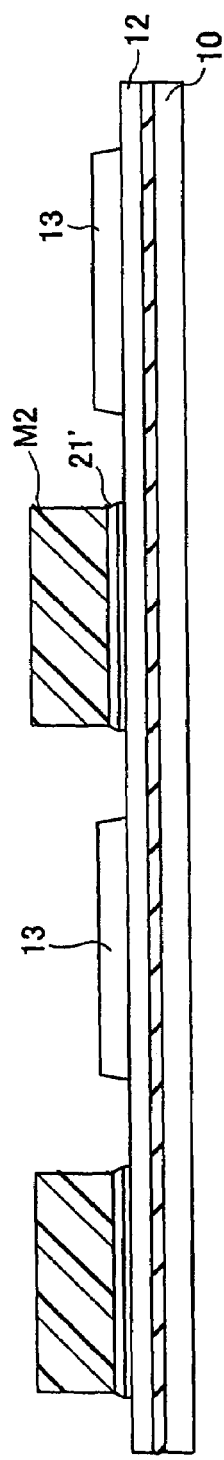

Then, in FIG. 6E, resist masks M2 are patterned on the TFT regions that do not require high speed operation, and the second thin semiconductor (poly-Si) film 21' and the protective $SiO_2$ film 20 are etched and removed. The etching of the second semiconductor (poly-Si) film 21' may be performed using fluorine gas according to the RIE method, for example. The protective $SiO_2$ film 20 may be etched using diluted hydrofluoric acid, for example. In this way, the first thick semiconductor film 13 that is patterned beforehand may be exposed.

Figure 6F:
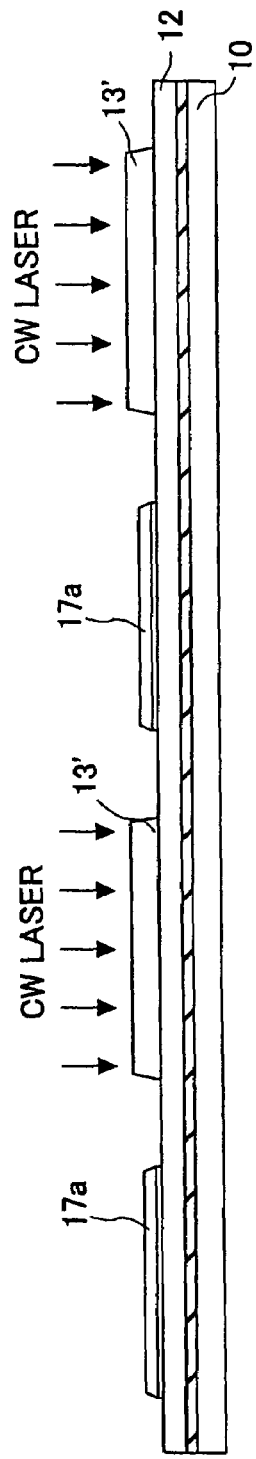

Then, in FIG. 6F, the resist masks M2 are removed, and a CW laser is irradiated on the high speed TFT regions to realize lateral crystallization of the first semiconductor film 13 patterns.

Figure 6G:
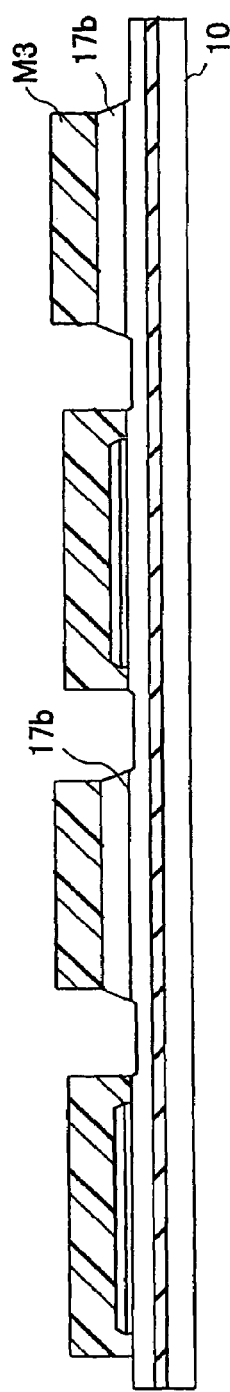

Then, in FIG. 6G, the first semiconductor film 13 is etched in order to realize isolation. At this point, the substrate is left with thin semiconductor films 17a that are formed on the non-high speed operation TFT regions, and thick semiconductor films 17b that are formed on the high speed operation TFT regions.

The ensuing processes for manufacturing the thin film transistor substrate according to the second embodiment are identical to the processes according to the manufacturing method of the first embodiment as illustrated by the drawings of FIG. 4H and onward.

In the manufacturing method according to the second embodiment, a thin film transistor substrate having a. circuit element that is capable of high speed operation may be manufactured in a productive manner by simply adding each of an amorphous silicon (a-Si) film deposition process, a photo process, and an etching process to the conventional manufacturing method. Also, in the second embodiment, there is no need to pay heed to possible damaging of the channel region of the non-high speed operation TFT.

FIGS. 7A~7G illustrate processes according to a variation of the second embodiment.

Figures 7A, 7B, 7C, 7D:
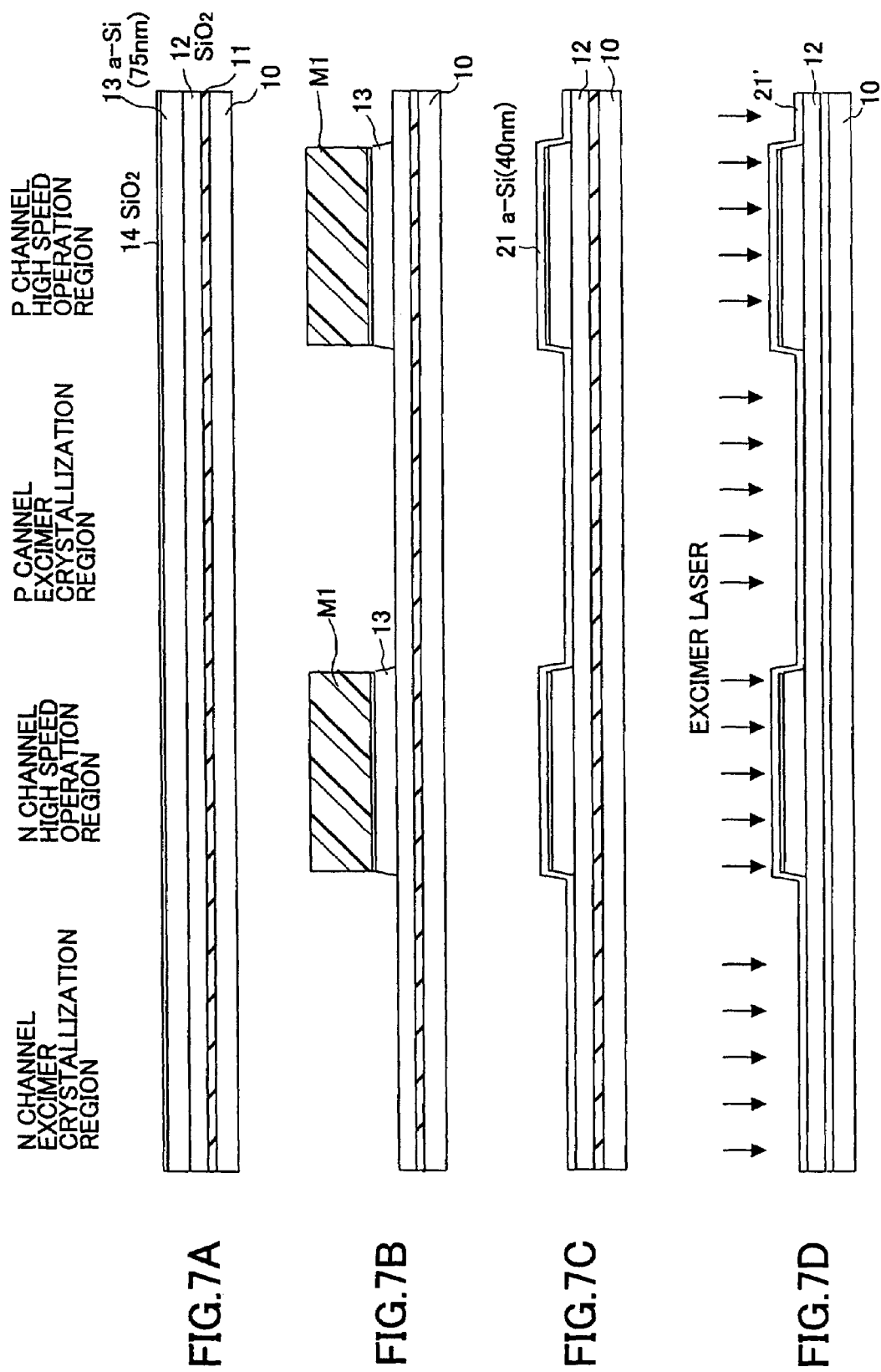
FIGS. 7A~7G are diagrams illustrating thin film transistor substrate manufacturing processes according to a variation example of the second embodiment.

In FIG. 7A, a base SiN film 11, a base $SiO_2$ film 12, a first semiconductor (a-Si) film 13, and a protective $SiO_2$ film 14 respectively having film thicknesses of 50 nm, 200 nm, 75 nm, and 20 nm are formed on a glass substrate 10 using the CVD method.

Then, in FIG. 7B, resist masks M1 are patterned on the TFT regions that require high speed operation, after which the protective SiO2 film 14 and the first semiconductor film 13 are etched. The etching may be performed by applying fluorine gas using an RIE apparatus, for example.

Then, in FIG. 7C, the second thin semiconductor (a-Si) film 21 with a film thickness of 40 nm is formed over the surface of the substrate using the CVD method, for example.

Then, in FIG. 7D, the excimer laser is irradiated, and the second thin semiconductor film 21 is crystallized.

Figure 7E:
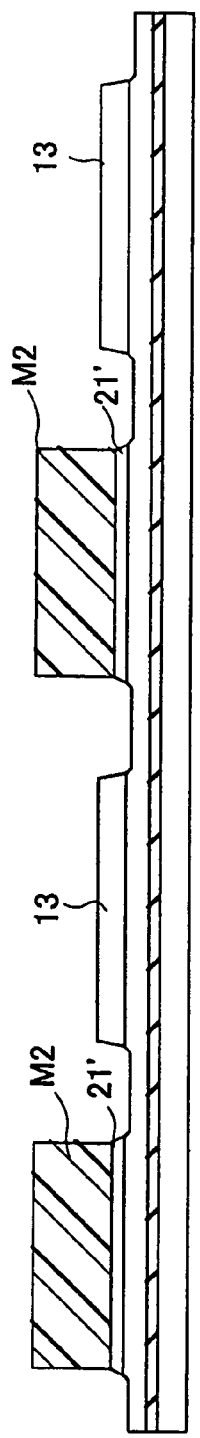

Then, in FIG. 7E, resist masks are patterned as resist masks M2 on the TFT regions not requiring high speed operation, and the crystallized second thin semiconductor (poly-Si) film 21' and the protective SiO2 film 14 are etched and removed. Specifically, the second semiconductor film 21' may be etched by fluorine gas using the RIE apparatus, after which the protective SiO2 film 14 may be etched by diluted hydrofluoric acid, for example. In this way, the first thick semiconductor film 13 patterns may be exposed.

Figure 7F:
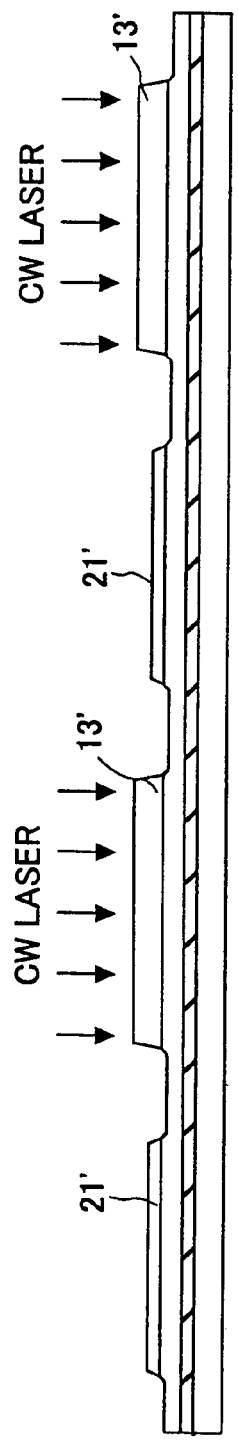

Then, in FIG. 7F, the resist masks M2 are removed, and a CW laser is selectively irradiated on the first thick semiconductor film 13 patterns to realize lateral crystallization.

Figure 7G:
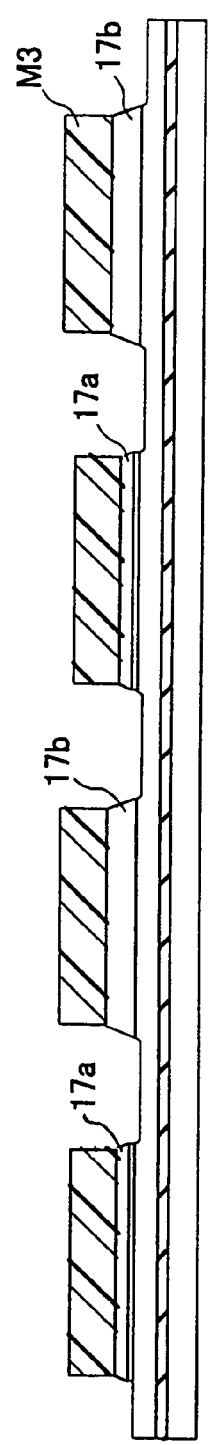

Then, in FIG. 7G, the crystallized semiconductor (poly-Si) films 13' and 21' are etched using resist masks M3 to realize isolation of the films. In this way, thin active layers 17a are formed on the non-high speed operation TFT regions, and thick active layers 17b are formed on the high operation TFT regions.

The ensuing processes are identical to those of the first embodiment and thereby their descriptions and corresponding drawings are omitted.

In the method according to this variation embodiment, a thin film transistor substrate having a circuit element that is capable of high speed operation may be manufactured in a productive manner by simply adding each of an amorphous silicon (a-Si) film deposition process, a photo process, and an etching process to the conventional manufacturing method.

(Embodiment 3)

FIGS. 8A~8F illustrate processes for manufacturing a thin film transistor substrate according to a third embodiment of the present invention. According to the third embodiment, first, a thick semiconductor film is formed, and a CW laser is irradiated on the high speed operation TFT regions to realize lateral crystallization. Then, a thin semiconductor film is formed, and an excimer laser is irradiated to crystallize and pattern the thin semiconductor film on the non-high speed operation TFT regions.

Specifically, in FIG. 8A, a base SiN film 11, a base SiO$_2$ film 12, and a first thick semiconductor (a-Si) film 13 respectively having film thicknesses of 50 nm, 200 nm, and 75 nm are formed on a glass substrate 10 by implementing the CVD method.

Then, in FIG. 8B, a CW laser is irradiated on the high speed operation TFT regions, and lateral crystallization is realized on portions of the amorphous silicon (a-Si) film 13 positioned at these regions.

In FIG. 8C, resists are patterned on the high speed operation TFT regions on which the CW laser is irradiated so that these regions are covered by masks M1, and etching of the thick semiconductor (poly-Si) film 13' is conducted. The etching may be realized by fluorine gas using the RIE apparatus, for example. In this way, the substrate is left with the laterally crystallized first semiconductor (poly-Si) films 13' that are patterned into predetermined shapes.

In FIG. 8D, a protective SiO2 film 20 and a thin second semiconductor film 21 are formed to cover the surface of the substrate. For example, the protective SiO2 film 20 and the thin second semiconductor film 21 may be formed with film thicknesses of 20 nm and 40 nm, respectively, using the CVD method.

Then, in FIG. 8E, an excimer laser is irradiated and the second semiconductor film is crystallized.

Then, in FIG. 8F, resist masks M2 are patterned on the TFT regions not requiring the high speed operation, and etching and removal of the crystallized second semiconductor film 21' and the protective SiO2 film 20 is performed to realize isolation of the channel regions. For example, the second semiconductor film 21' may be etched by fluorine gas using an RIE apparatus, and the protective SiO2 film 20 may be etched by diluted hydrofluoric acid, for example. In this way, the substrate may be left with thin semiconductor films 17a positioned at the non-high speed operation TFT regions, and thick semiconductor films 17b positioned at the high speed operation TFT regions.

The ensuing processes for manufacturing the thin film transistor substrate according to the present embodiment are identical to those of the first embodiment as illustrated in the diagrams of FIG. 4H and onward.

According to the manufacturing method of the third embodiment, a thin film transistor substrate having a circuit element that is capable of high speed operation may be manufactured in a productive manner by simply adding each of an amorphous silicon (a-Si) film deposition process, a photo process, and an etching process to the conventional manufacturing method.

Also, since the CW laser is irradiated on a solid a-Si film corresponding to the first semiconductor film 13 in the third embodiment, each of a photo process and an etching process (patterning process) may be omitted from the manufacturing processes of the second embodiment. In this case, the CW laser beam is preferably adjusted with due consideration to lateral crystallization margins.

FIGS. 9A~9G illustrate processes for manufacturing a thin film transistor substrate according to a variation example of the third embodiment.

In FIG. 9A, a base SiN film 11, a base SiO$_2$ film 12, and a thick first semiconductor (a-Si) film 13 respectively having film thicknesses of 50 nm, 200 nm, and 75 nm are formed on a glass substrate 10 using the CVD method.

In FIG. 9B, a CW laser is irradiated on the high speed operation TFT regions, and lateral crystallization is realized on portions-of the amorphous silicon (a-Si) film 13 positioned at these regions.

In FIG. 9C, a protective SiO2 film 14 with a film thickness of 20 nm is formed on the surface of the substrate by the CVD method.

In FIG. 9D, resists are patterned on the high speed operation TFT regions, and etching of the protective SiO2 film 14 and the first semiconductor film 13 is conducted using resist masks M1. The etching of the protective SiO2 film 14 and the first semiconductor film 13 may be realized by fluorine gas using the RIE apparatus, for example.

Then, in FIG. 9E, a thin second semiconductor (a-Si) film 21 with a film thickness of 40 nm is formed by the CVD method.

Then, in FIG. 9F, the second semiconductor film 21 is crystallized through excimer laser irradiation.

Then, in FIG. 9G, resist masks M2 are patterned on the TFT regions not requiring high speed operation, after which the second semiconductor film 21' and the protective SiO2 film 14 are etched and removed. For example, after the second semiconductor (poly-Si) film 21' is etched by fluorine gas using an RIE apparatus, the protective SiO2 film 14 remaining on the first semiconductor film formed on the high speed operation TFT regions is etched by diluted hydrofluoric acid. In this way, the substrate is left with thin semiconductor films 17a formed on the non-high speed operation TFT regions and thick semiconductor films 17b formed on the high speed operation TFT regions.

The ensuing processes for manufacturing the thin film transistor substrate according to the present variation example are identical to those of the first embodiment as illustrated in the diagrams of FIG. 4H and onward.

According to the present example, a thin film transistor substrate having a circuit element that is capable of high speed operation may be manufactured in a productive manner by simply adding each of an amorphous silicon (a-Si) film deposition process, a photo process, and an etching process to the conventional manufacturing method. Also, since the CW laser irradiation is selectively irradiated on a solid a-Si film corresponding to the first semiconductor film 13 in the present variation example, each of a photo process and an etching process (patterning process) may be omitted from the manufacturing processes of the second embodiment. In this case, the CW laser beam is preferably adjusted with due consideration to lateral crystallization margins.

(Embodiment 4)

Figure 10A:
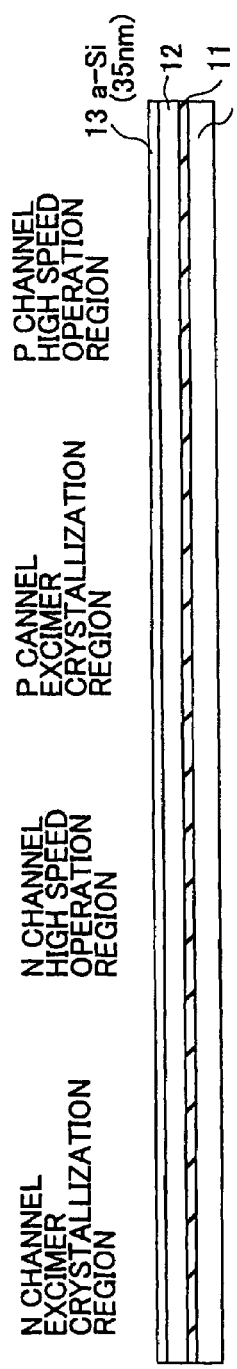
FIGS. 10A~10E are diagrams illustrating thin film transistor substrate manufacturing processes according to a fourth embodiment of the present invention.
Figure 10B:
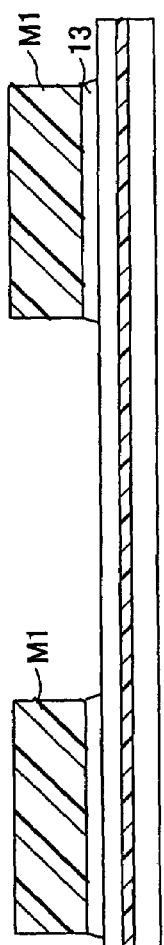
Figure 10C:
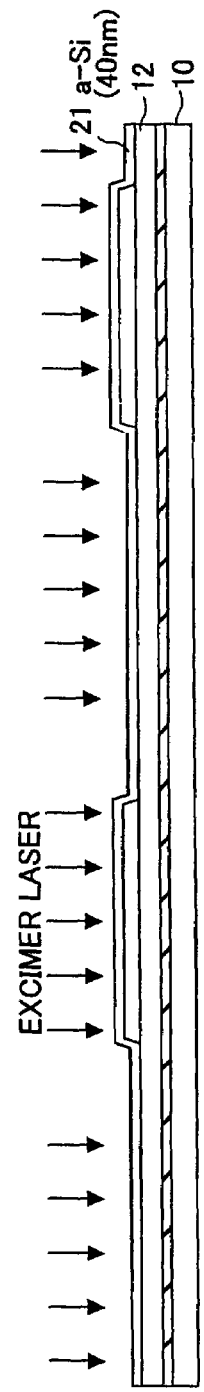
Figure 10D:
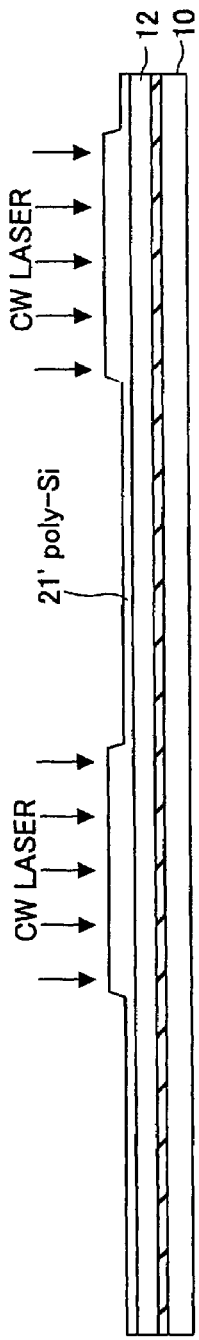
Figure 10E:
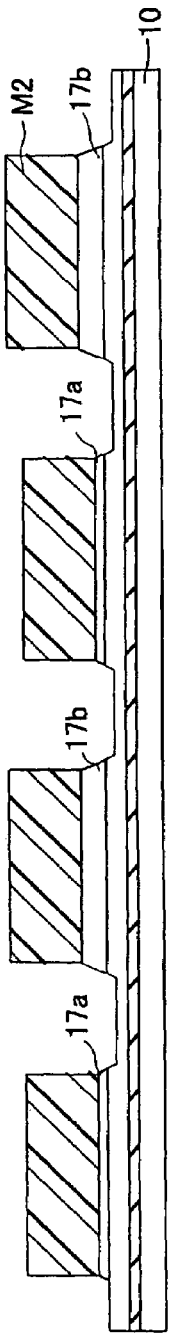

FIGS. 10~10E illustrate processes for manufacturing a thin film transistor according to a fourth embodiment of the present invention. In the fourth embodiment, a semiconductor film with a predetermined thickness is formed on the high speed operation TFT regions. Subsequently, a thin semiconductor film is formed and an excimer laser is irradiated on the overall surface of the substrate. Then, a CW laser is irradiated on the high speed operation TFT regions to realize lateral crystallization. Then, patterning of the respective TFT regions is performed. In the following, specific processes are described with reference to the drawings.

In FIG. 10A, a base SiN film 11, a base $SiO_2$ film 12, and a first semiconductor (a-Si) film 13 respectively having film thicknesses of 50 nm, 200 nm, and 35 nm are formed on a glass substrate 10 by the CVD method.

In FIG. 10B, resist masks M1 are patterned on the high speed operation TFT regions, and the first semiconductor (a-Si) film 13 is etched from regions other than the high speed operation TFT regions. The etching may be realized with fluorine gas using an RIE apparatus, for example.

Then, in FIG. 10C, a second semiconductor film 21 with a film thickness of 40 nm may be formed on the surface of the substrate by the CVD method, and an excimer laser may be irradiated thereon.

Then, in FIG. 10D, a CW laser is selectively irradiated on the high speed operation TFT regions, and lateral crystallization is realized on the amorphous silicon (a-Si) film formed at the high speed operation TFT regions.

Then, in FIG. 10E, resists are patterned on the TFT regions as masks M2, and the semiconductor film is etched from regions other than the TFT regions to realize isolation of thereof. The etching may be realized by supplying fluorine gas using an RIE apparatus, for example.

The ensuing processes for manufacturing the thin film transistor substrate according to the present embodiment are identical to those of the first embodiment, and thereby their descriptions and drawings are omitted.

According to the manufacturing method of the fourth embodiment, a thin film transistor substrate having a circuit element that is capable of high speed operation may be manufactured in a productive manner by simply adding an amorphous silicon (a-Si) film deposition process to the conventional manufacturing method.

(Embodiment 5)

Figures 11A, 11B, 11C, 11D:
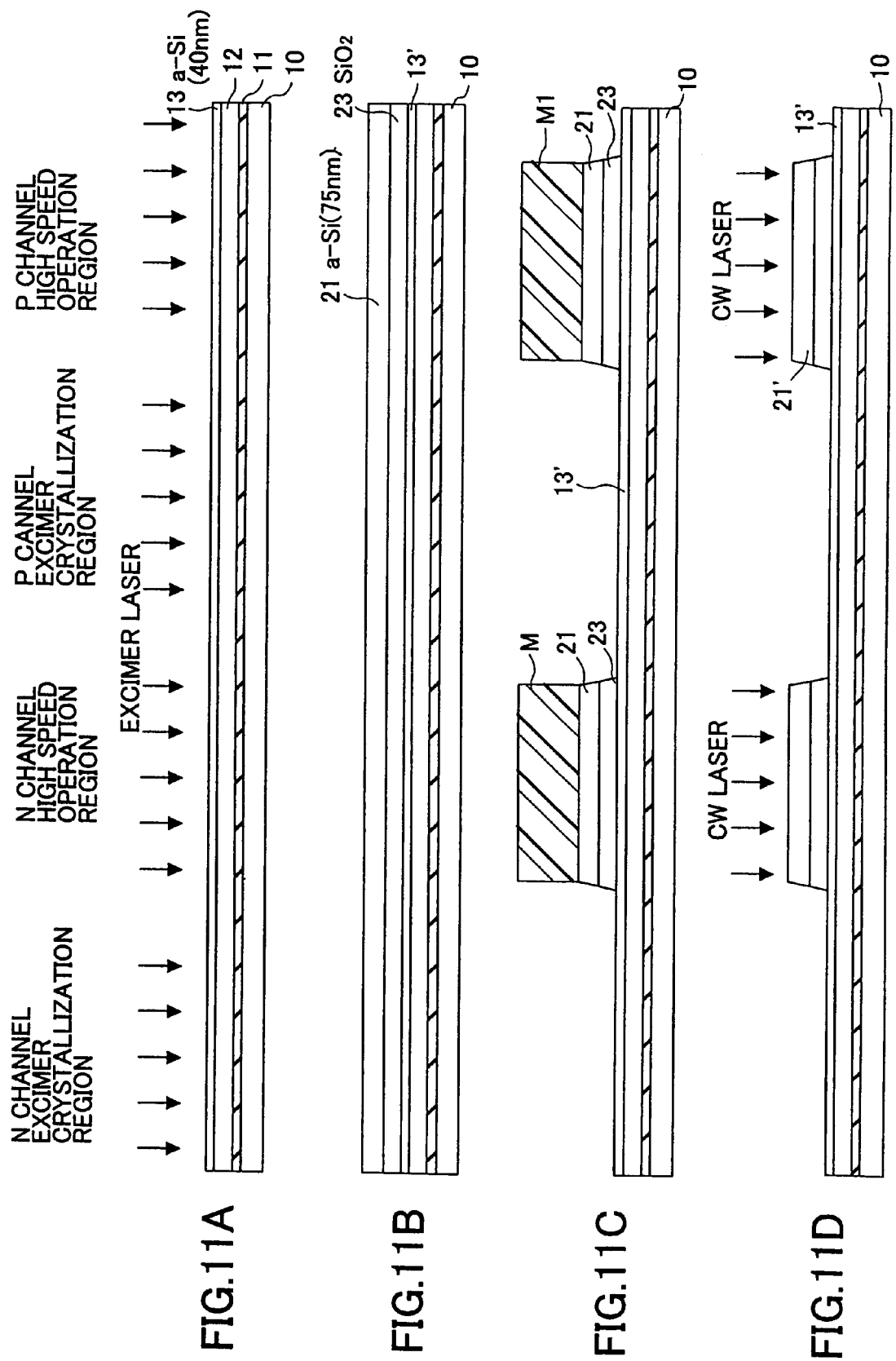
FIGS. 11A~11R are diagrams illustrating thin film transistor substrate manufacturing processes according to a fifth embodiment of the present invention.
Figure 11E:
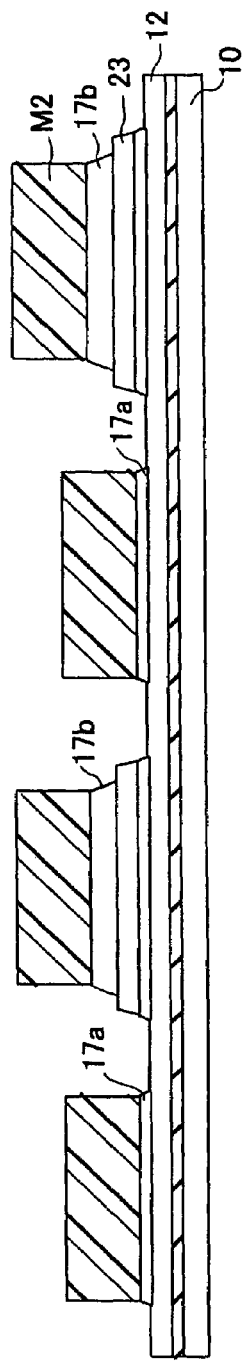
Figure 11F:
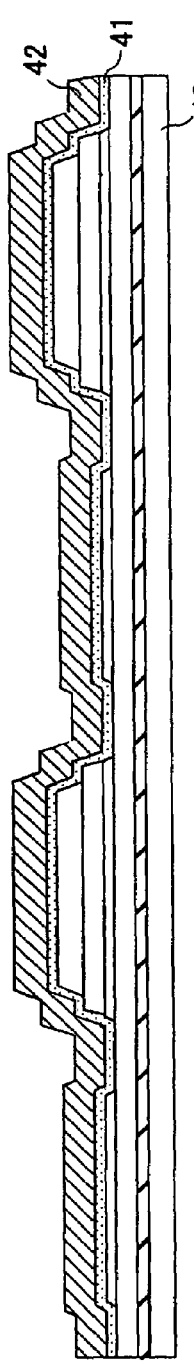
Figure 11G:
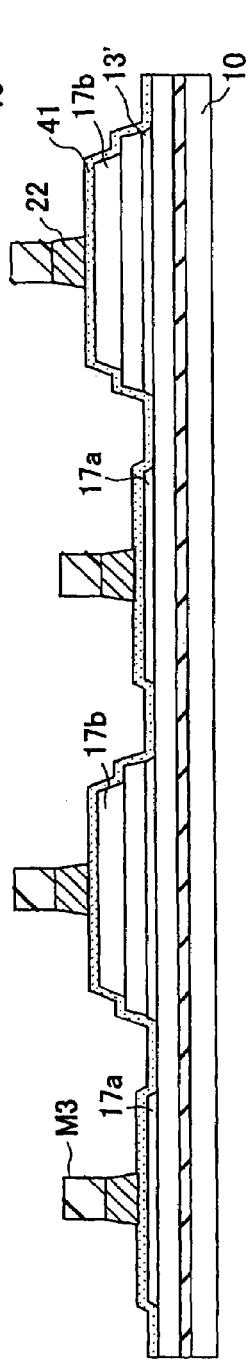
Figure 11H:
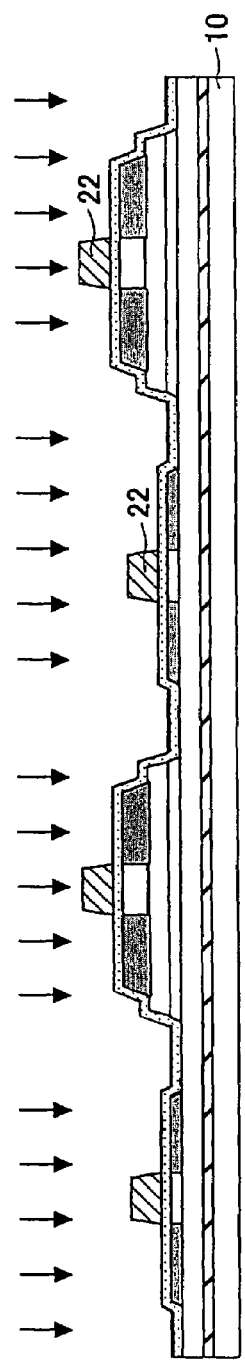
Figure 11I:
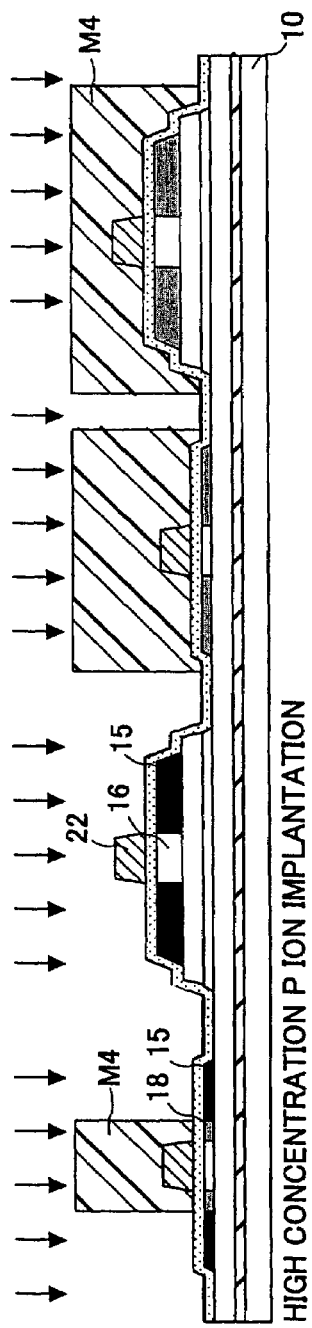
Figure 11J:
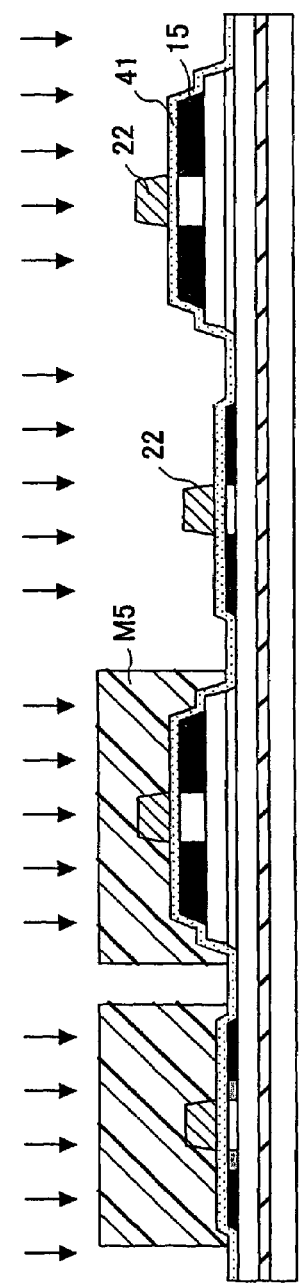
Figure 11K:
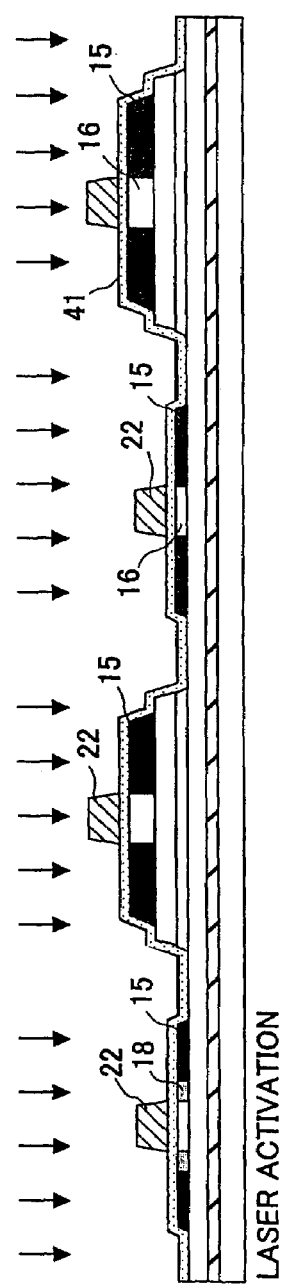
Figure 11P:
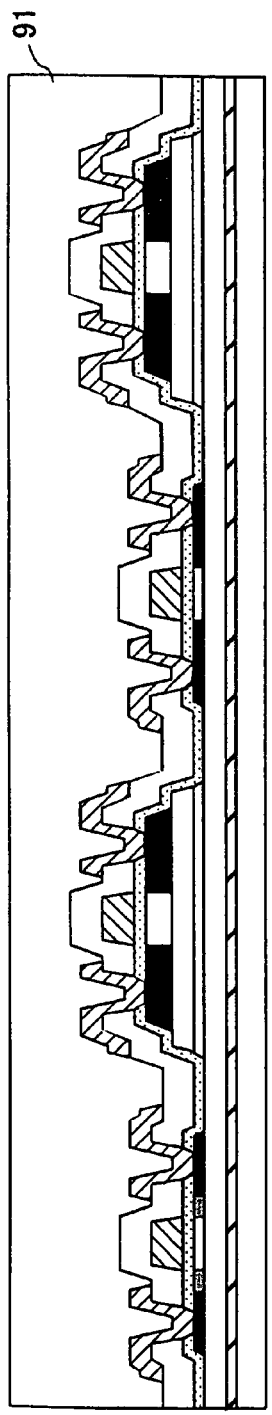
Figure 11Q:
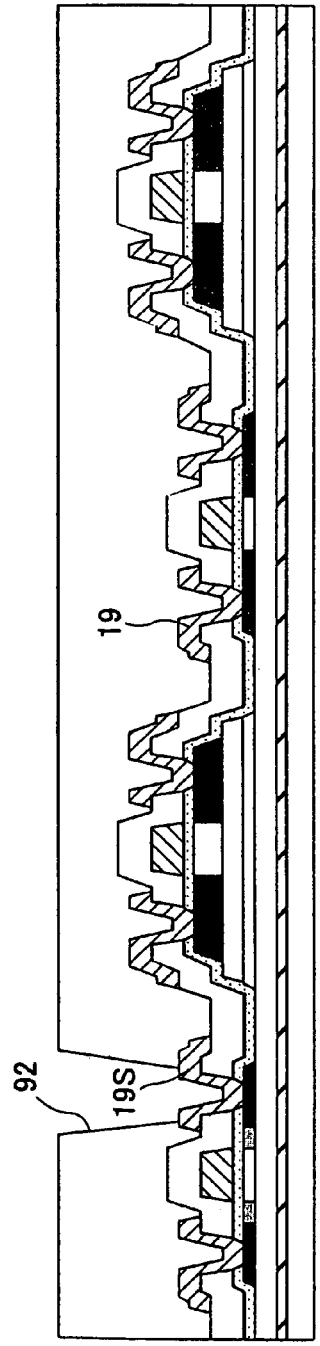
Figure 11R:
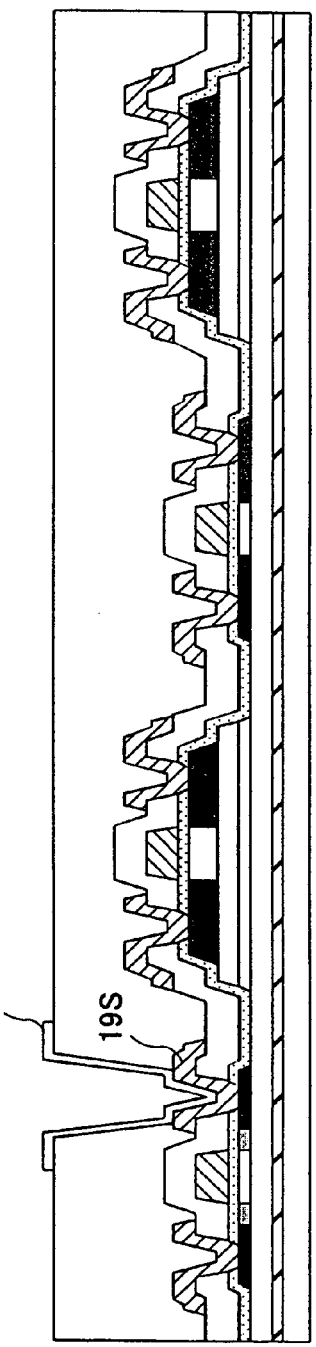

FIGS. 11A~11R illustrate processes for manufacturing a thin film transistor according to a fifth embodiment of the present invention. According to the fifth embodiment, a thin first semiconductor film is formed and an excimer laser is irradiated thereon, after which a thick second semiconductor film is formed via a SiO2 film. A CW laser is selectively irradiated on the second semiconductor formed on the high speed operation TFT regions to realize lateral crystallization. Specific processes of this manufacturing method are described below with reference to the drawings.

In FIG. 11A, a base SiN film 11, a base $SiO_2$ film 12, and a thin first semiconductor (a-Si) film 13 respectively having film thicknesses of 50 nm, 200 nm, and 40 nm are formed on a glass substrate 10 by the CVD method, and the first semiconductor film 13 is crystallized through excimer laser irradiation.

Then, in FIG. 11B, a second base $SiO_2$ film 23 and a thick second semiconductor (a-Si) film 21 respectively having film thicknesses of 100 nm and 75 nm are formed by the CVD method.

Then, in FIG. 11C, resist masks M1 are patterned on the high speed operation TFT regions, and the second semiconductor film 21 and the second base $SiO_2$ film 23 are etched and removed from regions other than the high speed TFT regions. The etching may be realized by supplying fluorine gas using an RIE apparatus, for example.

Then, in FIG. 11D, a CW laser is selectively irradiated on the high speed operation TFT regions on which the second semiconductor (a-Si) film 21 still remains, and lateral crystallization of the amorphous silicon (a-Si) film 21 is realized.

Then, in FIG. 11E, resist masks M2 are patterned onto the TFT regions, and the crystallized semiconductor (poly-Si) films 13' and 21' are etched in order to realize isolation of the TFT regions. In this way, thin semiconductor films 17a are formed at the non-high speed operation TFT regions on top of the first base $SiO_2$ film 12, and thick semiconductor films 17b are formed at the high speed operation TFT regions on top of the second base $SiO_2$ film 23.

Then, in FIG. 11F, a gate insulating film 41 and a first conductive film 42 are successively formed. For example, the gate insulating film 41 may be formed by depositing a $SiO_2$ film with a film thickness of 50 nm using the CVD method, for example, and the first conductive film 42 may be formed by depositing an Al—Nd film with a film thickness of 300 nm, thereafter.

Then, in FIG. 11G, resist patterns in the shape of gate electrodes 22 are formed on the first conductive film 42 as masks M3, and wet etching is performed on the first conductive film 42.

Then, in FIG. 11H, the gate electrodes 22 formed via the gate insulating film 41 are used as masks upon implanting P (phosphorous) ions into the semiconductor layers 17a and 17b at a low concentration level. For example, the ion implantation may be performed with an ion doping apparatus at an energy level of 40 KeV, and a dose amount of $2\times10^{13}$.

Then, in FIG. 11I, an LDD region of the n channel non-high speed operation TFT region, and the p channel TFT regions are covered by resist masks M4, and P (phosphorous) ions are implanted into the exposed portions of the semiconductor films 17a and 17b at a high concentration level. For example, the ion implantation maybe performed with an ion doping apparatus at an energy level of 40 KeV, and a dose amount of $1\times10^{15}$.

Then, in FIG. 11J, the n channel regions are covered by resist masks M5, and B (boron) ions are implanted into the semiconductor films 17a and 17b at a high concentration. For example, the ion implantation may be performed by an ion doping apparatus at an energy level of 40 KeV, and a dose amount of $1\times10^{15}$.

Then, in FIG. 11K, after the resist masks M5 are removed, an excimer laser is irradiated on the surface of the substrate to realize laser activation. In this way, the source/drain 15 and the LDD 18 are formed at the n channel non-high speed operation TFT region. The LDD structure is not formed at the n channel high speed operation TFT region and the p channel regions, and these regions simply include the source/drain 15.

Then, in FIG. 11L, an interlayer insulating film 71 containing hydrogen is formed, and hydrogenation is performed thereon through a thermal process. For example, a silicon nitrogen (SiN) film with a thickness of 370 nm may be formed by the CVD method, and an annealing process at 350° C. in a nitrogen atmosphere at atmospheric pressure may be performed for two hours. It is noted that the hydrogenation process is not limited to the above example, and other methods such as annealing in a hydrogen atmosphere, or hydrogen plasma processing may be performed. In such case, the interlayer insulating film 71 does not necessarily have to include hydrogen.

In FIG. 11M, resist patterns as masks M6 are formed, the interlayer insulating (SiN) film 71 and the gate insulating (SiO$_2$) film 41 are etched by the RIE method, and contact holes 37 that reach down to the source/drain 15 are formed.

Then, in FIG. 11N, a second conductive film 81 is formed. For example, the second conductive film 81 may be formed by spattering Ti, Al, and Ti films at film thicknesses of 50 nm, 200 nm, and 100 nm, respectively, using a spatter apparatus.

Then, in FIG. 11O, resist patterns are formed as masks M7, and the second conductive film 81 is etched to form source/drain electrodes 19. The etching of the second conductive film 81 may be performed with chlorine gas using an RIE apparatus, for example.

Then, in FIG. 11P, a second interlayer insulating film 91 is formed. The second interlayer insulating film 91 may, for example, be an organic resin film having transparency and photosensitivity.

Then, in FIG. 11Q, an opening 92 is formed at a source electrode 19S of the pixel transistor (e.g., n channel non-high speed operation TFT this example).

In FIG. 11R, a third conductive film (not shown) is deposited on the interlayer insulating film 91 and in the opening 92, after which the third conductive film is patterned into a predetermined shape to form a pixel electrode 25 that is connected to the source electrode 19S of the pixel transistor. In this way, the manufacturing of the thin film transistor is completed.

According to the manufacturing method of the fifth embodiment, a thin film transistor substrate having a circuit element that is capable of high speed operation may be manufactured in a productive manner by simply adding an amorphous silicon (a-Si) film deposition process to the conventional manufacturing method. It is noted that in the fifth embodiment, the thin polycrystalline silicon (poly-Si) film 13' that is crystallized by the excimer laser remains at the bottom of the high speed operation TFT regions; however, since these regions do not correspond to the pixel regions, problems such as the degradation of the permeability of the transistor are not likely to occur. Also, in the process illustrated by FIG. 11C, in etching the second semiconductor film 21, the etching conditions and the film thickness of the second SiO$_2$ film 23 are preferably adjusted so that damage to the crystallized first semiconductor (poly-Si) film 13' may be prevented.

FIGS. 12A~12D illustrate a variation example of the thin film transistor manufacturing method according to the fifth embodiment.

Figures 12A, 12B, 12C, 12D:
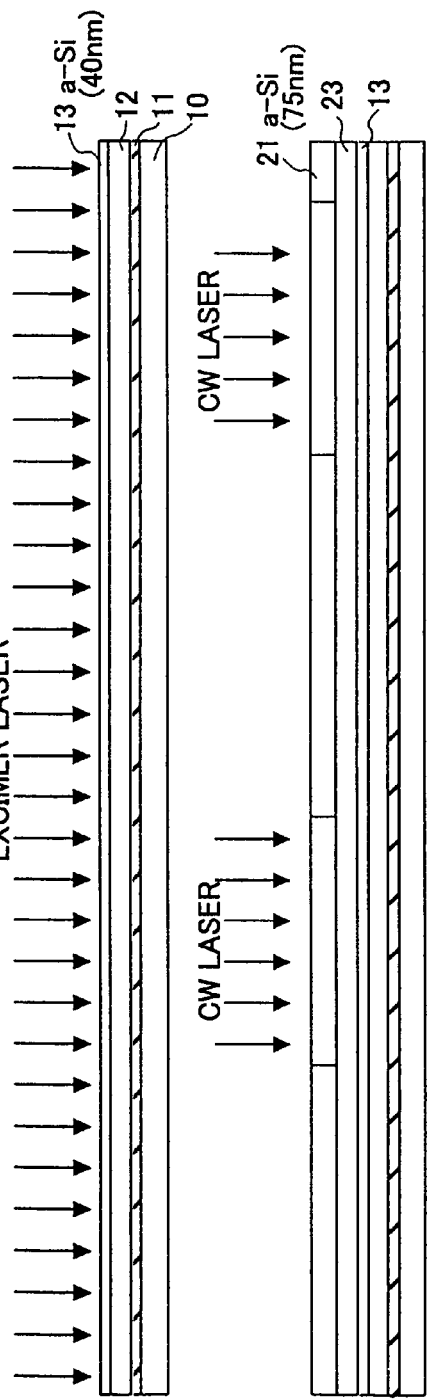
FIG. 12A~12D are diagrams illustrating thin film transistor substrate manufacturing processes according to a variation example of the fifth embodiment.

In FIG. 12A, a base SiN film 11, a base SiO$_2$ film 12, and a first thin semiconductor (a-Si) film 13 respectively having film thicknesses of 50 nm, 200 nm, and 40 nm are formed on a glass substrate 10 by the CVD method, and the first semiconductor film 13 is crystallized through excimer laser irradiation.

Then, in FIG. 12B, a second base SiO$_2$ film 23 and a second thick semiconductor (a-Si) film 21 respectively having film thicknesses of 100 nm and 75 nm are formed by the CVD method, after which a CW laser is selectively irradiated on the high speed operation TFT regions to realize lateral crystallization of the irradiated portions of the amorphous silicon (a-Si) film 21.

Then, in FIG. 12C, resist pattern masks M1 are placed on the high speed operation TFT regions, and the second semiconductor film 21 and the second base SiO$_2$ film 23 are etched and removed. The etching may be realized by fluorine gas using an RIE apparatus, for example. In this way, the first thin semiconductor (poly-Si) film 13' is exposed.

Then, in FIG. 12D, resist pattern masks M2 are placed on the TFT regions, and the crystallized semiconductor (poly-Si) films 13' and 21' are etched in order to realize isolation of the TFT regions. In this way, thin semiconductor films 17a are formed at the non-high speed operation TFT regions on top of the first base SiO$_2$ film 12, and thick semiconductor films 17b are formed at the high speed operation TFT regions on top of the second base SiO$_2$ film 23.

The ensuing processes for manufacturing the thin film transistor substrate according to the present variation example are identical to those of the fifth embodiment as illustrated in the diagrams of FIG. 11F and onward. According to the present variation example, a thin film transistor substrate having a circuit element that is capable of high speed operation may be manufactured in a productive manner by simply adding an amorphous silicon (a-Si) film deposition process to the conventional manufacturing method.

Also, according to the present variation example, since the CW laser is selectively irradiated on a solid a-Si film corresponding to the second semiconductor film, a photo process and an etching process may be omitted from the processes of the fifth embodiment. In such case, the laser beam of the CW laser is preferably adjusted with due consideration to lateral crystallization margins.

(Embodiment 6)

FIGS. 13A~13K illustrate processes for manufacturing a thin film transistor according to a sixth embodiment of the present invention. According to the sixth embodiment, a first thick semiconductor film is formed, after which a second thin semiconductor film is formed via an insulating film. Then, an excimer laser is irradiated on the solid second semiconductor film surface to crystallize the second semiconductor film. Then, patterning of the TFT regions is conducted to expose the first semiconductor film portions of the high speed operation TFT regions. A CW laser is then irradiated on the exposed first semiconductor film portions to realize lateral crystallization thereof. In the following, specific processes of the manufacturing method are described with reference to the drawings.

First, in FIG. 13A, a base SiN film 11, a base SiO$_2$ film 12, a first semiconductor (a-Si) film 13, a protective SiO$_2$ film 14, and a second semiconductor (a-Si) film 21 are successively formed on a glass substrate 10. For example, the base SiN film 11, the base SiO$_2$ film 12, the first semiconductor (a-Si) film 13, the protective SiO$_2$ film 14, and the second semiconductor (a-Si) film 21 respectively having film thicknesses of 50 nm, 200 nm, 75 nm, 20 nm, and 40 nm may be deposited using the CVD method. After the film deposition process, the second semiconductor film 21 may be crystallized through excimer laser irradiation.

Then, in FIG. 13B, resist patterns are placed in the TFT regions, and using the resist patterns as masks M1, the crystallized second semiconductor (poly-Si) film 21', the protective $SiO_2$ film 14, and the first semiconductor (a-Si) film 13 are etched and removed. The etching may be realized by fluorine gas using an RIE apparatus, for example.

Then, in FIG. 13C, resist masks M2 are used to etch and remove the crystallized second semiconductor (poly-Si) film 21' and the protective $SiO_2$ film 14 from the high speed operation TFT regions by applying fluorine gas using the RIE apparatus. In this way, the first thick semiconductor film 13 is exposed at the high speed operation TFT regions.

Then, in FIG. 13D, a CW laser is selectively irradiated on the first semiconductor (a-Si) film 13 at the high speed operation TFT regions, and lateral crystallization of the amorphous silicon (a-Si) film 13 is realized.

Figure 13E:
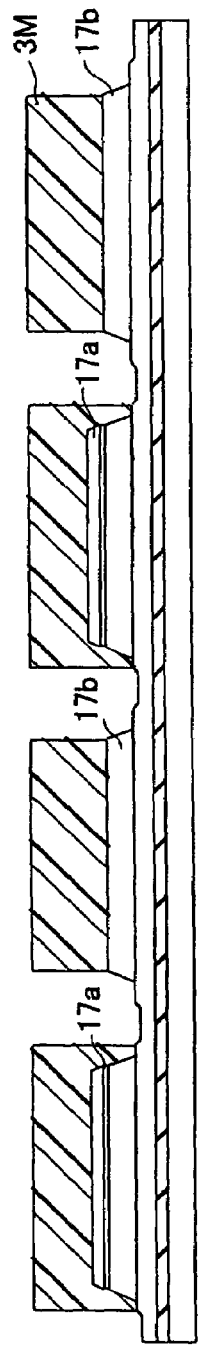

Then, in FIG. 13E, resist masks M3 are formed, and the crystallized semiconductor (poly-Si) films 13' and 21' are etched to realize isolation.

Figure 13F:
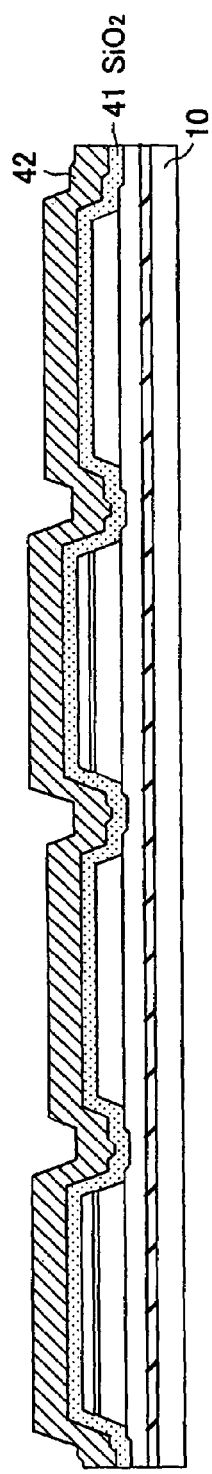

Then, in FIG. 13F, agate insulating film 41 and a first conductive film 42 are formed over the surface of the substrate. For example, the gate insulating film 41 may be formed by depositing a $SiO_2$ film with a thickness of 50 nm using a CVD apparatus , and the first conductive film 42 maybe formed by spattering an Al-Nd film with a thickness of 300 nm using a spatter apparatus.

Figure 13G:
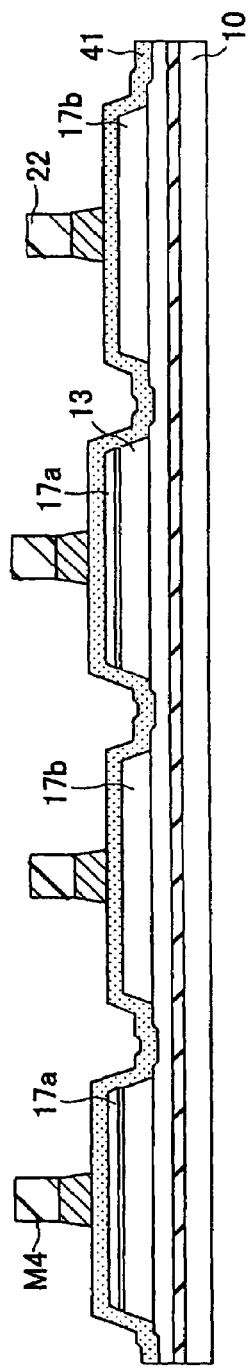

Then, in FIG. 13G, resists are patterned into shapes of gate electrodes 22, and the resists are used as masks M4 to conduct wet etching of the first conductive film 42. In this way, the gate electrodes 22 are formed.

Figure 13H:
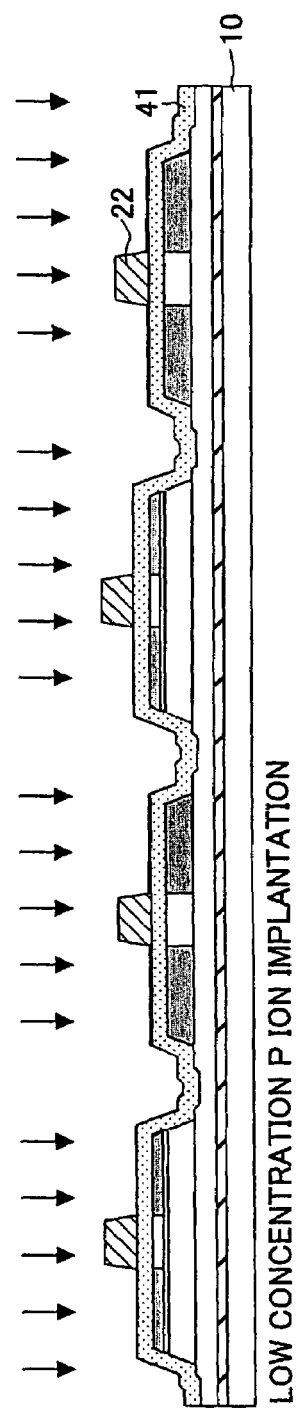

Then, in FIG. 13H, the resist masks M4 are removed, and the gate electrodes are used as masks to implant P (phosphorous) ions into the semiconductor substrates 13' and 21' at a low concentration. The P ion implantation may be conducted at an energy level of 40 KeV and at a dose amount of $2\times10^{13}$ using an ion doping apparatus, for example.

Figure 13I:
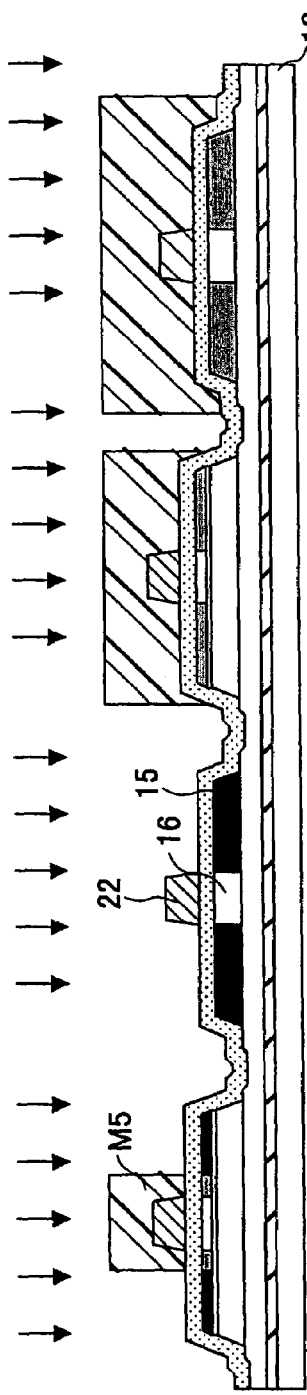

Then, in FIG. 13I, an LDD region of the n channel non-high speed operation TFT region and the p channel TFT regions are covered by resist masks M5, and P (phosphorous) ions are implanted into the exposed semiconductor film portions 17a and 17b at a high concentration. The P ion implantation at a high concentration may be conducted at an energy level of 40 KeV, and a dose amount of $1\times10^{15}$ using an ion doping apparatus, for example.

Figure 13J:
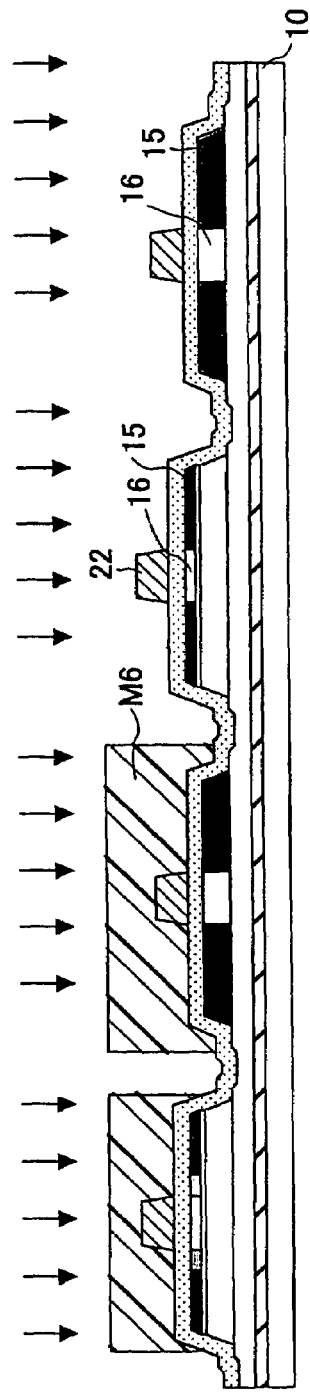

Then, in FIG. 13J, the n channel TFT regions are covered by resist masks M6, and B (boron) ions are implanted at a high concentration into the semiconductor films of the P channel regions. The ion implantation may be conductred at an energy level of 40 KeV, and a dose amount of $1\times10^{15}$ using an ion doping apparatus, for example.

Figure 13K:
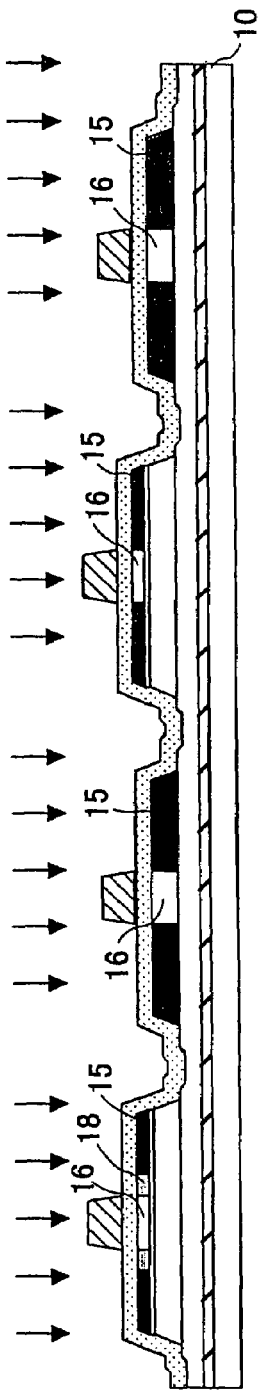

Then, in FIG. 13K, the resist masks M6 are removed and an excimer laser is irradiated on the surface of the substrate to realize laser activation. In this way, LLD 18 and source/drain 15 are formed on the active layer of then channel non-high speed operation TFT, while the active layers of the other TFTs that do not have the LDD configuration simply have the source/drain 15 formed thereon.

The ensuing processes according to the present embodiment are identical to those of the first embodiment described with reference to FIGS. 4N~4T, and thereby their descriptions and corresponding drawings are omitted.

According to the method of the present embodiment, a thin film transistor substrate having a circuit element that is capable of high speed operation may be manufactured in a productive manner by simply adding each of an amorphous silicon (a-Si) film deposition process, a photo process, and an etching process to the conventional manufacturing method. Also, in the method according to the sixth embodiment, the thick a-Si film 13 remains on the bottom surface of the non-high speed operation TFT, functioning as a light blocking film to reduce off time leak current. Also, in the process step illustrated by FIG. 13C, the characteristics of the TFT may be prevented from degradation even when dry etching is performed on the protective $SiO_2$ film 14 formed on the first semiconductor (a-Si) film 13 of the high speed operation TFT regions since lateral crystallization is realized through CW laser irradiation thereafter.

(Embodiment 7)

FIGS. 14A~14E are diagrams illustrating a method of manufacturing a thin film transistor substrate according to a seventh embodiment of the present invention. According to the seventh embodiment, a first thick semiconductor film is formed and a CW laser is selectively irradiated to realize lateral crystallization of the high speed operation TFT regions. Then, a second thin semiconductor film is formed on the surface of the substrate, after which excimer laser irradiation is performed to realize crystallization of this film. Then, pattering and isolation of the TFT regions is realized, and the laterally crystallized first semiconductor film is exposed. In the following, detailed descriptions of the manufacturing processes are given.

In FIG. 14A, a base SiN film 11, a base $SiO_2$ film 12, and a first semiconductor (a-Si) film 13 respectively having thicknesses of 50 nm, 200 nm, and 75 nm are formed on a glass substrate 10 by the CVD method, and a CW laser is selectively irradiated to realize lateral crystallization of the amorphous silicon film formed on the high speed operation TFT regions.

Then, in FIG. 14B, a second base $SiO_2$ film 23 and a thin second semiconductor (a-Si) film 21 respectively having film thicknesses of 20 nm and 40 nm are formed on the substrate surface.

Then, in FIG. 14C, the second semiconductor film 21 is crystallized through excimer laser irradiation.

Then, in FIG. 14D, resist patterns as masks M1 are used to separate the TFT regions, and portions of the second semiconductor film 21', the second base $SiO_2$ film 23, and the first semiconductor film 13 are etched and removed using fluorine gas via the RIE method.

Then, in FIG. 14E, the second semiconductor film 21', and the second base $SiO_2$ film 23 formed on the high speed operation TFT regions are etched and removed. For example, resist masks M2 may be used to etch the second semiconductor film 21' with fluorine gas using an RIE apparatus, and the second base $SiO_2$ film 23 may be etched with diluted hydrofluoric acid.

According to the method of the seventh embodiment, a CW laser is irradiated on a solid amorphous silicon (a-Si) film corresponding to the first semiconductor film 13. Thus, a photo process and an etching process may be further reduced from the processes of the sixth embodiment. Upon irradiating the CW laser onto the solid amorphous silicon film, the beam is preferably adjusted with due consideration to the lateral crystallization margins. Also, the film thickness of the second base $SiO_2$ film 23 and the etching conditions are preferably adjusted so that the laterally crystallized first semiconductor film 13' may be protected from being damaged when it is exposed.

(Embodiment 8)

In the following, a manufacturing method according to an eighth embodiment is described. According to the eighth embodiment, the active layers (semiconductor layers) of the high speed operation TFT regions and the non-high speed operation TFT regions are arranged to have the same film thicknesses; however, the active layers are crystallized according to different crystallization methods so that their average crystal grain diameters may differ. Also, the gate insulating films of the TFT regions are arranged to have differing thicknesses. Details of the processes according to the eighth embodiment are described below with reference to FIGS. 15A–15M.

In FIG. 15A, a base SiN film 11, a base $SiO_2$ film 12, and a first amorphous semiconductor (a-Si) film 13 respectively having thicknesses of 50 nm, 200 nm, and 50 nm are formed on a glass substrate 10 through the CVD method, and an excimer laser is irradiated to crystallize the first semiconductor film (a-Si) 13.

In FIG. 15B, resist patterning of the thin film transistor (TFT) regions is conducted and the resist patterns are used as masks M1 in etching the crystallized semiconductor (poly-Si) film 13'. The etching may be realized by supplying fluorine gas using an RIE apparatus, for example.

In FIG. 15C, a $SiO_2$ film with a film thickness of 80 nm as a first gate insulating layer 41 is formed on the substrate surface using the CVD method.

Then, in FIG. 15D, regions including at least the LDD and the channel regions of the non-high speed operation TFT regions are covered by resist patterns that are used as masks M2 to etch and remove the first gate insulating film 41. The etching may be realized by fluorine gas using the RIE method, for example. In this way, first gate insulating films 45 are left on the semiconductor films 13' of the non-high speed operation TFT regions.

Then, in FIG. 15E, a CW laser is selectively irradiated on the semiconductor film 13' of the high speed operation TFT regions to realize lateral crystallization of the irradiated regions.

Figure 15F:
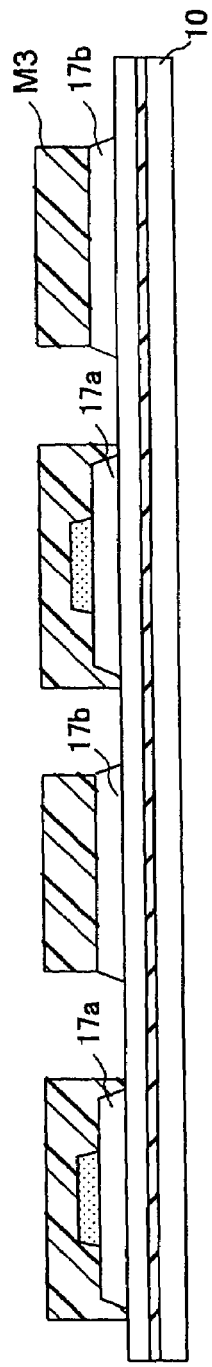

Then, in FIG. 15F, resist patterns as masks M3 are used in etching and isolating the semiconductor (poly-Si) films 13' and 13". In this way, semiconductor films 17a with an average crystal grain diameter below 1 μm are formed on the non-high speed operation TFT regions through excimer laser irradiation, and semiconductor films 17b with an average crystal grain diameter of 1 μm or above is formed on the high speed operation TFT regions through lateral crystallization by CW laser iarradiation.

Figure 15G:
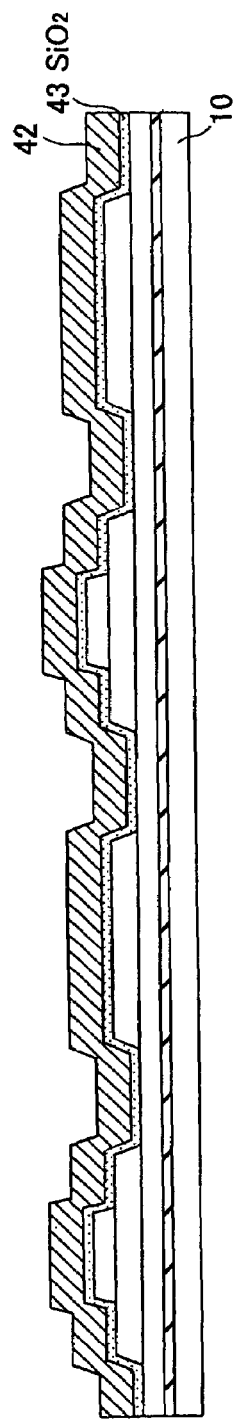

Then, in FIG. 15G, a second gate insulating film ($SiO_2$ film) 43 and a first conductive film (Al—Nd film) 42 are successively formed on the substrate surface. For example, the $SiO_2$ film 43 may be formed with a film thickness of 30 nm using a CVD apparatus, and the Al-Nd film 42 may be formed with a film thickness of 300 nm using a spattering apparatus.

Figure 15H:
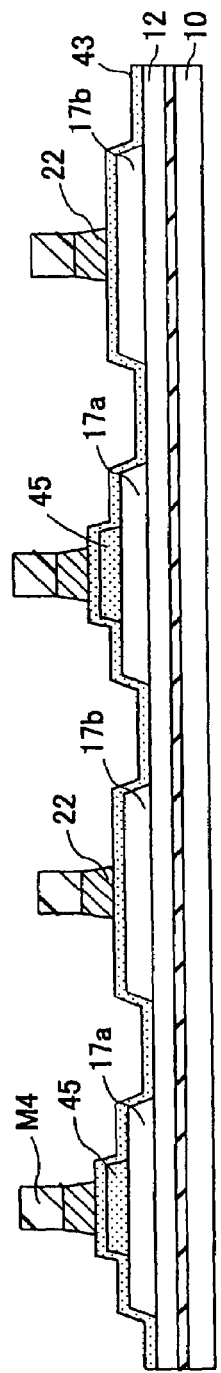

Then, in FIG. 15H, resists are patterned into shapes of gate electrodes 22, and the resists are used as masks M4 in conducting wet etching of the first conductive film 42 to form the gate electrodes 22.

Figure 15I:
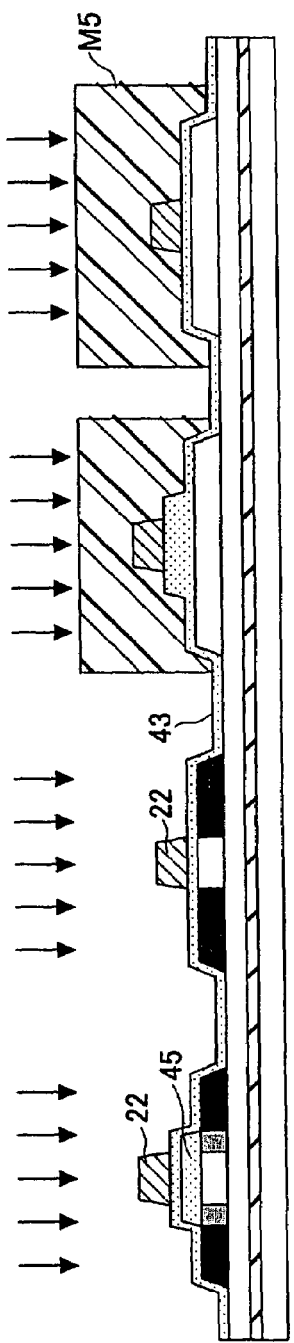

Then, in FIG. 15I, the p channel regions are covered by resist masks M5, and the gate electrodes 22 are used as masks upon implanting P (phosphorous) ions into the exposed semiconductor film portions. For example, P ions may be implanted using an ion doping apparatus at an energy level of 40 KeV and a dose amount of $1 \times 10^{15}$, and at an energy level of 90 KeV and a dose amount of $3 \times 10^{13}$.

Then, in FIG. 15J, the n channel regions are covered by resist masks M6, and B (boron) ions are implanted into the exposed portions of the semiconductor film. For example, the B ions may be implanted using an ion doping apparatus at an energy level of 40 KeV and a dose amount of $1 \times 10^{15}$, and at an energy level of 70 KeV and a dose amount of $2 \times 10^{14}$.

Then, in FIG. 15K, the resist masks M6 are removed, and an excimer laser is irradiated on the surface of the substrate to realize laser activation. In this way, the first gate insulating film 45 establishes a border between the LDD 18 and the source/drain 15 at the active layers of the non-high speed operation TFT regions. Portions of the active layers that are positioned directly below the gate electrodes 22 correspond to channel regions 16.

Then, in FIG. 15L, an interlayer insulating film 71 including hydrogen is formed, and hydrogenation is realized by a thermal annealing process. For example, after forming the SiN film with a film thickness of 370 nm using a CVD apparatus, annealing may be performed for two hours at 350° C. in a nitrogen atmosphere at atmospheric pressure to realize hydrogenation.

Then, in FIG. 15M, resists are formed as masks M7, and the interlayer insulating film 71 and the second gate insulating film 43 are etched using the RIE method. In this way, contact holes 37 reaching down to the source/drain 15 are formed.

The ensuing processes are identical to those of the first embodiment as illustrated by the diagrams of FIG. 4P and onward, and their descriptions are omitted.

According to the present method, a thin film transistor substrate having a circuit element that is capable of high speed operation may be manufactured in a productive manner by simply adding a gate $SiO_2$ film deposition process to the conventional manufacturing method. Also, by arranging the film of the gate insulating film of the high speed operation TFTs to be thinner compared to the conventional art, the drive voltage of the high speed operation TFTs may be set lower and the pressure resistance of the TFTs may be enhanced. Further, in the process step illustrated by FIG. 15D, even when dry etching is conducted to remove the first gate insulating film 41 from regions other than the non-high speed operation TFT regions, the semiconductor film portions exposed at the high speed operation TFT regions may be protected from characteristic degradation since lateral crystallization is realized through CW laser irradiation.

FIGS. 16A–16E illustrate a variation example of thin film transistor manufacturing method according to the eighth embodiment.

In FIG. 16A, a base SiN film 11, a base $SiO_2$ film 12, and a semiconductor (a-Si) film 13 respectively having thicknesses of 50 nm, 200 nm, and 50 nm are formed on a glass substrate 10 through the CVD method, and an excimer laser is irradiated on the substrate surface to crystallize the semiconductor film (a-Si) 13.

Then, in FIG. 16B, a CW laser is, selectively irradiated on the high speed operation TFT regions, so that lateral crystallization irradiated portions of the semiconductor film 13 are realized.

Then, in FIG. 16C, resists are patterned to divide the TFT regions, and the resists are used as masks in etching the crystallized semiconductor film 13'. The etching may be realized by fluorine gas using the RIE method, for example. In this way, semiconductor films 17a and 17b having the same film thickness but differing average crystal grain diameters are formed on the non-high speed operation TFT regions and the high speed operation TFT regions, respectively.

Then, in FIG. 16D, a first gate insulating film 41 is formed to cover the substrate surface. The first gate insulating film 41 may correspond to a $SiO_2$ film with a film thickness of 80 nm that is formed by the CVD method.

Then, in FIG. 16E, regions including at least the LLD and channel regions of the non high speed operation TFT regions are covered by resist patterns that are used as masks M2 to etch the first gate insulating film 41. The etching may be realized by supplying fluorine gas using an RIE apparatus, for example. In this way, first gate insulating films 45 are left on the semiconductor films 17a of the non-high speed operation TFT regions.

The ensuing processes are identical to those of the eighth embodiment that are illustrated in diagrams of FIG. 15G and onward. According to this variation example, since a CW laser is irradiated on a solid a-Si film 13, each of a photo process and an etching process may be omitted from the processes according to the eighth embodiment. It is noted that in irradiating the CW laser on a solid a-Si film, the laser beam is preferably adjusted with due consideration to lateral crystallization margins. Also, upon etching the first gate insulating film 41, the etching conditions are adjusted to prevent damage to the crystallized semiconductor film.

(Embodiment 9)

In the following, a thin film manufacturing method according to a ninth embodiment is described. According to this embodiment, the active layers (semiconductor films) of the high speed operation TFT regions and the non-high speed operation TFT regions are arranged to have differing film thicknesses, and differing laser irradiation methods are implemented so as to obtain differing average crystal grain diameters. The gate insulating films of the TFT regions are also arranged to have differing film thicknesses. Details of the processes according to the present embodiment are described below with reference to FIGS. 17A–17P.

Figure 17A:
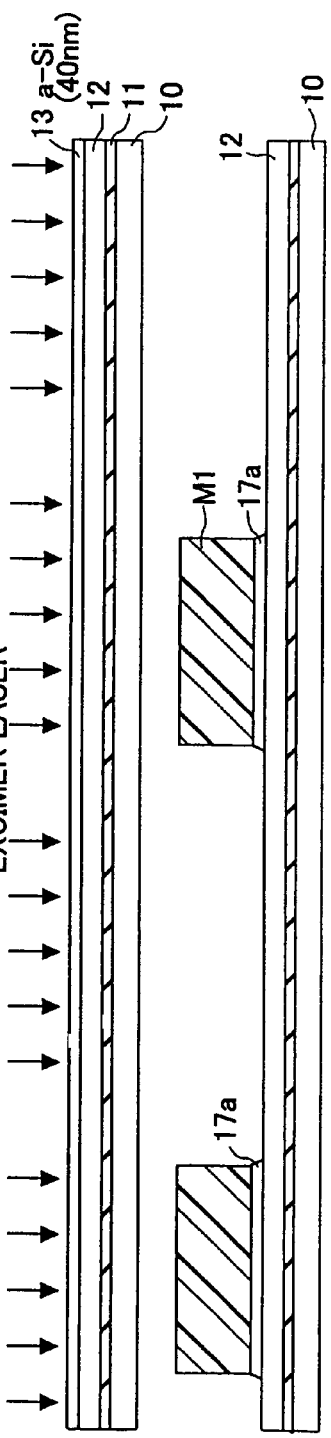
FIGS. 17A~17P are diagrams illustrating thin film transistor substrate manufacturing processes according to a ninth embodiment of the present invention.

In FIG. 17A, a base SiN film 11, a base $SiO_2$ film 12, and a first semiconductor (a-Si) film 13 respectively having thicknesses of 50 nm, 200 nm, and 40 nm are formed on a glass substrate 10 by the CVD method, and an excimer laser is irradiated on the substrate surface to crystallize the first semiconductor film (a-Si) 13.

Figure 17B:
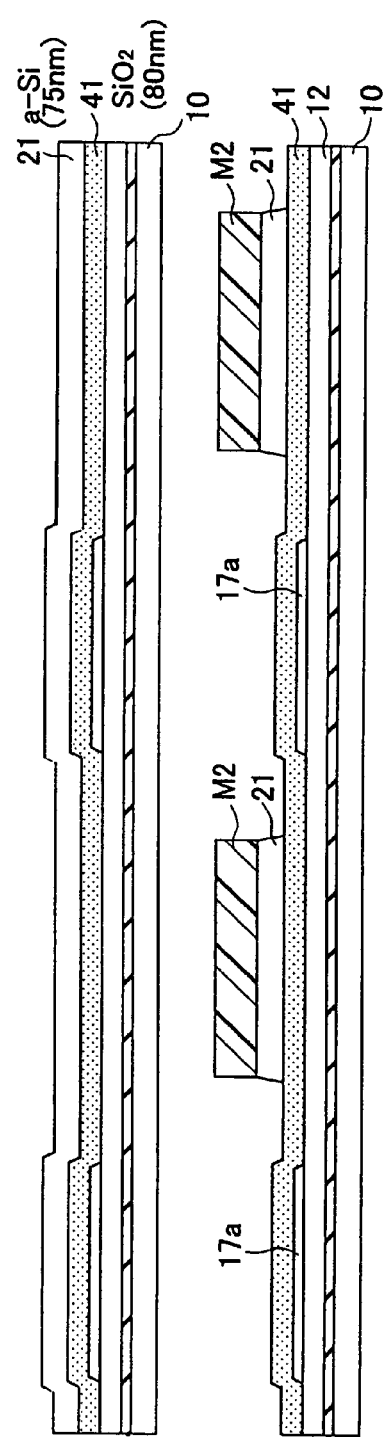

Then, in FIG. 17B, resists are patterned on the non-high speed operation TFT regions, and the resists are used as masks M1 to etch and remove the first semiconductor film from regions other than the non-high speed operation TFT regions. The etching may be realized by fluorine gas using an RIE apparatus, for example.

Figure 17C:
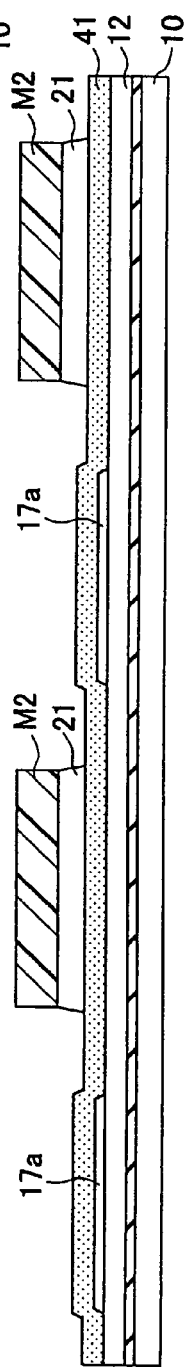

Then, in FIG. 17C, a first gate insulating ($SiO_2$) film 41 and a second semiconductor ($SiO_2$) film 21 are successively formed on the substrate surface. For example, the $SiO_2$ film 41 and the a-Si film 42 may be formed according to the CVD method to have film thicknesses of 80 nm and 75 nm, respectively.

Figure 17D:
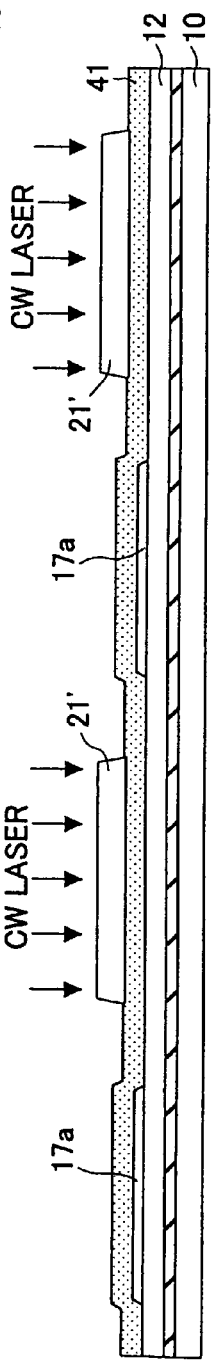

Then, in FIG. 17D, the high speed operation TFT regions are covered by resist patterns that are used as masks M2 in etching the second semiconductor film 21. The etching may be realized by fluorine gas using an RIE apparatus, for example. In this way, the second semiconductor film 21 remains at the high speed operation TFT regions.

Figure 17E:
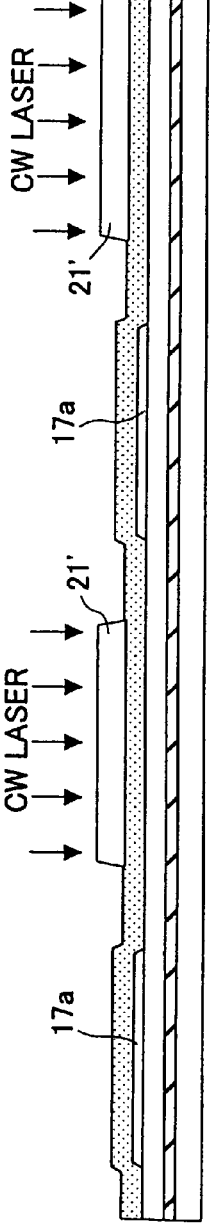

Then, in FIG. 17E, a CW laser is selectively irradiated on the second semiconductor film 21 portions at the high speed operation TFT regions to realize lateral crystallization of the irradiated portions.

Figure 17F:
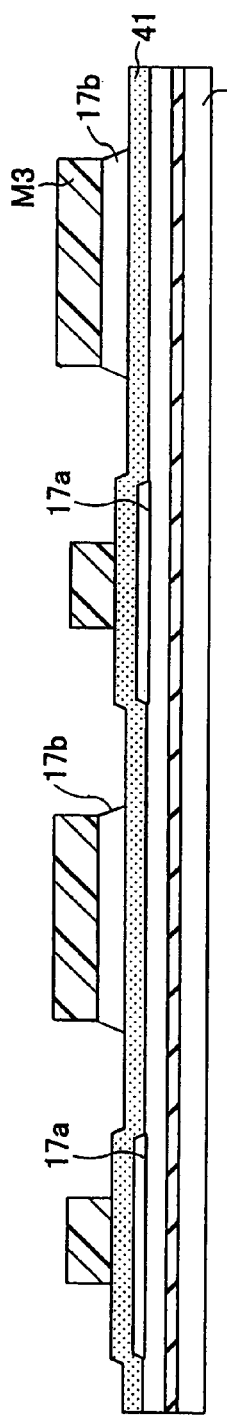

Then, in FIG. 17F, resist masks M3 are formed to cover predetermined portions of the high speed operation TFT regions and non-high speed operation TFT regions, and the crystallized second semiconductor film 21' is etched and removed. The etching may be realized by fluorine gas using the RIE method, for example. In this way, isolation is realized, and a thick semiconductor film 17b remains on the high speed operation TFT regions.

Figure 17G:
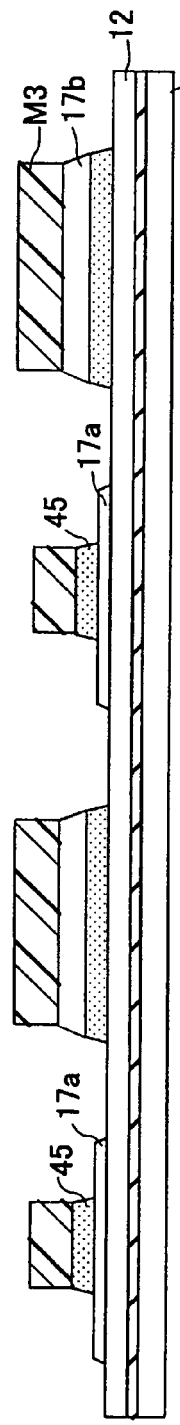

Then, as is shown in FIG. 17G, the resist masks M3 are used to etch the first gate insulating film 41 with fluorine gas using the RIE method. In this way, the first gate insulating film 41 is shaped to cover regions including the channel and LDD regions of the thin semiconductor films 17a of the non-high speed operation TFT regions.

Figure 17H:
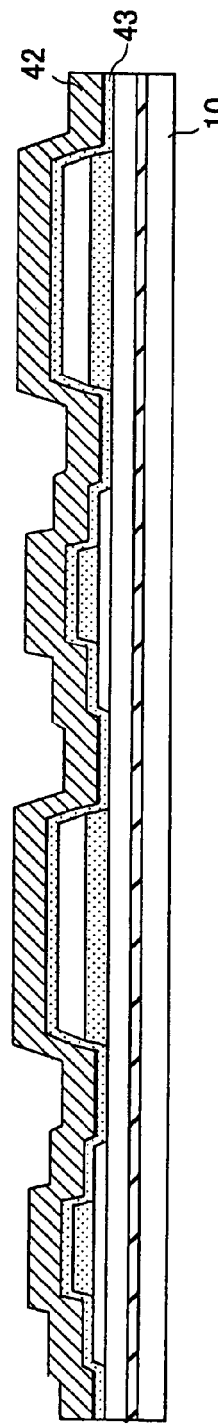

Then, in FIG. 17H, a second gate insulating film 43 and a first conductive film 42 are successively formed on the substrate surface. For example, a $SiO_2$ film with a thickness of 30 nm is deposited using a CVD apparatus to form the second gate insulating film 43, and an Al—Nd film with a thickness of 300 nm is spattered using a spattering apparatus to form the first conductive film 43.

Figure 17I:
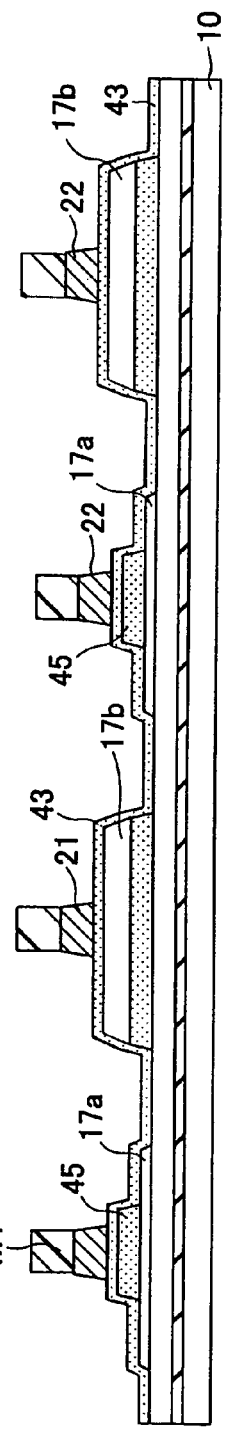

Then, in FIG. 17I, resists are pattered into shapes of gate electrodes 22, and the resists are used as masks M4 to conduct wet etching on the first conductive film 43 to thereby form the gate electrodes 22.

Then, in FIG. 17J, the p channel TFT regions are covered by resist masks M5, and P (phosphorous) ions are implanted into the semiconductor films of the n channel TFT regions. For example, the P ions may be implanted using an ion doping apparatus at an energy level of 40 KeV and a dose amount of $1\times10^{15}$, and at an energy level of 90 KeV and a dose amount of $2\times10^{13}$.

Then, in FIG. 17K, the n channel TFT regions are covered by resist masks M6, and B (boron) ions are implanted into the semiconductor film portions of the p channel TFT regions. For example, the B ions may be implanted using an ion doping apparatus at an energy level of 40 KeV and a dose amount of $1\times10^{15}$, and at an energy level of 70 KeV and a dose amount of $2\times10^{14}$.

Then, in FIG. 17L, the resist masks M6 are removed, after which an excimer laser is irradiated on the substrate surface to realize laser activation. In this way, the source/drain 15 and LDD 18 are formed at the active layers of the non-high speed operation TFT regions having thick gate insulating films. As for the active layers of the high speed operation TFT regions having thin gate insulating films, a simple source/drain structure is formed.

Figure 17M:
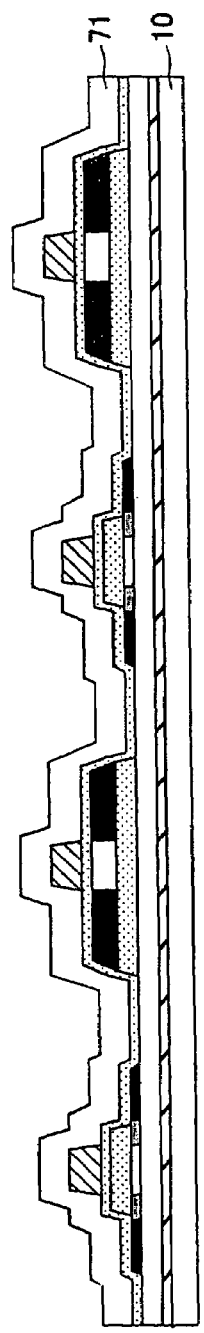

Then, in FIG. 17M, the interlayer insulating film 71 including hydrogen is formed, and hydrogenation thereof is realized through thermal processing. For example, a SiN film with a thickness of 370 nm may be formed using a CVD apparatus, and a thermal annealing process at 350° C. in a nitrogen atmosphere at atmospheric pressure may be performed for two hours. The hydrogenation process may be realized through other methods such as annealing in a hydrogen atmosphere or hydrogen plasma processing, and in cases where such processes are performed, the interlayer insulating film 71 does not necessarily have to include hydrogen.

Figure 17N:
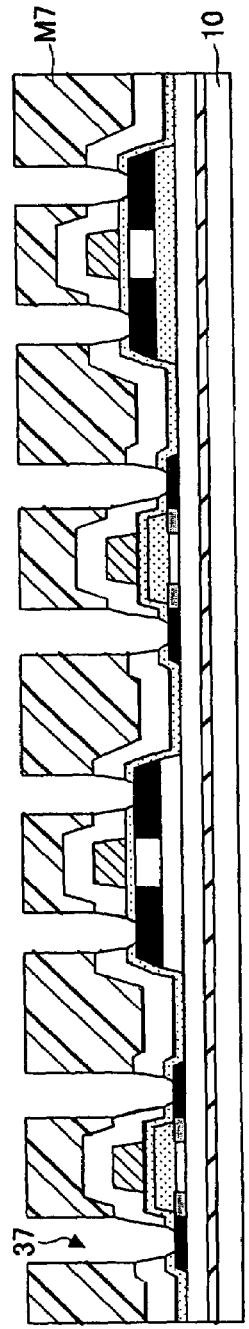

Then, in FIG. 17N, resist masks M7 are formed, and the interlayer insulating film 71 and the second gate insulating film 43 are etched using the RIE method. In this way, contact holes 37 reaching down to the source/drain 15 are formed.

Figure 17O:
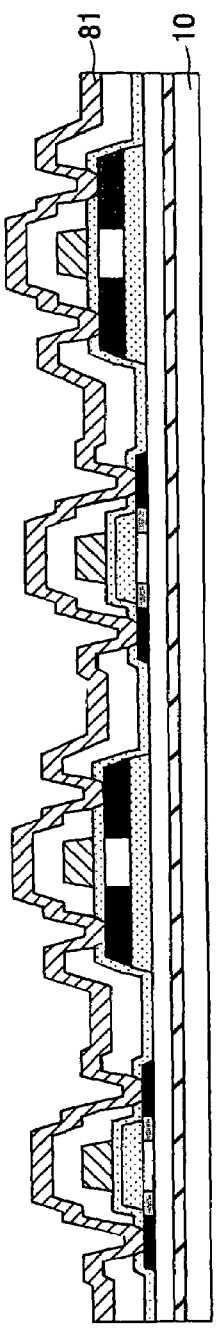

Then, in FIG. 17O, the resist masks M7 are removed, and a second conductive film 81 is formed on the substrate surface. The second conductive film 81 may be formed by spattering Ti/Al/Ti films respectively having thicknesses of 50 nm/200 nm/100 nm using a spattering apparatus.

Figure 17P:
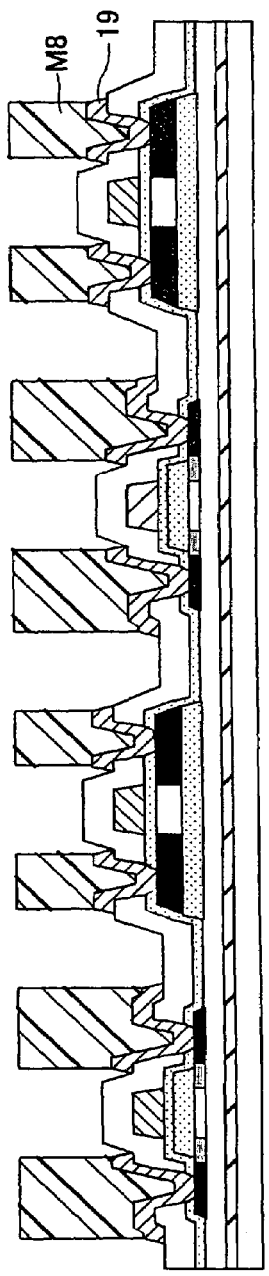

Then, in FIG. 17P, resist masks M8 are used in etching the second conductive film 81 to form source/drain electrodes 19. The second conductive film 81 may be etched by chlorine gas using an RIE apparatus.

The ensuing processes are identical to those of the first embodiment as illustrated by the diagrams of FIG. 4R and onward. Thereby their descriptions are omitted.

According to the ninth embodiment, a thin film transistor substrate having a circuit element that is capable of high speed operation may be manufactured in a productive manner by simply adding each of an amorphous silicon (a-Si) film deposition process, a gate $SiO_2$ film deposition process, a photo process, and an etching process to the conventional manufacturing method. Also, since the gate insulating film of the high speed operation TFT may be made thinner, the drive voltage of the TFT may be lowered. As a result, pressure resistance may be enhanced. It is noted that the film thickness of the first gate insulating film 41 and the etching conditions are preferably adjusted so that the crystallized first semiconductor (poly-Si) film may be protected from damage in the dry etching process.

Figure 18F:
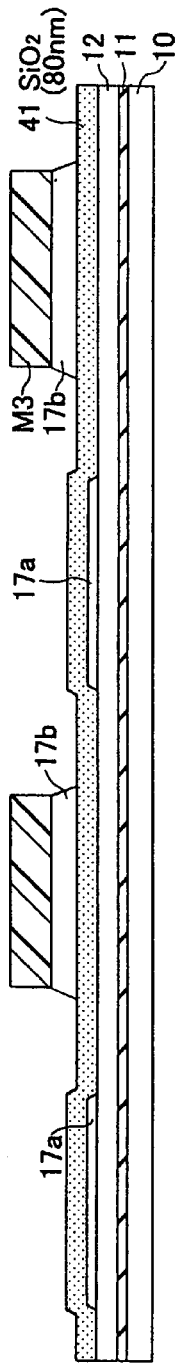
FIGS. 18A~18P are diagrams illustrating thin film transistor substrate manufacturing processes according to a first variation example of the ninth embodiment.
Figure 18G:
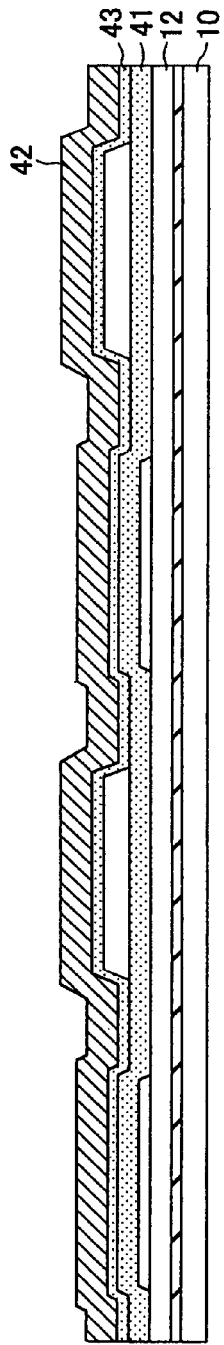
Figure 18H:
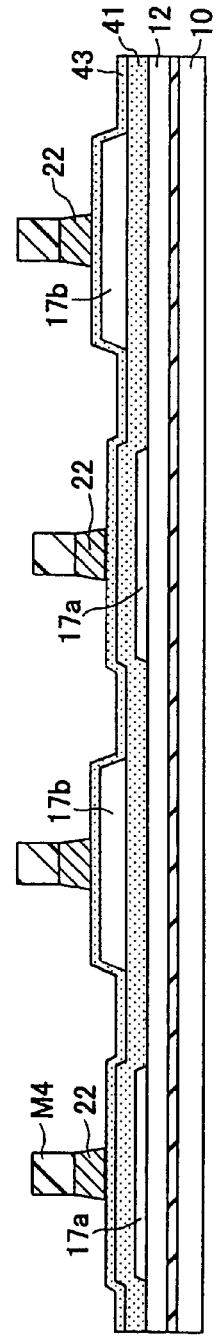
Figure 18I:
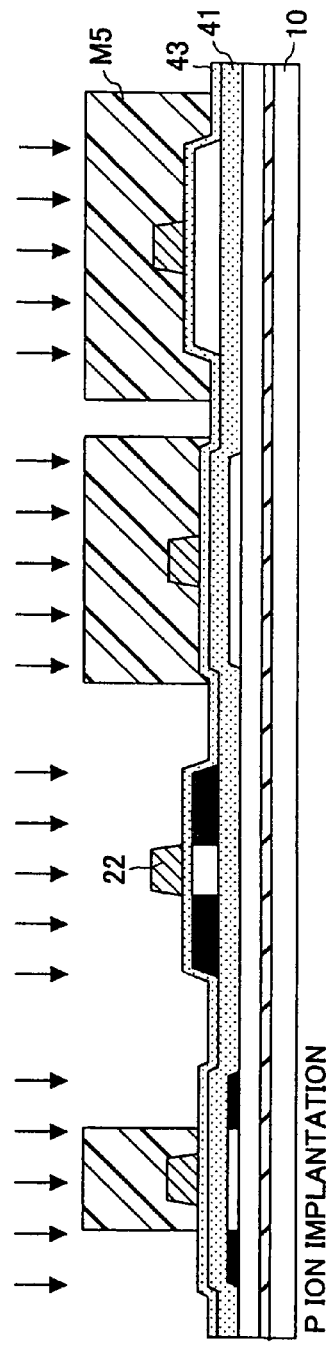
Figure 18J:
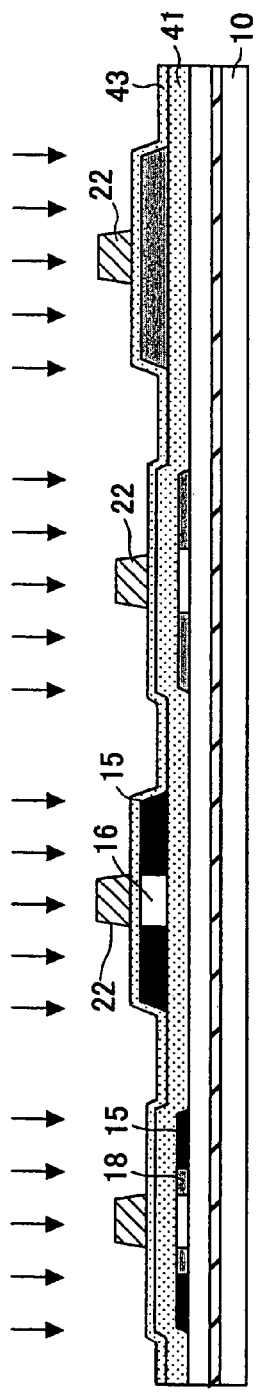
Figure 18K:
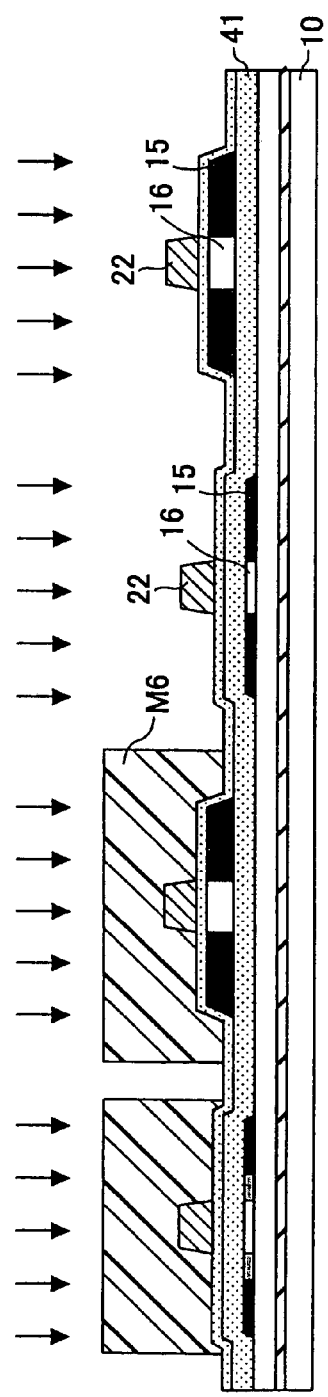
Figure 18L:
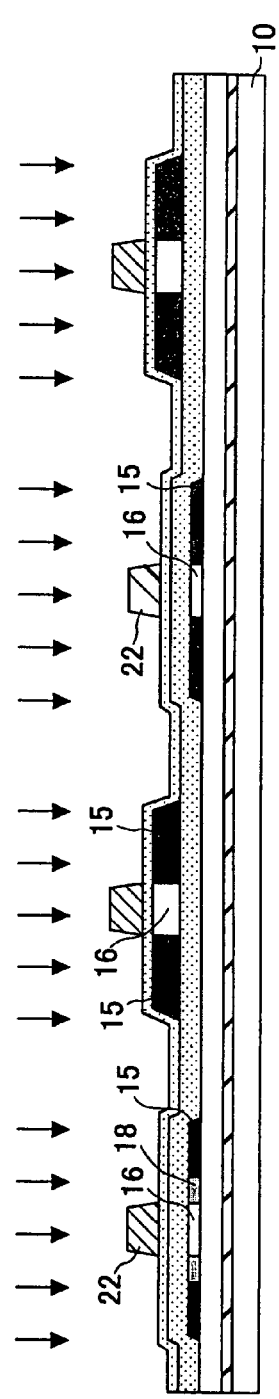
Figure 18M:
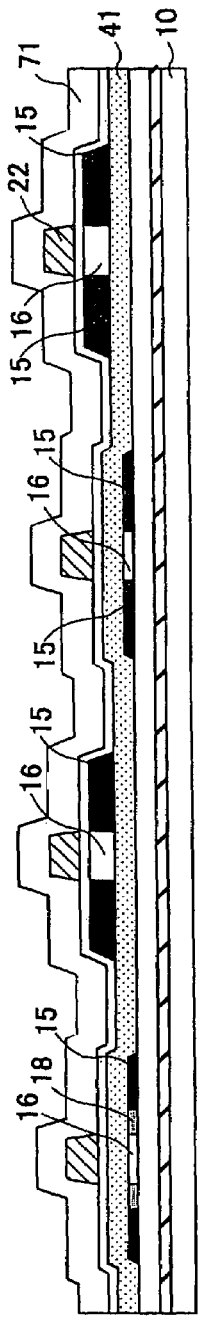
Figure 18N:
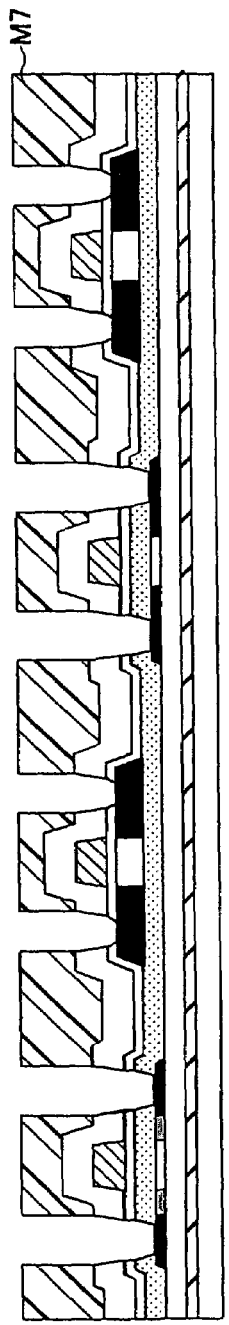
Figure 18O:
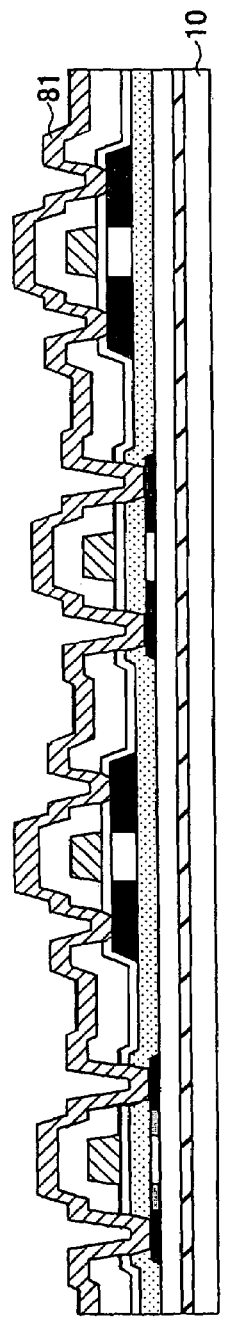
Figure 18P:
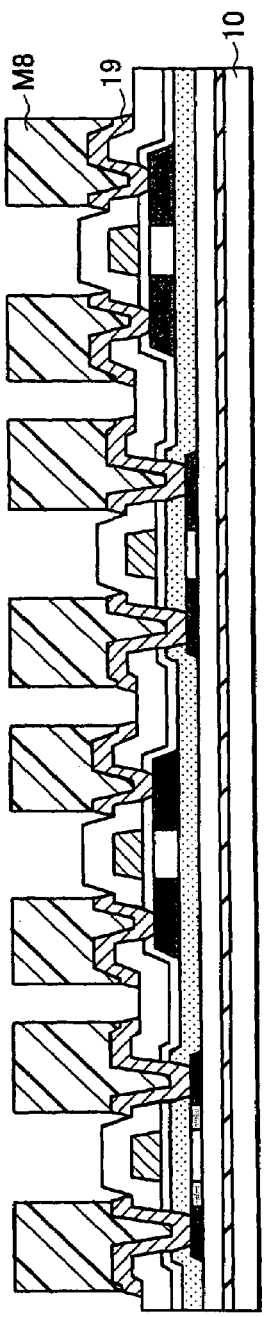

FIGS. 18A~18P illustrate a first variation example of the manufacturing method according to the ninth embodiment. It is noted that the initial processes of the present example, of crystallizing the first semiconductor film through excimer laser irradiation and crystallizing the second semiconductor film formed via the thick first gate insulating film through selective irradiation the CW laser, are identical to those illustrated in FIGS. 17A~17E. In the following, the ensuing processes according to the present example are described.

In FIG. 18F, resist masks M3 are formed at predetermined portions of the high speed operation TFT regions, and the crystallized second semiconductor film is etched by the RIE method to realize isolation. The etching may be conducted with fluorine gas, for example.

Then, in FIG. 18G, the second gate insulting film 43 and the first conductive film 42 are successively formed. For example, a $SiO_2$ film with a thickness of 30 nm may be formed using a CVD apparatus, and an Al—Nd film with a thickness of 300 nm may be formed thereafter using a spattering apparatus.

Then, in FIG. 18H, resists are patterned into shapes of gate electrodes 22, and the resists are used as masks M4 to conduct wet etching of the first conductive film 42. In this way, the gate electrodes 22 are formed.

Then, in FIG. 18I, the LLD region of the n channel TFT, and the p channel TFT regions are covered by resist masks M5, and P ions are implanted into the semiconductor film at the exposed regions. The P ions may be implanted using an ion doping apparatus at an energy level of 40 KeV and a dose amount of $1\times10^{15}$, and at an energy level of 90 KeV, and a dose amount of $1\times10^{15}$.

Then, in FIG. 18J, the resist masks M5 are removed, and P ions are implanted at a low concentration. For example, the P ions may be implanted using an ion doping apparatus at an energy level of 90 KeV, and a dose amount of $2\times10^{13}$.

Then, in FIG. 18K, the n channel TFT regions are covered by resist masks M6, and B ions are implanted into the semiconductor film at the p channel TFT regions. For example, B ions may be implanted using an ion doping apparatus at an energy level of 40 KeV and a dose amount of $1\times10^{15}$ and at an energy level of 70 KeV and a dose amount of $1\times10^{15}$.

Then, in FIG. 18L, the resist masks M6 are removed, and an excimer laser is irradiated on the substrate surface to realize laser activation.

Then, in FIG. 18M, an interlayer insulating film 71 containing hydrogen is formed and hydrogenation is performed thereon through a thermal process. For example, a SiN film with a thickness of 370 nm is formed using a CVD apparatus, and annealing at 350° C. is performed for two hours in a nitrogen atmosphere at atmospheric pressure. It is noted that the hydrogenation process may be realized by other methods such as annealing in a hydrogen atmosphere or hydrogen plasma processing, and in the case of conducting such processes, the interlayer insulating film 71 does not necessarily have to include hydrogen.

Then, in FIG. 18N, resist masks M7 are used to etch the interlayer insulating film 71 and the second gate insulating film 43 through the RIE method, and contact holes that reach down to the source/drain 15 are formed.

Then, in FIG. 18O, the resist masks M7 are removed, and a second conductive film 81 is formed on the substrate surface. The second conductive film 81 may be formed by depositing Ti/Al/Ti films respectively having thicknesses of 50 nm/200 nm/100 nm using a spattering apparatus.

Then, in FIG. 18P, resist masks M8 are used to etch the second conductive film 81 and to thereby form source/drain electrodes 19. The etching of the second conductive film 81 may be realized by chlorine gas using an RIE apparatus, for example.

The ensuing processes according to the present variation example are identical to those of the first embodiment as illustrated by FIG. 4R and onward, and thereby their descriptions are omitted.

According to this variation example, a thin film transistor substrate having a circuit element that is capable of high speed operation may be manufactured in a productive manner by simply adding each of an amorphous silicon (a-Si) film deposition process, a gate $SiO_2$ film deposition process, a photo process, and an etching process to the conventional manufacturing method. Also, since the gate insulating film of the high speed operation TFT may be made thinner, the drive voltage of the TFT may be lowered, and pressure resistance may be enhanced. It is noted that the film thickness of the first gate insulating film 41 and the etching conditions are preferably adjusted so that the crystallized first semiconductor (poly-Si) film may be protected from damage in the dry etching process.

FIGS. 19A~19E illustrate a second variation example of the thin film transistor manufacturing method according to the ninth embodiment. In the second variation example, patterning is not conducted on the thick second semiconductor film, and the CW laser is selectively irradiated on a solid a-Si film corresponding to the second semiconductor film. Details of the processes according to this example are described below.

In FIG. 19A, a base SiN film 11, a base $SiO_2$ film 12, and a first semiconductor (a-Si) film 13 respectively having thicknesses of 50 nm, 200 nm, and 40 nm are formed on a glass substrate 10 by the CVD method, and an excimer laser is irradiated on the substrate surface to crystallize the first semiconductor film (a-Si) 13.

Then, in FIG. 19B, resists are patterned on the non-high speed operation TFT regions, and the resists are used as masks M1 to etch and remove the first semiconductor film from regions other than the non-high speed operation TFT regions. The etching may be realized by fluorine gas using an RIE apparatus, for example.

Then, in FIG. 19C, a first gate insulating ($SiO_2$) film 41 and a second semiconductor ($SiO_2$) film 21 are successively formed on the substrate surface. For example, the $SiO_2$ film 41 and the a-Si film 42 may be formed according to the CVD method to have film thicknesses of 80 nm and 75 nm, respectively.

Then, in FIG. 19D, a CW laser is selectively irradiated on the second semiconductor film 21 portions at the high speed operation TFT regions to realize lateral crystallization thereof.

Then, in FIG. 19E, resist masks M2 are used to etch and remove the second semiconductor (a-Si or poly-Si) film to realize isolation.

The ensuing processes according to the present second variation example are identical to those of the first variation example as illustrated by FIG. 18G and onward, and thereby their descriptions are omitted.

According to the second variation example, the CW laser is selectively irradiated on a solid a-Si film so that each of a photo process and an etching process may be further reduced from the processes according to the first variation example. In such case, the laser beam is preferably adjusted with due consideration to lateral crystallization margins.

Figure 20F:
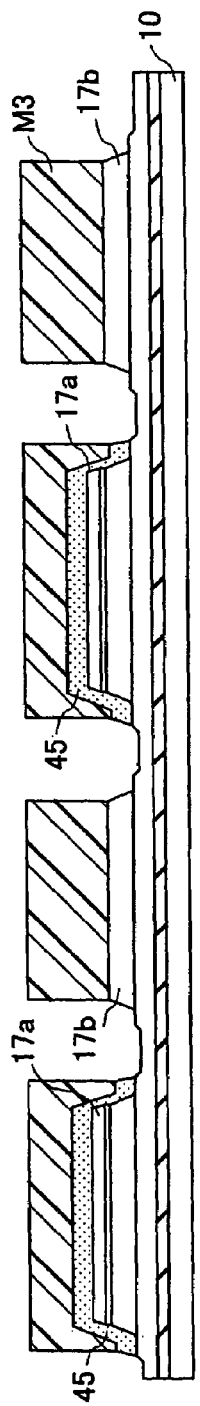
FIGS. 20A~20P are diagrams illustrating thin film transistor substrate manufacturing processes according to a third variation example of the ninth embodiment.
Figure 20G:
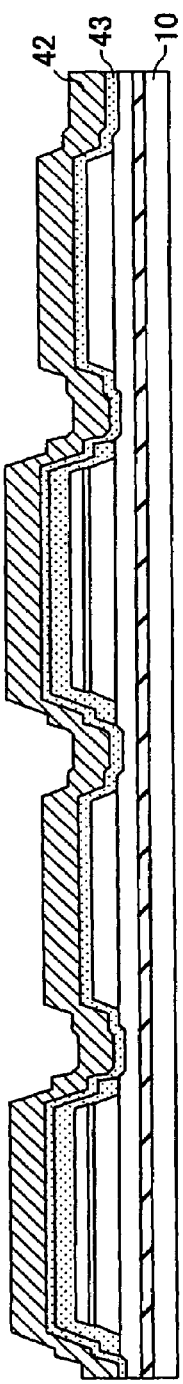
Figure 20H:
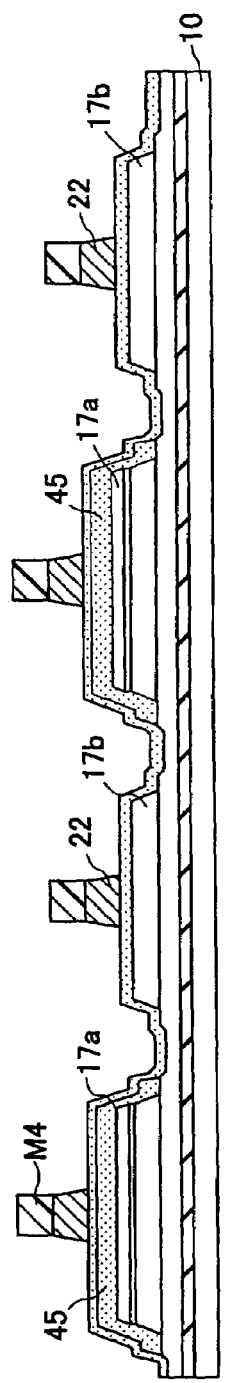
Figure 20I:
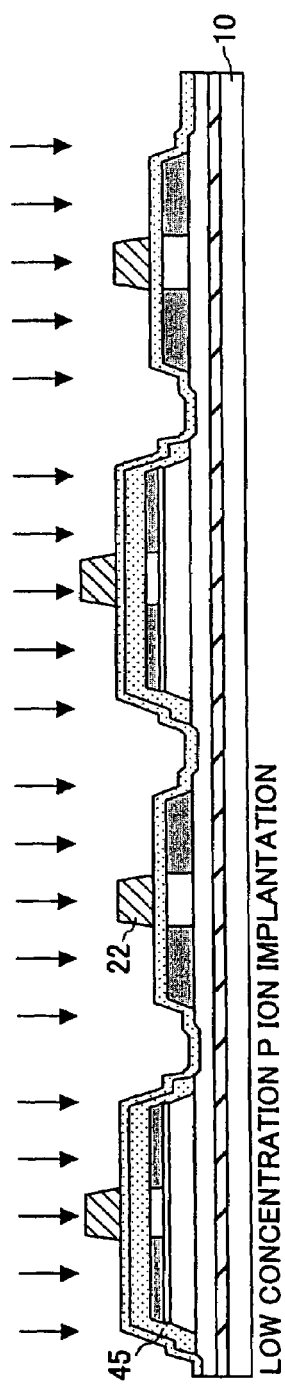
Figure 20J:
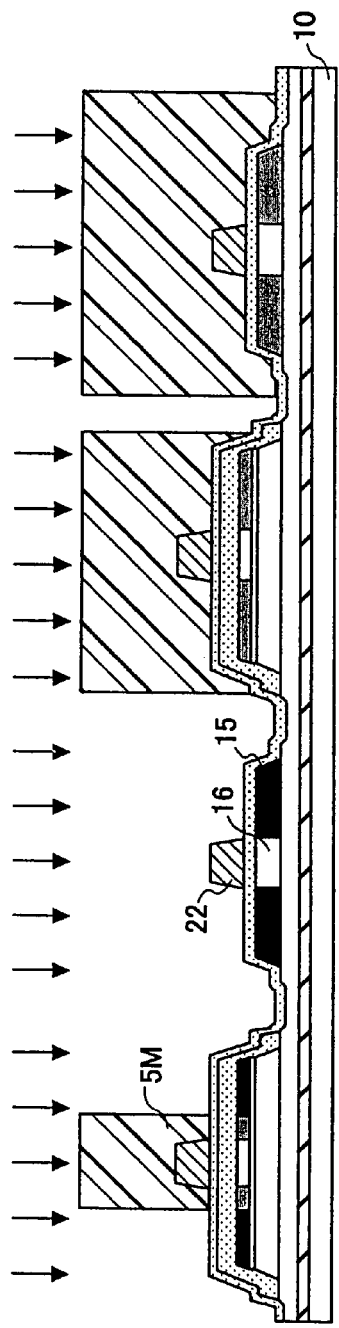
Figure 20K:
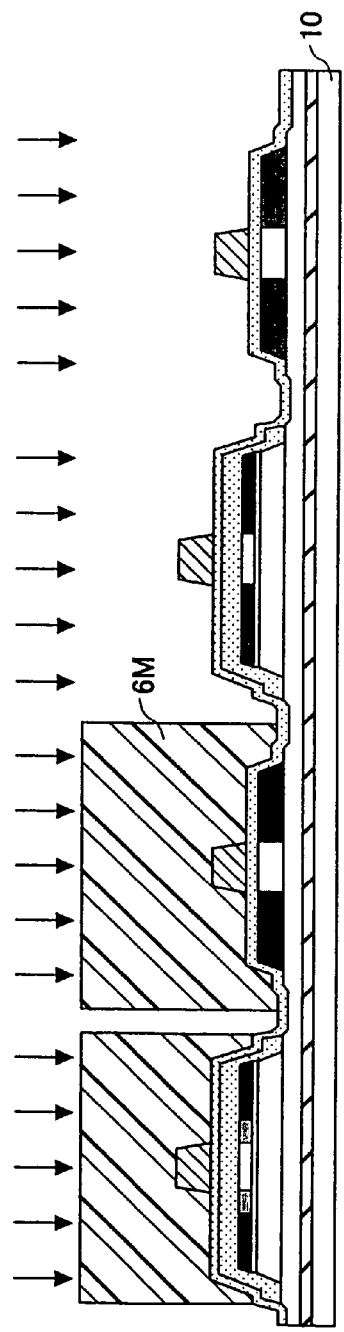
Figure 20L:
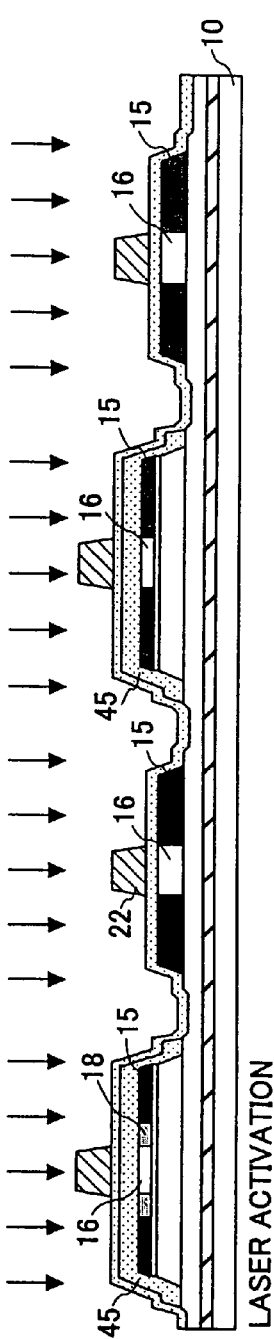
Figure 20M:
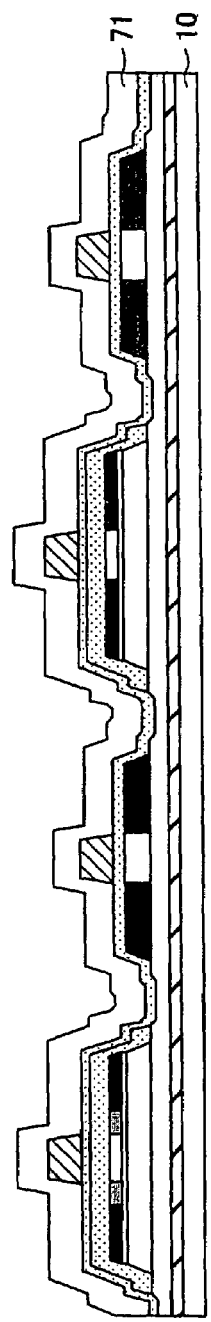
Figure 20N:
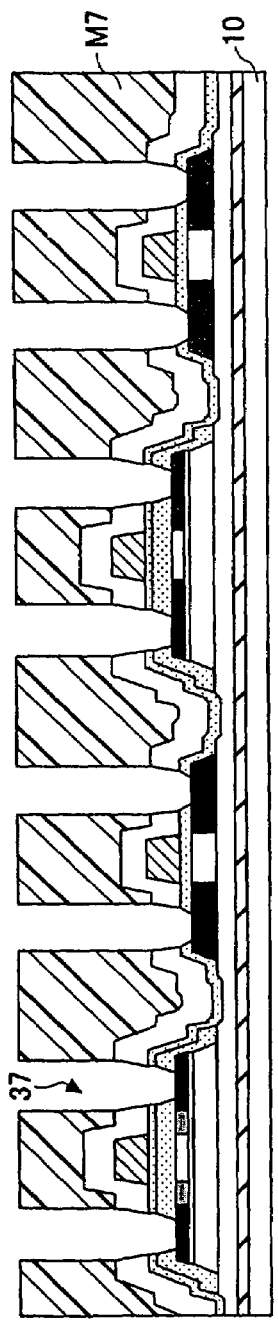
Figure 20O:
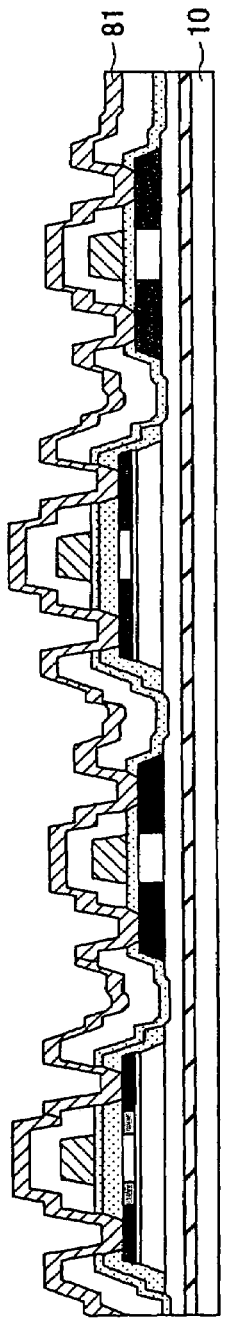
Figure 20P:
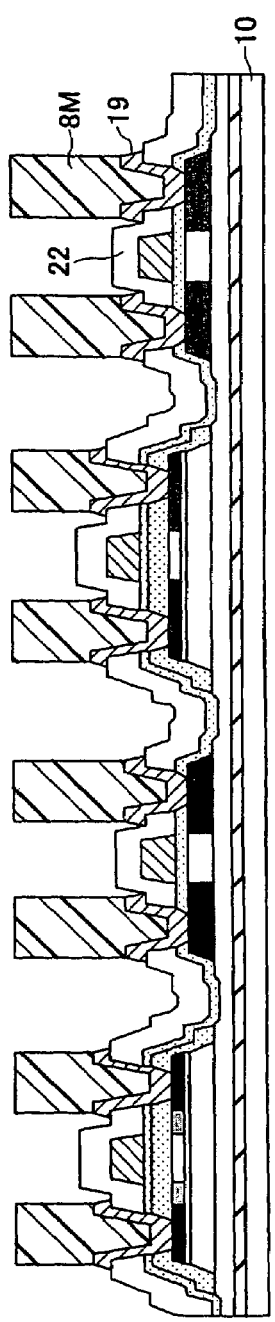

FIGS. 20A–20P illustrate a third variation example of the ninth embodiment. According to the third variation example, the thin active layers (semiconductor film) of the non-high speed operation TFT regions are positioned higher than the thick active layers (semiconductor film) of the high speed operation TFT regions.

In FIG. 20A, a base SiN film 11, a base $SiO_2$ film 12, and a first thick semiconductor (a-Si) film 13, a protective $SiO_2$ film 14, a second thin semiconductor film 21 are successively formed on a glass substrate 10. For example, the SiN film 11, the $SiO_2$ film 12, the first a-Si film 13, the $SiO_2$ film 14, and the second a-Si film 21 may be formed by the CVD method and may be arranged to have film thicknesses of 50 nm, 200 nm, 75 nm, 20 nm, and 40 nm, respectively. After the film deposition process, an excimer laser is irradiated to crystallize the second thin semiconductor film (a-Si) 21.

Then, in FIG. 20B, resist masks M1 are patterned on the TFT regions, and the crystallized second semiconductor (poly-Si) film 21', the second base $SiO_2$ film 23, and the first semiconductor film 13 are etched and removed by fluorine gas using an RIE apparatus, for example.

Then, in FIG. 20C, a first gate insulating film 41 is formed on the substrate surface. For example, the first gate insulating film 41 may be formed by depositing a $SiO_2$ film with a thickness of 80 nm using the CVD apparatus.

Then, in FIG. 20D, resist masks M2 are patterned on the non-high speed operation regions, and the first gate insulating film 41, the second semiconductor film 21', and the second base $SiO_2$ film 23 are etched and removed. The etching process may include etching the first gate insulating ($SiO_2$) film 41 and the second semiconductor (poly-Si) film with fluorine gas using an RIE apparatus, and etching the second base $SiO_2$ film 23 with diluted hydrofluoric acid thereafter. In this way, the first thick semiconductor film 13 is exposed at the high speed operation TFT regions.

Then, in FIG. 20E, a CW laser is selectively irradiated on portions of the first semiconductor film 13 of the high speed operation TFT regions to realize lateral crystallization thereon.

Then, in FIG. 20F, resist masks M3 are formed on the TFT regions to conduct etching and isolation. In this way, thick semiconductor films 17b that are crystallized by the CW laser are formed on the high speed operation TFT regions. On the non-high speed operation TFT regions, thin semiconductor films 17a that are crystallized by the excimer laser are formed on top of the amorphous silicon film 13.

Then, in FIG. 20G, a second gate insulating film 43 and a first conductive film 42 are successively formed. For example, a $SiO_2$ film with a thickness of 30 nm may be formed using a CVD apparatus, and an Al—Nd film with a thickness of 300 nm may be formed using a spattering apparatus.

Then, in FIG. 20H, resists are patterned into shapes of gate electrodes 22, and the resists are used as masks M4 to conduct wet etching on the first conductive film 42 to thereby form the gate electrodes 22.

Then, in FIG. 20I, the gate electrodes 22 are used as masks to conduct P ion implantation at a low concentration. For example, the P ion implantation may be performed using an ion doping apparatus at an energy level of 90 KeV, and a dose amount of $2 \times 10^{13}$.

Then, in FIG. 20J, the LDD region of the n channel TFT region and the p channel TFT regions are covered by resist masks M5, and P ion implantation is performed on the exposed regions of the semiconductor film. For example, the P ions may be implanted using an ion doping apparatus at an energy level of 40 KeV and a dose amount of $1 \times 10^{15}$, and at an energy level of 90 KeV and a dose amount of $1 \times 10^{15}$.

Then, in FIG. 20K, the n channel TFT regions are covered by resist masks M6, and B ions are implanted into the exposed semiconductor films of the p channel TFT regions. For example, the B ions may be implanted using an ion doping apparatus at an energy level of 40 KeV and a dose amount of $1 \times 10^{15}$, and at an energy level of 70 KeV and a dose amount of $1 \times 10^{15}$.

Then, in FIG. 20L, the resist masks M6 are removed, and an excimer laser is irradiated on the substrate surface to realize laser activation.

Then, in FIG. 20M, an interlayer insulating film 71 containing hydrogen is formed, and hydrogenation is conducted thereon through a thermal process. For example, a SiN film with a thickness of 370 nm may be formed using a CVD apparatus, and an annealing process at 350° C. in a nitrogen atmosphere at atmospheric pressure may be performed for two hours. It is noted that the hydrogenation may be realized using other methods such as an anneal process in a hydrogen atmosphere or a hydrogen plasma process. In such case, the interlayer insulating film does not necessarily have to contain hydrogen.

Then, in FIG. 20N, resist patterns are formed as masks M7, and the interlayer insulating film 71 and the second gate insulating film 43 are etched to form contact holes 37 that reach down to the source/drain 15.

Then, in FIG. 20O, the resist masks M7 are removed, and a second conductive film 81 is formed on the substrate surface. The second conductive film 81 may be formed by depositing Ti/Al/Ti films respectively having film thicknesses of 50 nm/200 nm/100 nm using a spattering apparatus, for example.

Then, in FIG. 20P, resist patterns are formed as masks M8, and the second conductive film 81 is etched to form source/drain electrodes 19. The etching of the second conductive film 81 may be conducted by an RIE apparatus using chlorine gas, for example.

The ensuing processes of the present variation example are identical to those of the first embodiment as illustrated in the diagrams of FIG. 4R and onward, and thereby their descriptions are omitted.

According to the method of the third variation example, a thin film transistor substrate having a circuit element that is capable of high speed operation may be manufactured in a productive manner by simply adding each of an amorphous silicon (a-Si) film deposition process, a gate $SiO_2$ film deposition process, a photo process, and an etching process to the conventional manufacturing method. Also, since the gate insulating film of the high speed operation TFT may be made thinner, the drive voltage of the TFT may be lowered. As a result, pressure resistance may be enhanced. It is noted that, according to the present example, possible damage to the first semiconductor film does not have to be taken into consideration since lateral crystallization is performed after etching the first gate insulating film 41.

Further, the present invention is not limited to these embodiments, and variations and modifications may be made without departing from the scope of the present invention.

The present application is based on and claims the benefit of the earlier filing date of Japanese Patent Application No. 2003-092862 filed on Mar. 28, 2003, the entire contents of which are hereby incorporated by reference.

What is claimed is:

1. A thin film transistor substrate manufacturing method, comprising the steps of:
    forming on a first region of a transparent insulating substrate a first semiconductor film with a first film thickness that is crystallized through excimer laser irradiation;
    forming on a second region of the transparent insulating substrate a second semiconductor film that is laterally crystallized through continuous wave laser irradiation, the second semiconductor film being arranged to have a film thickness that is greater than or equal to the first film thickness;
    forming a first thin film transistor on the first semiconductor film; and
    forming on the second semiconductor film a second thin film transistor that operates at a speed greater than a speed of the first thin film transistor.

2. The thin film transistor manufacturing method as claimed in claim 1, wherein the step of forming the second semiconductor film includes selectively irradiating the continuous wave laser on a predetermined portion of an amorphous silicon film.

3. The thin film transistor manufacturing method as claimed in claim 2, wherein the step of forming the second semiconductor film includes patterning the amorphous silicon film into a predetermined shape, and irradiating the continuous wave laser on the patterned portion of the amorphous silicon film.

4. The thin film transistor manufacturing method as claimed in claim 2, wherein the step of forming the second semiconductor film includes irradiating the continuous wave laser on a predetermined portion of a solid amorphous silicon film.

5. The thin film transistor manufacturing method as claimed in claim 1, wherein the step of forming the first thin film transistor includes forming a first gate insulating film; and
    the step of forming the second thin film transistor includes forming a second gate insulating film that is thinner than the first gate insulating film.

6. A thin film transistor manufacturing method, comprising the steps of:
    forming on a first region of a transparent insulating substrate a first semiconductor film that is crystallized through excimer laser irradiation;
    forming on a second region of the transparent insulating substrate a second semiconductor film that is laterally crystallized through continuous wave laser irradiation;
    forming a first thin film transistor on the first semiconductor film via a first gate insulating film; and
    forming a second thin film transistor on the second semiconductor film via a second gate insulating film that is thinner than the first gate insulating film.

* * * * *